US008213240B2

(12) United States Patent
Kim

(10) Patent No.: US 8,213,240 B2
(45) Date of Patent: *Jul. 3, 2012

(54) NON-VOLATILE SEMICONDUCTOR MEMORY WITH PAGE ERASE

(75) Inventor: Jin-Ki Kim, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/169,231

(22) Filed: Jun. 27, 2011

(65) Prior Publication Data

US 2011/0267896 A1 Nov. 3, 2011

Related U.S. Application Data

(60) Continuation of application No. 12/888,034, filed on Sep. 22, 2010, now Pat. No. 7,995,401, which is a continuation of application No. 12/474,056, filed on May 28, 2009, now Pat. No. 7,872,921, which is a division of application No. 11/715,838, filed on Mar. 8, 2007, now Pat. No. 7,551,492.

(60) Provisional application No. 60/786,897, filed on Mar. 29, 2006, provisional application No. 60/843,593, filed on Sep. 11, 2006.

(51) Int. Cl.
G11C 16/04 (2006.01)

(52) U.S. Cl. ......... 365/185.29; 365/185.17; 365/185.18; 365/185.12

(58) Field of Classification Search ............. 365/185.29, 365/185.17, 185.18, 185.12, 185.27, 185.23
See application file for complete search history.

(56) References Cited

U.S. PATENT DOCUMENTS

| 4,174,536 A | 11/1979 | Misunas et al. |
| 4,617,566 A | 10/1986 | Diamond |
| 4,733,376 A | 3/1988 | Ogawa |
| 4,796,231 A | 1/1989 | Pinkham |
| 4,899,316 A | 2/1990 | Nagami |
| 5,038,299 A | 8/1991 | Maeda |

(Continued)

FOREIGN PATENT DOCUMENTS

WO 0169411 9/2001

OTHER PUBLICATIONS

King, et al., Communicating with Daisy Chained MCP42XXX Digital Potentiometers, Microchip AN747, pp. 1-8, 2001.

(Continued)

*Primary Examiner* — David Lam
(74) *Attorney, Agent, or Firm* — Hamilton, Brook, Smith & Reynolds, P.C.

(57) ABSTRACT

In a nonvolatile memory, less than a full block maybe erased as one or more pages. A select voltage is applied through pass transistors to each of plural selected wordlines and an unselect voltage is applied through pass transistor to each of plural unselected wordlines of a selected block. A substrate voltage is applied to the substrate of the selected block. A common select voltage may be applied to each selected wordline and the common unselect voltage may be applied to each unselected wordline. Select and unselect voltages may be applied to any of the wordlines of a select block. A page erase verify operation may be applied to a block having plural erased pages and plural nonerased pages.

18 Claims, 44 Drawing Sheets

U.S. PATENT DOCUMENTS

| | | | |
|---|---|---|---|
| 5,126,808 | A | 6/1992 | Montalvo et al. |
| 5,132,635 | A | 7/1992 | Kennedy |
| 5,136,292 | A | 8/1992 | Ishida |
| 5,175,819 | A | 12/1992 | Le Ngoc et al. |
| 5,204,669 | A | 4/1993 | Dorfe et al. |
| 5,243,703 | A | 9/1993 | Farmwald et al. |
| 5,280,539 | A | 1/1994 | Yeom et al. |
| 5,319,598 | A | 6/1994 | Aralis et al. |
| 5,365,484 | A | 11/1994 | Cleveland et al. |
| 5,404,460 | A | 4/1995 | Thomsen et al. |
| 5,430,859 | A | 7/1995 | Norman et al. |
| 5,440,518 | A | 8/1995 | Hazani |
| 5,440,694 | A | 8/1995 | Nakajima |
| 5,452,259 | A | 9/1995 | McLaury |
| 5,473,563 | A | 12/1995 | Suh et al. |
| 5,473,566 | A | 12/1995 | Rao |
| 5,473,577 | A | 12/1995 | Miyake et al. |
| 5,475,854 | A | 12/1995 | Thomsen et al. |
| 5,596,724 | A | 1/1997 | Mullins et al. |
| 5,602,780 | A | 2/1997 | Diem et al. |
| 5,636,342 | A | 6/1997 | Jeffries |
| 5,671,178 | A | 9/1997 | Park et al. |
| 5,721,840 | A | 2/1998 | Soga |
| 5,740,379 | A | 4/1998 | Hartwig |
| 5,761,146 | A | 6/1998 | Yoo et al. |
| 5,771,199 | A | 6/1998 | Lee |
| 5,802,006 | A | 9/1998 | Ohta |
| 5,806,070 | A | 9/1998 | Norman et al. |
| 5,818,785 | A | 10/1998 | Ohshima |
| 5,822,252 | A | 10/1998 | Lee et al. |
| 5,828,899 | A | 10/1998 | Richard et al. |
| 5,835,935 | A | 11/1998 | Estakhri et al. |
| 5,859,809 | A | 1/1999 | Kim |
| 5,872,994 | A | 2/1999 | Akiyama et al. |
| 5,937,425 | A | 8/1999 | Ban |
| 5,938,750 | A | 8/1999 | Shaberman |
| 5,941,974 | A | 8/1999 | Babin |
| 5,959,930 | A | 9/1999 | Sakurai |
| 5,995,405 | A | 11/1999 | Trick |
| 5,995,417 | A | 11/1999 | Chen et al. |
| 6,002,638 | A | 12/1999 | John |
| 6,085,290 | A | 7/2000 | Smith et al. |
| 6,091,660 | A | 7/2000 | Sasaki et al. |
| 6,102,963 | A | 8/2000 | Agrawal |
| 6,107,658 | A | 8/2000 | Itoh et al. |
| 6,144,576 | A | 11/2000 | Leddige et al. |
| 6,148,364 | A | 11/2000 | Srinivasan et al. |
| 6,172,911 | B1 | 1/2001 | Tanaka et al. |
| 6,178,135 | B1 | 1/2001 | Kang |
| 6,304,921 | B1 | 10/2001 | Rooke |
| 6,317,350 | B1 | 11/2001 | Pereira et al. |
| 6,317,352 | B1 | 11/2001 | Halbert et al. |
| 6,317,812 | B1 | 11/2001 | Lofgren et al. |
| 6,378,018 | B1 | 4/2002 | Tsern et al. |
| 6,438,064 | B2 | 8/2002 | Ooishi |
| 6,442,098 | B1 | 8/2002 | Kengeri |
| 6,535,948 | B1 | 3/2003 | Wheeler et al. |
| 6,584,303 | B1 | 6/2003 | Kingswood et al. |
| 6,594,183 | B1 | 7/2003 | Lofgren et al. |
| 6,601,199 | B1 | 7/2003 | Fukuda et al. |
| 6,611,466 | B2 | 8/2003 | Lee et al. |
| 6,658,509 | B1 | 12/2003 | Bonella et al. |
| 6,658,582 | B1 | 12/2003 | Han |
| 6,680,904 | B1 | 1/2004 | Kaplan et al. |
| 6,715,044 | B2 | 3/2004 | Lofgren et al. |
| 6,718,432 | B1 | 4/2004 | Srinivasan |
| 6,732,221 | B2 | 5/2004 | Ban |
| 6,754,807 | B2 | 6/2004 | Parthasarathy et al. |
| 6,763,426 | B1 | 7/2004 | James et al. |
| 6,807,103 | B2 | 10/2004 | Cavaleri et al. |
| 6,816,933 | B1 | 11/2004 | Andreas |
| 6,850,443 | B2 | 2/2005 | Lofgren et al. |
| 6,853,557 | B1 | 2/2005 | Haba et al. |
| 6,853,573 | B2 | 2/2005 | Kim et al. |
| 6,928,501 | B2 | 8/2005 | Andreas et al. |
| 6,944,697 | B2 | 9/2005 | Andreas |
| 6,950,325 | B1 | 9/2005 | Chen |
| 6,967,874 | B2 | 11/2005 | Hosono |
| 6,996,644 | B2 | 2/2006 | Schoch et al. |
| 7,006,383 | B2 | 2/2006 | Tanaka |
| 7,032,039 | B2 | 4/2006 | DeCaro |
| 7,073,022 | B2 | 7/2006 | El-Batal et al. |
| 7,161,842 | B2 | 1/2007 | Park |
| 7,170,795 | B2 | 1/2007 | Lee |
| 7,272,050 | B2 | 9/2007 | Han et al. |
| 7,403,427 | B2 * | 7/2008 | Chen ................ 365/185.29 |
| 7,430,138 | B2 | 9/2008 | Higashitani |
| 7,551,492 | B2 | 6/2009 | Kim |
| 7,872,921 | B2 | 1/2011 | Kim |
| 7,995,401 | B2 | 8/2011 | Kim |
| 2002/0188781 | A1 | 12/2002 | Schoch et al. |
| 2003/0074505 | A1 | 4/2003 | Andreas et al. |
| 2003/0128702 | A1 | 7/2003 | Satoh et al. |
| 2004/0001380 | A1 | 1/2004 | Becca et al. |
| 2004/0019736 | A1 | 1/2004 | Kim et al. |
| 2004/0024960 | A1 | 2/2004 | King et al. |
| 2004/0039854 | A1 | 2/2004 | Estakhri et al. |
| 2004/0199721 | A1 | 10/2004 | Chen |
| 2004/0230738 | A1 | 11/2004 | Lim et al. |
| 2005/0018489 | A1 | 1/2005 | Hosono |
| 2005/0035895 | A1 | 2/2005 | Byrne et al. |
| 2005/0086413 | A1 | 4/2005 | Lee et al. |
| 2005/0095769 | A1 | 5/2005 | Takase et al. |
| 2005/0160218 | A1 | 7/2005 | See et al. |
| 2005/0213421 | A1 | 9/2005 | Polizzi et al. |
| 2006/0050594 | A1 | 3/2006 | Park |

OTHER PUBLICATIONS

64 Megatbit CMOS 3.0 Volt Flash Memory with 50MHz SPI (2006).

Toshiba MOS Digital Integrated Circuit Silicon Gate CMOS, TH58NVG1S3AFT05, Toshiba Corporation, pp. 1-32, (May 19, 2003).

Intel Advanced+ Boot Block Flash Memory (C3), Intel Corporation, pp. 1-72, (May 2005).

256 M×8 Bit/ 128M×16 Bit / 512M×8 Bit NAND Flash Memory, K9K4G08U1M, K9F2G08U0M, K9F2G16U0M, Rev. 1.0, Samsung Electronics Co., Ltd., pp. 1-41, (May 6, 2005).

DiskOnChip H1 4Gb (512MByte) and 8 Gb (1 GByte) High Capacity Flash Disk with NAND and x2 Technology, Data Sheet, Rev. 0.5 (Preliminary), M-Systems Flash Disk Pioneers Ltd., pp. 1-66, (2005).

Tal, A., Guidelines for Integrating DiskOnChip in a Host System, AP-DOC-1004, Rev. 1.0, M-Systems Flash Disk Pioneers Ltd., pp. 1-15, (2004).

OneNAND4G(KFW4G16Q2M-DEB6), OneNAND2G(KFH2G16Q2M-DEB6), OneNAND1G(KFW1G16Q2M-DEB6) Flash Memory, OneNAND Specification Ver. 1.2, Samsung Electronics, pp. 1-125, (Dec. 23, 2005).

Kennedy, J., et al., A 2Gb/s Point-to-Point Heterogeneous Voltage Capable DRAM Interface for Capacity-Scalable Memory Subsystems, ISSCC 2004/Session 1/DRAM/11.8, IEEE International Solid-State Circuits Conference (2004).

Kim, Jae-Kwan, et al., A 3.6Gb/s/pin Simultaneous Bidirectional (SBD) I/O Interface for High-Speed DRAM , ISSCC 2004/Session 22/DSL and Multi-Gb/s I/O 22.7, IEEE International Solid-State Circuits Conference (2004).

HyperTransport TM I/O Link Specification , Revision 2.00, Document No. HTC20031217-0036-00, HyperTransportTM Technology Consortium, pp. 1-325 (2001).

IEEE Standard for High-Bandwidth Memory Interface Based on Scalable Coherent Interface (SCI) Signaling Technology (RamLink), IEEE Std. 1596.4-1996, The Institute of Electrical Electronics Engineers, Inc., pp. i-91, (Mar. 1996).

High-Speed Memory Architectures for Multimedia Applications , Circuits & Devices, IEEE 8755-3996/97/, pp. 8-13, Jan. 1997.

Gjessing, S., et al., RamLink: A High-Bandwidth Point-to-Point Memory Architecture , IEEE 0-8186-2655-0/92, pp. 328-331, 1992.

Gjessing, S., et al., Performance of the RamLink Memory Architecture , Proceedings of the Twenty-Seventh Annual Hawaii International Conference on System Sciences, IEEE 1060-3425/94, pp. 154-162, 1994.

Gjessing, S., et al., A RAM link for high speed, Special Report/Memory, IEEE Spectrum, pp. 52-53, (Oct. 1992).

Diamond, S. L., SyncLink: High-speed DRAM for the future, Micro Standards, IEEE Micro, pp. 74-75, (Dec. 1996).

"DDR2 Fully Buffered DIMM 240pin FBDIMMS based on 512Mb C-die", Rev. 1.3 Sep. 2006, Samsung Electronics, pp. 1-32 (Sep. 2006).

"HyperTransportTM IO Link Specification", Revision 3.00, Document No. HTC20051222-0046-0008, HyperTransport Technology Consortium, pp. 1-428, (Apr. 2006).

8-megabit 2.5-volt Only or 2.7-volt Only DataFlash, technical specification, Atmel, Rev. 2225H-DFLSH (2004).

K9XXG08UXM Preliminary Flash Memory, technical specification, Samsung Electronics.

1024K12C CMOS Serial EEPROM, technical specification, Microchip Technology Inc. (2006).

The I2C-Bus Specification, Version 2.1, Philips Semiconductors, Jan. 2000.

16 Mbit LPC Serial Flash, technical specification, Silicon Storage Technology Inc. (2006).

16 Mbit SPI Serial Flash, preliminary specification, Silicon Storage Technology Inc. (2005).

2Mbit, Low Voltage, Serial Flash Memory with 40 MHz SPI Bus Interface, technical specification, STMicroelectronics Group of Companies (2005).

NAND Flash Applications Design Guide, Revision 1.0, Toshiba America Electronics Components, Inc., (Apr. 2003).

Europoean Search Report dated Feb. 25, 2010 for EP Application No. EP 08 71 4575.

High Speed Small Sectored SPI Flash Memory, Atmel Corp., pp. 1-22 (2006).

\* cited by examiner

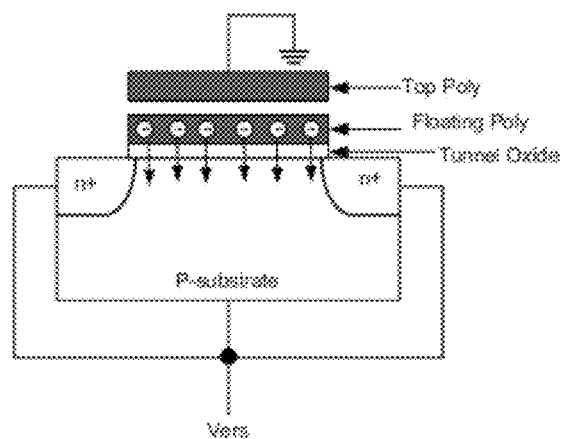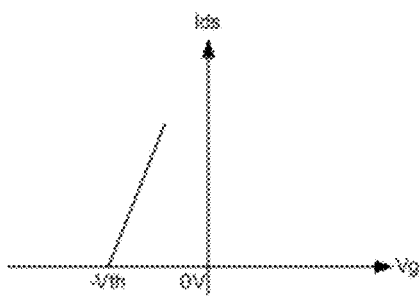
*Fig. 10A Prior Art*    *Fig. 10B Prior Art*
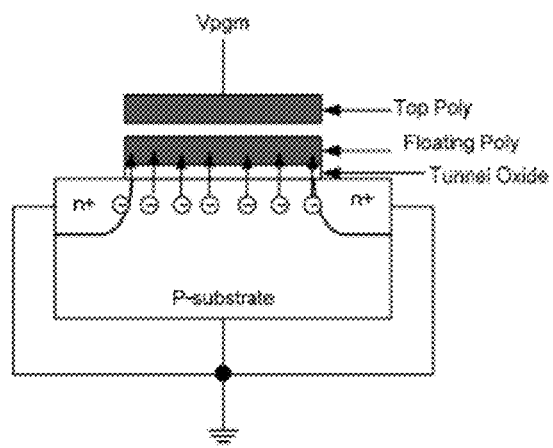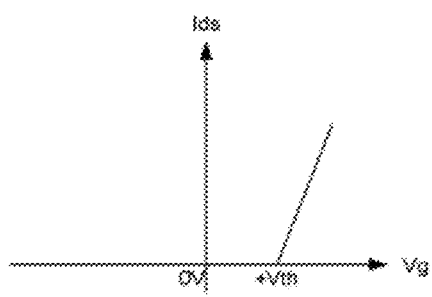
*Fig. 11A Prior Art*    *Fig. 11B Prior Art*

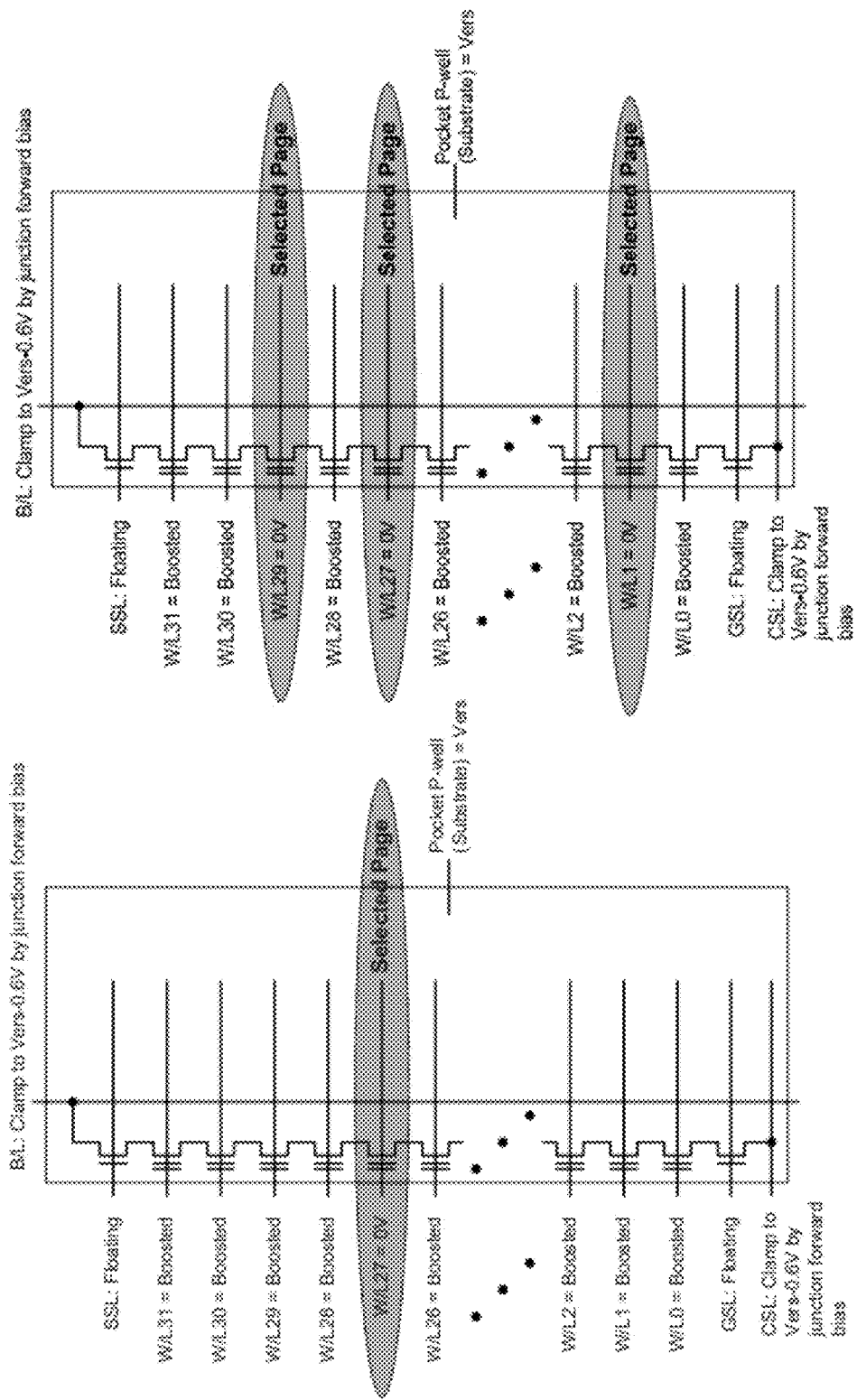

NON-VOLATILE SEMICONDUCTOR MEMORY WITH PAGE ERASE

RELATED APPLICATIONS

This application is a continuation of U.S. application Ser. No. 12/888,034, filed Sep. 22, 2010, issued as U.S. Pat. No. 7,995,401, on Aug. 9, 2011, which is a continuation of U.S. Application Ser. No. 12/474,056, filed May 28, 2009, issued as U.S. Pat. No. 7,872,921 on Jan. 18, 2011, which is a divisional of U.S. application Ser. No. 11/715,838, filed Mar. 8, 2007, issued as U.S. Pat. No. 7,551,492 on Jun. 23, 2009, which claims the benefit of U.S. Provisional Application No. 60/786,897, filed on Mar. 29, 2006 and U.S. Provisional Application No. 60/843,593, filed on Sep. 11, 2006.

The entire teachings of the above applications are incorporated herein by reference.

BACKGROUND OF THE INVENTION

Mobile electronic devices, such as digital cameras, portable digital assistants, portable audio/video players and mobile terminals continue to require mass storage memory, preferably non-volatile memory with ever increasing capacities and speed capabilities. For example, presently available audio players can have between 256 Mbytes to 40 Gigabytes of memory for storing audio/video data. Non-volatile memory such as Flash memory and hard-disk drives are preferred since data is retained in the absence of power.

Presently, hard disk drives having high densities can store 40 to 500 Gigabytes of data, but are relatively bulky. However, Flash memory, also known as solid-state drive, is popular because of their high density, non-volatility, and small size relative to hard disk drives. Flash memory technology is based on EPROM and EEPROM technologies. The term "flash" was chosen because a large number of memory cells could be erased at one time as distinguished from EEPROMs, where each byte was erased individually. Those of skill in the art will understand that Flash memory can be configured as NOR, NAND or other Flash, with NAND Flash having higher density per given area due to its more compact memory array structure. For the purpose of further discussion, references to Flash memory should be understood as being any type Flash memory.

The cell array structure of NAND flash memory consists of n erasable blocks. Each block is subdivided into m programmable pages illustrates the cell array structure of an example NAND flash memory which consists of n erasable blocks. In this example, n=2048. Each block is subdivided into m programmable pages as shown in FIGS. 1 to 3, where m=64.

Each page consists of (j+k) bytes (x8b) as shown in FIG. 3. In this example, j=2048 and k=64. The pages are further divided into a j-byte data storage region (data field) with a separate k-byte area (spare field). The k-byte area is typically used for error management functions.

1 page=(j+k) bytes.
1 block=m pages=(j+K) bytes*m.
Total memory array size=n blocks=(j+K) bytes*m*n.

In conventional NAND flash devices, read and program operations are executed on a page basis while erase operations are executed on a block basis. All operations are driven by commands (refer to Samsung's 2 Gb NAND Flash Specification: ds_k9f2gxxu0m_rev10 incorporated herein in its entirety).

The internal memory array is accessed on a page basis. The read operation starts after writing READ command followed by addresses via common I/O pins (I/O0 to I/O 7) to the device. The 2,112 bytes of data within the selected page are sensed and transferred to the page register in less than tR (data transfer time from flash array to page register) shown in FIG. 4. Once the 2,112 bytes of data are sensed and transferred from the selected page in the cell array to the data register, the data in the data register can be sequentially read from the device at, for example, 8 bits or 16 bits per cycle.

The conventional memory array is programmed on a page basis. For program operations, PROGRAM command followed by addresses and input data of 2,112 bytes is issued to the device through common I/O pins (I/O0 to I/O7). The 2,112 bytes of data are transferred to the data register during input data loading cycles and finally programmed to the selected page of the cell array less than tPROG (page program time) as shown in FIG. 5.

The memory array is erased on a block basis. For block erase operations, BLOCK ERASE command followed by block addresses is issued to the device through common I/O pins (I/O0 to I/O7). The 128K bytes of data are erased less than tBERS (block erase time) as shown in FIG. 6. Refer to NAND Flash specifications (Samsung's 2 Gb NAND: ds_k9f2gxxu0m_rev10) for detailed device operations.

A NAND cell string typically consists of one string selector transistor 71, i memory cells 72 and one ground select transistor 73 which are serially connected as shown FIG. 7. The number (i) of cells per string can be varied by process technology, for example 8 cells per string or 16 cells per string or 32 cells per string. 32 memory cells per string are common in present 90 nm and 70 nm technologies. Hereinafter, '32' is used for i as shown in FIG. 7.

Memory cell gates correspond to wordline 0 to 31 (W/L0 to W/L 31). The gate of string select transistor is connected to a string select line (SSL) while the drain of string select transistor is connected to bitline (B/L). The gate of ground select transistor is connected to a ground select line (GSL) while the source of ground select transistor is connected to common source line (CSL). Each wordline corresponds to a page and each string corresponds to a block.

FIGS. 8 and 9 depict physical structure of a block with 32 cells per NAND cell string. As shown in FIG. 8, there are (j+k)*8 NAND strings in a block. Thus the unit block has total (j+k)*8*32 cells. Each wordline is defined as unit page. FIG. 9 shows n blocks Typically, flash memory cells are programmed and erased by either Fowler-Nordheim (F-N) tunneling or hot electron injection. In NAND flash memory, both erase and program are governed by F-N tunneling. The following erase and program operations are based on NAND flash memory.

During an erase operation, the top poly (i.e. top gate) of the cell is biased to Vss (ground) while the substrate of the cell is biased to erase voltage Vers (eg. approximately 20v, source and drain are automatically biased to Vers due to junction-forward-bias from P-substrate to n+ source/drain). By this erase bias condition, trapped electrons (charge) in the floating poly (i.e. floating gate) are emitted to the substrate through the tunnel oxide as shown in FIG. 10A. The cell Vth of the erased cell is negative value as shown in FIG. 10B. In other words, the erased cell is on-transistor (normally turn-on with gate bias Vg of 0V).

During a program operation, on the contrary, the top poly (i.e. top gate) of the cell is biased to program voltage Vpgm (eg. approximately 18v) while the substrate, source and drain of the cell are biased to Vss (ground). By this program bias condition, electrons (charge) in the substrate are injected to the floating poly (i.e. floating gate) through the tunnel oxide as shown in FIG. 11A. The cell Vth of the programmed cell is positive value as shown in FIG. 11B. In other words, the programmed cell is off-transistor (normally turn-off with gate bias Vg of 0V).

Therefore NAND flash is erased and programmed by a bi-directional (i.e. symmetrical) F-N tunneling mechanism.

One known erase scheme is illustrated in FIGS. 12 and 13. FIG. 12 shows bias condition during erase operations. The p-well substrate is biased to erase voltage Vers while bitlines and the common source line (CSL) in the selected block are clamped to Vers-0.6v through the S/D diodes of the SSL and GSL transistors. At the same time all wordlines in the selected block are biased to 0V while the string select line (SSL) and the ground select line (GSL) are biased to erase voltage Vers. Therefore entire cells in the selected block are erased by F-N tunneling as described above.

Because of block basis erase operations, erasure of memory cells in unselected blocks having the same p-well substrate must be prevented (i.e. erase inhibit). FIG. 13 shows an erase inhibit scheme to unselected blocks:

All wordlines in the selected block are biased to 0V.
All wordlines in unselected blocks are biased to Vers to compensate electrical field by Vers from the substrate.

Table 1 shows bias conditions for the selected block and unselected blocks with the prior art 1 during erase operations.

TABLE 1

Bias Conditions during Erase - Prior Art 1

|  | SELECTED BLOCK | UNSELECTED BLOCK |
|---|---|---|
| BITLINES (B/L) | CLAMPED TO VERS-0.6 V | CLAMPED TO VERS-0.6 V |
| STRING SELECT LINE (SSL) | VERS | VERS |
| WORDLINES (W/L0~W/L31) | 0 V | VERS |
| GROUND SELECT LINE (GSL) | VERS | VERS |
| COMMON SOURCE LINE (CSL) | CLAMPED TO VERS-0.6 V | CLAMPED TO VERS-0.6 V |
| SUBSTRATE (POCKET P-WELL) | VERS | VERS |

With this erase inhibit scheme, it takes a very long total erase time to charge all wordlines in unselected blocks to erase voltage Vers. At the same time, the power consumption is very high due to charging and discharging entire wordlines in unselected blocks. Moreover, as the memory density increases, the erase time becomes much longer and the power consumption during erase operations is much higher.

In order to resolve problems in the above approach, the self-boosting erase inhibit scheme (U.S. Pat. No. 5,473,563) has been proposed and it is widely used in NAND flash memories.

For the selected block, the erase bias conditions are substantially the same as above except the SSL and GSL are floating instead of biased to Vers, as shown in FIG. 14.

To prevent erasure of memory cells in unselected blocks, all wordlines in unselected blocks are floated during erase operations as shown in FIG. 15. Therefore floated wordlines in unselected blocks are boosted to nearly erase voltage Vers by capacitive coupling between the substrate and wordlines in unselected blocks as applying erase voltage Vers to the substrate. (Floated wordlines are boosted to about 90% of Vers when the substrate of the cell array goes to Vers; however, boosted voltage level on floated wordlines is determined by coupling ratio between the substrate and wordlines.) The boosted voltage on wordlines in unselected blocks reduces electric field between the substrate and wordlines; as a result, erasure of memory cells in unselected blocks is prevented.

All wordlines in the selected block are biased to 0V.
All wordlines in unselected blocks are floating.

Table 2 shows bias conditions during erase with this approach. There is no need to apply erase voltage Vers to wordlines in unselected blocks, which reduces power consumption during erase and reduces the erase time, because entire wordlines in unselected blocks are not needed to be biased to Vers.

TABLE 2

Bias Conditions during Erase - Prior Art 2

|  | SELECTED BLOCK | UNSELECTED BLOCK |
|---|---|---|
| BITLINES (B/L) | CLAMPED TO VERS-0.6 V | CLAMPED TO VERS-0.6 V |
| STRING SELECT LINE (SSL) | BOOSTED TO APPROX. 90% OF VERS | BOOSTED TO APPROX. 90% OF VERS |
| WORDLINES (W/L0~W/L31) | 0 V | BOOSTED TO APPROX. 90% OF VERS |
| GROUND SELECT LINE (GSL) | BOOSTED TO APPROX. 90% OF VERS | BOOSTED TO APPROX. 90% OF VERS |
| COMMON SOURCE LINE (CSL) | CLAMPED TO VERS-0.6 V | CLAMPED TO VERS-0.6 V |
| SUBSTRATE (POCKET P-WELL) | VERS | VERS |

Because the substrate of cells is biased to erase voltage Vers and source/drain/substrate of cells in the selected block are electrically connected, the erase operation must occur on a block basis. In other words, the minimum erasable array size is a block.

The above described Flash memories suffer from three limitations. First, bits can be programmed only after erasing a target memory array. Second, each cell can only sustain a limited number of erasures, after which it can no longer reliably store data. In other words, there is a limitation in the number of erase and program cycles to cells (i.e. Endurance, typically 10,000~100,000 cycles). Third, the minimum erasable array size is much bigger than the minimum programmable array size. Due to these limitations, sophisticated data structures and algorithms are required to effectively use flash memories. (See for example, U.S. Pat. Nos. 5,937,425, 6,732, 221 and 6,594,183.

Erase of memory cells on a page basis has been suggested in U.S. Pat. No. 5,995,417 and in patent application US 2006/0050594.

SUMMARY OF THE INVENTION

Provided here are technical details in new page basis erase approaches in nonvolatile memory, with particular application NAND flash memory. The page basis erase approach is described using NAND flash memory, but may be applied more generally by one skilled in the art to other flash memory devices.

A nonvolatile memory array, such as a NAND Flash Memory, has plural strings of memory cells on a substrate, wordlines across the strings to pages of memory cells and a pass transistor applying a voltage to each wordline. In a method of erasing a page, each pass transistor of a selected block is enabled, for example through a block decoder. A wordline decoder may cause a select voltage to be applied to the pass transistor at each of plural selected wordlines of the selected block and an unselect voltage to be applied to the pass transistor at each of plural unselected wordlines of the selected block. A substrate voltage is applied to the substrate of the selected block. The voltage difference between the substrate voltage and a resulting voltage of each selected wordline causes the page of memory cells of the selected wordline to erase, and the voltage difference between the substrate voltage and the resulting voltage of each unselected wordline is less than that which erases the page of memory cells of the unselected wordline.

In certain embodiments, a common select voltage is applied at each selected wordline and a common unselect voltage is applied at each unselected wordline. Select voltages and unselect voltages may be applied to any of the wordlines of a selected block.

With the application of select and unselect voltages to any of the wordlines of a selected block, selected wordlines may be separated by at least one unselected wordline and unselected wordlines may be separated by at least one selected wordline. With selected lines adjacent to unselected lines, where boosting of a wordline is relied upon, the capacitive coupling that results in that boosting can be reduced. As a result, a higher initial voltage applied from the unselect voltage is preferred. To assure that unselected memory cells adjacent to two selected memory cells are not erased, it is preferred that the unselect voltage be closer to the applied substrate voltage than to the select voltage.

In one embodiment, the resulting voltage of each selected wordline is substantially the same as the select voltage and the resulting voltage of each unselected wordline is a floating voltage pulled from the unselect voltage toward the substrate voltage. A common gate signal applied to each pass transistor of the selected block has a value V2, the unselect voltage is great than V2 and the unselected wordline precharges to V2−Vtn. V2 is substantially less than the applied substrate voltage but is preferably at least 50% of the applied substrate voltage. As such, the unselect voltage in a selected block is greater than the voltage typically applied to the pass transistors in an unselected block.

In other embodiments, the resultant voltage of each selected wordline is substantially the same as the select voltage and the resulting voltage of each unselected wordline is substantially the same as the unselect voltage. For example, the select voltage may be about 0V and the unselect voltage may be about equal to the applied substrate voltage.

In an erase verify operation, a select verify voltage may be applied to each wordline of plural erased pages in the selected block and an unselect verify voltage may be applied to each wordline of plural nonerased pages in the selected block. The state of strings of the selected block is then sensed. Each string is connected to an end voltage, specifically a source voltage. The level of the end voltage may be selected from one of plural voltage levels dependent on the number of selected wordlines.

BRIEF DESCRIPTION OF THE DRAWINGS

The foregoing will be apparent from the following more particular description of example embodiments of the invention, as illustrated in the accompanying drawings in which like reference characters refer to the same parts throughout the different views.

The drawings are not necessarily to scale, emphasis instead being placed upon illustrating embodiments of the present invention.

FIG. 10A. Erase Operation by Fowler-Nordheim (F-N) Tunneling.
FIG. 10B. Erase Operation by Fowler-Nordheim (F-N) Tunneling.
FIG. 11A. Program Operation by Fowler-Nordheim (F-N) Tunneling.
FIG. 11B. Program Operation by Fowler-Nordheim (F-N) Tunneling.

FIG. 46. Bias Conditions to Selected Block during Erase—Page Erase Scheme 3.

FIG. 47. Bias Conditions to Selected Block during Erase—Page Erase Scheme 3.

DETAILED DESCRIPTION OF THE INVENTION

A description of example embodiments of the invention follows.

The teachings of all patents, published applications and references cited herein are incorporated by reference in their entirety.

In flash memory, especially NAND flash devices, read and program operations are executed on a page basis while erase operations are executed on a block basis. Typically the page size is 512 bytes, 2048 bytes, or 4096 byte while the block size is 16 pages, 32 pages, or 64 pages. Therefore the minimum erasable block size is at least 16 times larger than the page size. Moreover, this minimum size of erasable block (i.e. unit erase block) is getting bigger as the chip size increases.

The array size mismatch between program/read and erase introduces two critical problems in device reliability (i.e. device lifetime) and system performance degradation in flash file system.

Unlike hard disk (HDD), memory cells in flash memory devices must be erased before being programmed by input data. Data write operations should be immediately executed once the CPU or flash controller in the system issues the program command. Thus the erase-before-program decreases overall system performance. In order to overcome this problem, the flash controller typically prepares empty erased blocks in advance (i.e. Erase-unit Reclamation). This reclamation can take place either in the background (when the CPU is idle) or on-demand when the amount of free space drops below a predetermined threshold.

Figure 16:
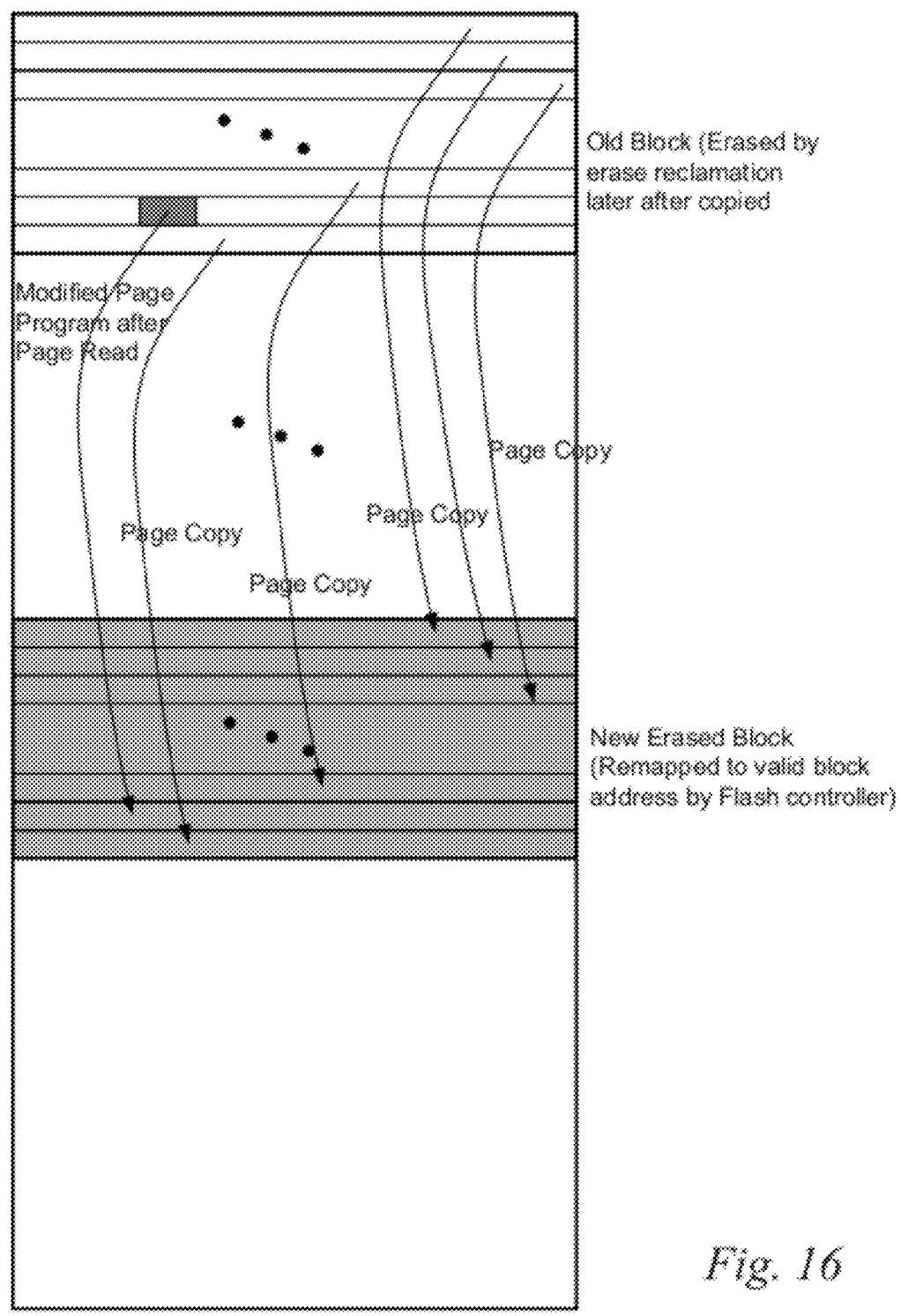
FIG. 16. Block Copy Process to Modify a Page or a Portion of the Page.

When the flash controller requests data write or data modification even into a small portion of the page, typically the block containing a page to be modified will be rewritten to one of free (empty) blocks declared by the erase-unit reclamation. In this case, valid pages containing original data in the original block should be copied to the selected free block as shown in FIG. 16. The modified page is read, modified and copied to the new block then, the new block having modified data in a page with original data in the rest of pages is remapped to the valid block address by a virtual mapping system in the flash controller. (The virtual mapping system is an address translation system between logical addresses accessed by the flash controller and physical addresses in the flash memory.) The original block is now obsolete and will be declared as a free block by the erase-unit reclamation process. (Refer Eran Gal, Sivan Toledo, "Algorithms and Data Structures for Flash Memories," ACM Computing Surveys, Vol. 37, No. 2, pp. 138-163, June 2005, incorporated herein by reference in its entirety for algorithms and data structures for flash memories.) To minimize performance degradation due to the block copy operation described above generally NAND flash devices support a page copy function without external transaction between flash devices and the flash controller. Nevertheless, the array size mismatch between program/read and erase operations introduces a huge system overhead and complexity.

The flash memory cell is programmed and erased by either Fowler-Nordheim tunneling or hot electron injection. During a program or erase operation, charge is transferred to or from a floating gate through the dielectric surrounding the floating gate. This frequent charge transfer causes electrons to be trapped in the floating gate and the dielectric, which degrades program and erase characteristics of cells. Consequent cells require gradually higher program voltage and erase voltage due to this electron trapping with an increasing number of erase-program cycles; as a result, the number of erase-program cycles on a cell is limited. Typically the maximum number of erase-program cycle (i.e. cell endurance characteristic) is between 10,000 and 100,000.

The limited number of erase-program cycles (endurance) limits the lifetime of a flash device. It would be advantageous to have a lifetime that is as long as possible, and this depends on the pattern of access to the flash device. Repeated and frequent rewrites to a single cell or small number of cells will bring the onset of failures soon and end the useful lifetime of the device quickly.

Moreover, in the flash memory system having multiple flash devices, if there is significantly uneven use among devices in the flash memory system, one device reaches an end of lifetime while other devices have significant life left in them. When the one device reaches an end of lifetime, the entire memory system may have to be replaced, and this greatly reduces the life time of the flash memory system.

If rewrites can be evenly distributed to all cells of the device, each cell will experience close to the maximum number of erases it can endure, and so the onset of failures will be delayed as much as possible, maximizing the lifetime of the device. To extend the device lifetime by even use across all the cells of the device, many wear-leveling techniques and algorithms have been proposed and implemented in the flash memory system The block copy operations due to the array size mismatch between read/program and erase described in the previous section introduces unnecessary rewrites because unaffected data in pages of the block should be rewritten (copied) to the new block with modified data. Thus it can dramatically extend the device lifetime if the minimum erasable array size is a page (i.e. page basis erase) instead of a block (i.e. block basis erase) because only pages to be rewritten need to be erased. In addition, the number of block copy operation will be greatly reduced by the page basis erase.

Each NAND cell string in the NAND flash memory can be controlled independently although the cell substrate is common across NAND cell strings of the device. All wordlines in a block during erase operations are biased to the same voltage condition in typical NAND flash devices. This is why the minimum erasable array size is a block in the NAND flash memory.

In order to erase flash memory cells in a page basis, each wordline corresponding to a page of the NAND cell string must be controlled separately and independently.

Page Erase Scheme 1

Figure 17:
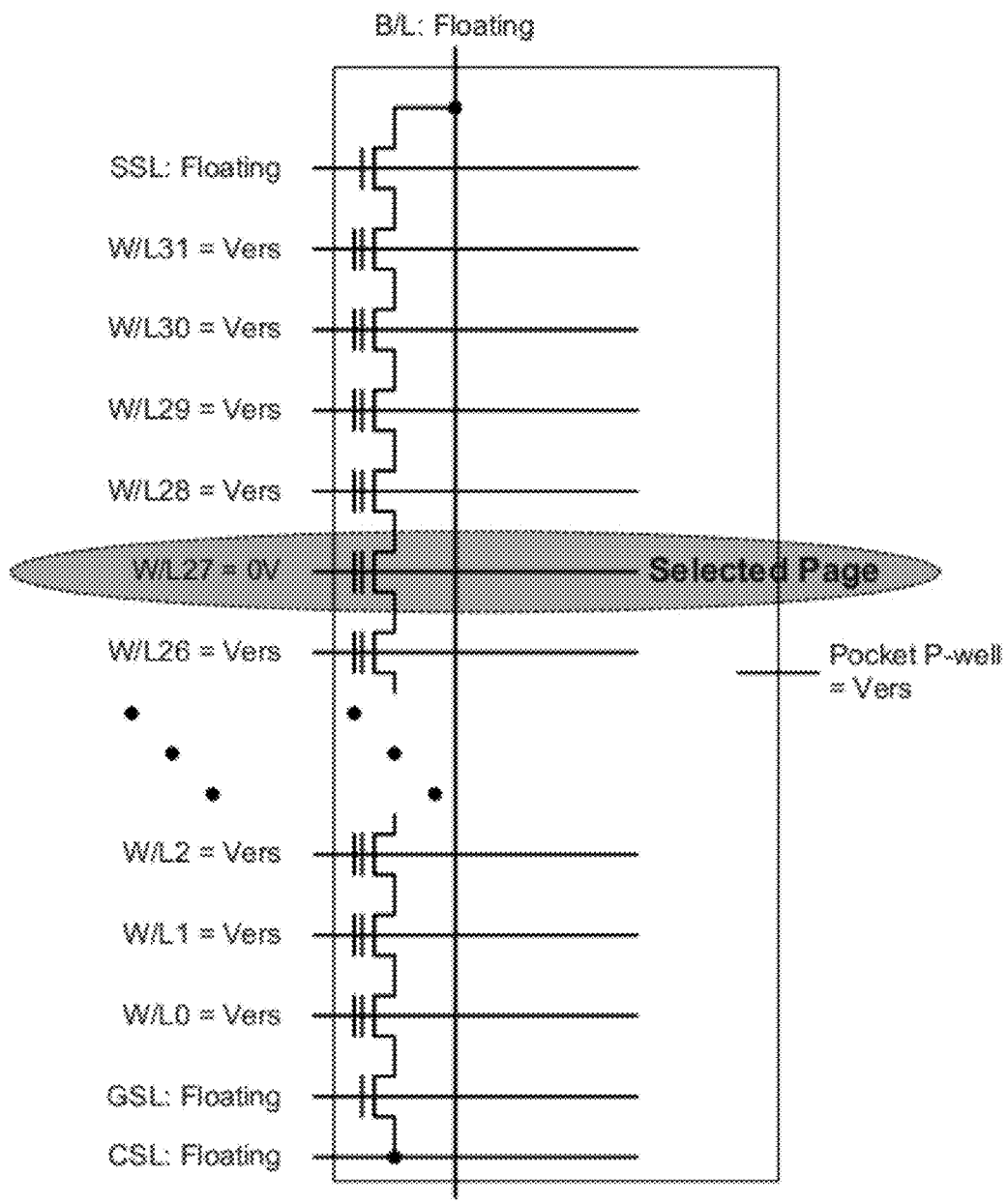
FIG. 17. Bias Conditions to Selected Block during Erase—Page Erase. Scheme 1
FIG. 18. Page Erase and Erase Inhibit—Page Erase Scheme 1.

Table 3 and FIG. 17 show bias conditions during page erase according to a page erase scheme 1 (for example, erase of wordline 27). With the page erase scheme 1, unselected wordlines are biased to a voltage for preventing the unselected page(s) from being erased, for example, Vers while the selected wordline(s) is(are) biased to another voltage for erasing the selected page(s), for example, 0V.

As shown in FIG. 17, within the selected block
Selected wordline(s) in the selected block is(are) biased to 0V for erase, and
Unselected wordline(s) in the selected block is(are) biased to Vers for erase inhibit.

Figure 18:
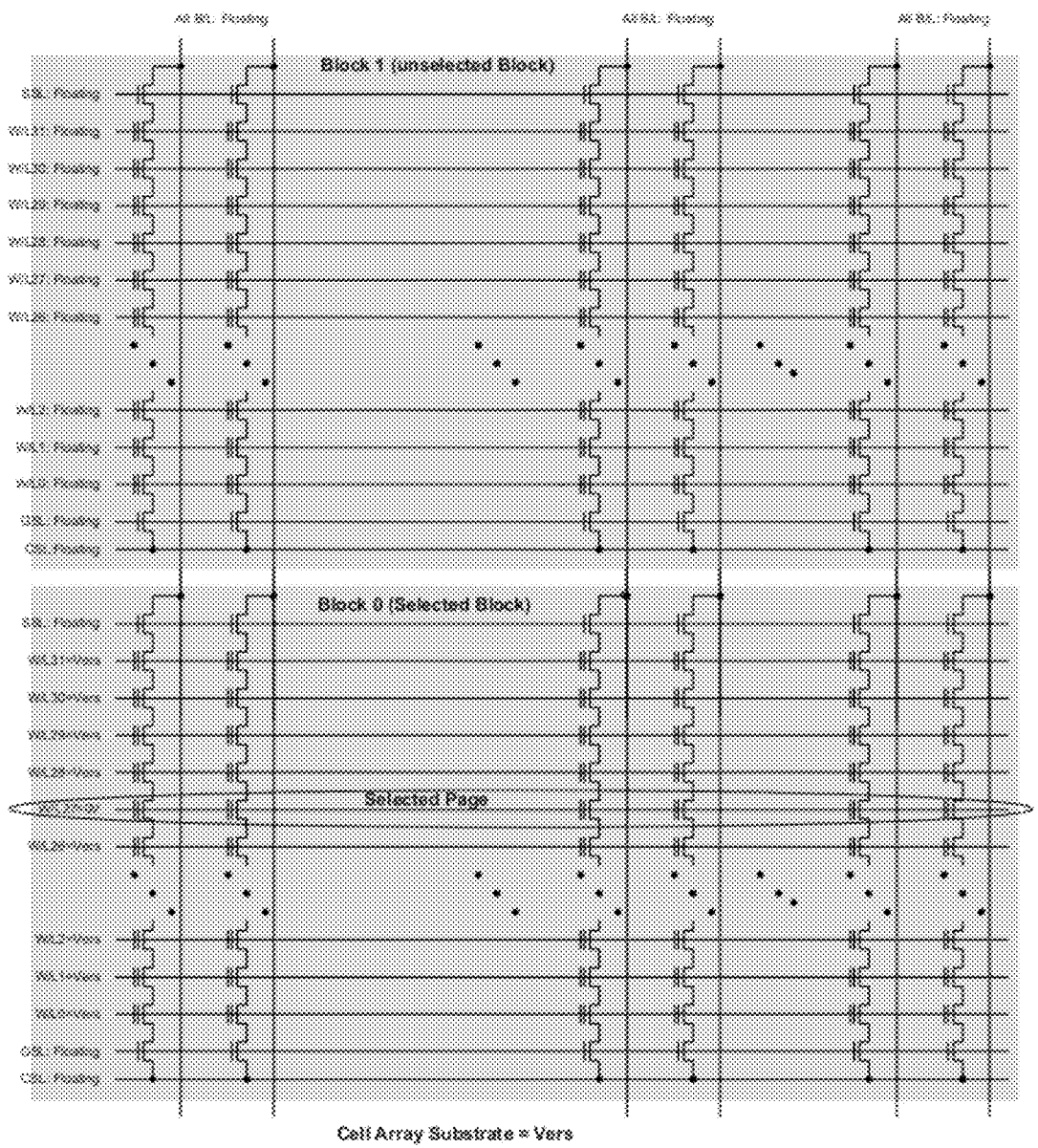

To prevent erasure of memory cells in unselected blocks, all wordlines in unselected blocks are floated during erase operations, which is the same as the prior art 2, while bias conditions shown in Table 3 are applied to the selected block as shown in FIG. 18. Therefore floated wordlines in unselected blocks are boosted to nearly erase voltage Vers by capacitive coupling between the substrate and wordlines in unselected blocks as applying erase voltage Vers to the substrate. (The wordlines are boosted to about 90% of Vers when the substrate of the cell array goes to Vers; however, boosted voltage level on floated wordlines is determined by coupling ratio between the substrate and wordlines.) The boosted voltage on wordlines in unselected blocks reduces electric field between the substrate and wordlines; as a result, erasure of memory cells in unselected blocks is prevented.

All wordlines in unselected blocks are floating.

TABLE 3

Bias Conditions during Page Erase - Page Erase Scheme 1

|  | SELECTED BLOCK | UNSELECTED BLOCK |
|---|---|---|
| BITLINES (B/L) | CLAMPED TO VERS-0.6 V | CLAMPED TO VERS-0.6 V |
| STRING SELECT LINE (SSL) | BOOSTED TO APPROX. 90% OF VERS | BOOSTED TO APPROX. 90% OF VERS |
| SELECTED WORDLINE | 0 V | BOOSTED TO APPROX. 90% OF VERS |
| UNSELECTED WORDLINE | VERS | BOOSTED TO APPROX. 90% OF VERS |
| GROUND SELECT LINE (GSL) | BOOSTED TO APPROX. 90% OF VERS | BOOSTED TO APPROX. 90% OF VERS |
| COMMON SOURCE LINE (CSL) | CLAMPED TO VERS-0.6 V | CLAMPED TO VERS-0.6 V |
| SUBSTRATE (POCKET P-WELL) | VERS | VERS |

Page Erase Schemes 2A and 2B

The bias condition for the page erase schemes 2A and 2B is as follows:
Cell gate (wordline) is biased to negative voltage −V1 (first level voltage).
Cell substrate is biased to a second level voltage.
Electric field between cell gate and substrate should meet a requirement to incur F-N tunneling through the tunnel oxide of the cell.
Trapped electrons (charge) in the floating poly (i.e. floating gate) of the cell are emitted to the substrate through the tunnel oxide.
The maximum of the second level voltage with the cell gate voltage of 0V should not introduce cell erase disturbance on unselected neighboring pages (e.g. shifting threshold voltage or soft-erase).
−V1 and the second level voltage can be varied in accordance with process technology and cell characteristics.

Figure 19:
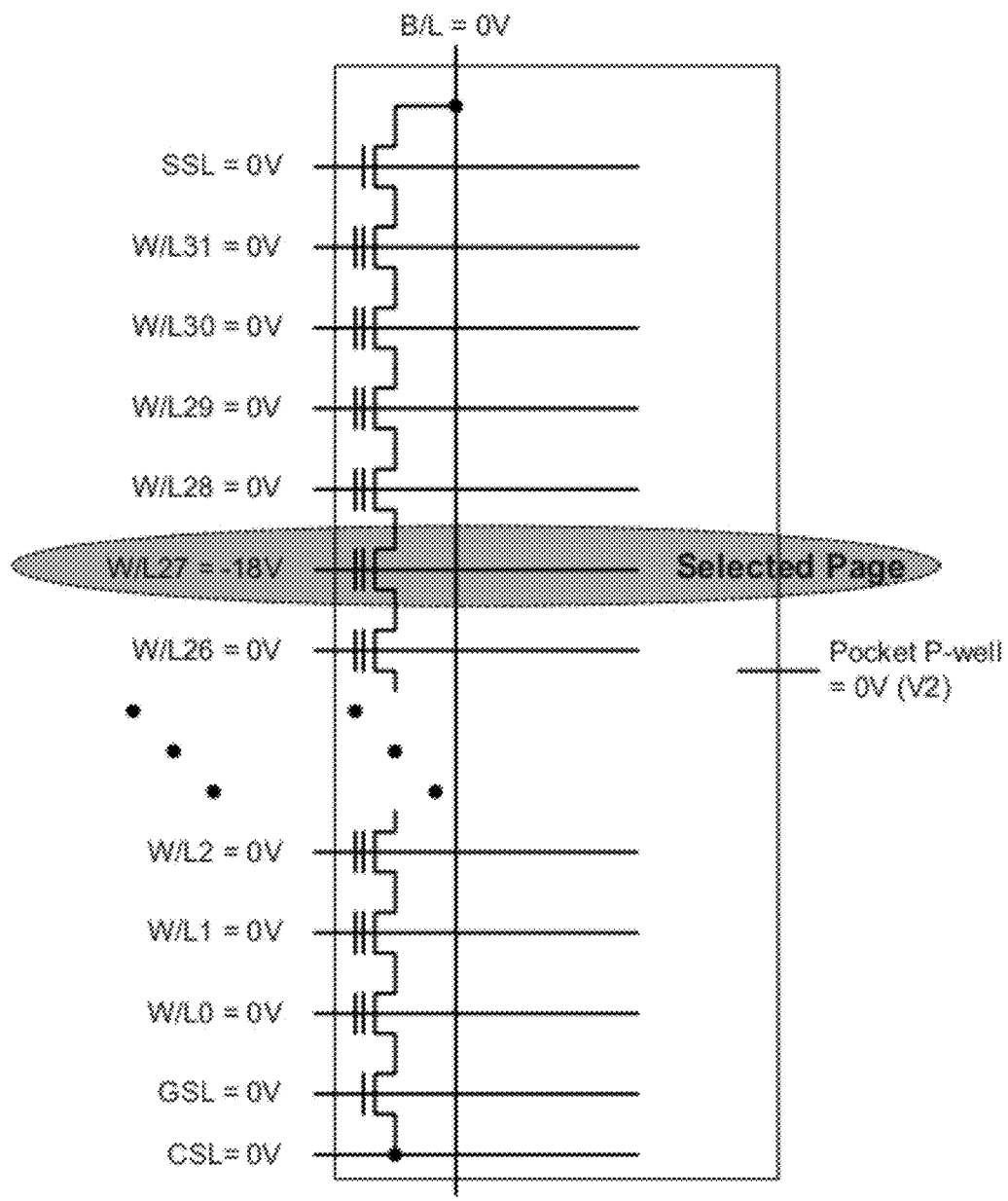
FIG. 19. Page Erase Bias Conditions—Page Erase Scheme 2A.

FIG. 19 shows voltage bias condition with the page erase scheme 2A to selected page (wordline 27 in this example) in the selected block during erase operation. The selected wordline 27 (page) is biased to negative voltage −18V (−V1) while unselected wordlines are biased to 0V. The substrate of the cell array is biased to 0V (V2=0V). Again the voltages can be varied in accordance with process technology and cell characteristic, which will be explained hereafter in conjunction with FIGS. 21 and 22 and Table 5. With the new erase condition, all cells of the selected page are erased while all cells of unselected pages are not erased due to no effective magnitude of electric field between the cell gate and the substrate.

Figure 20:
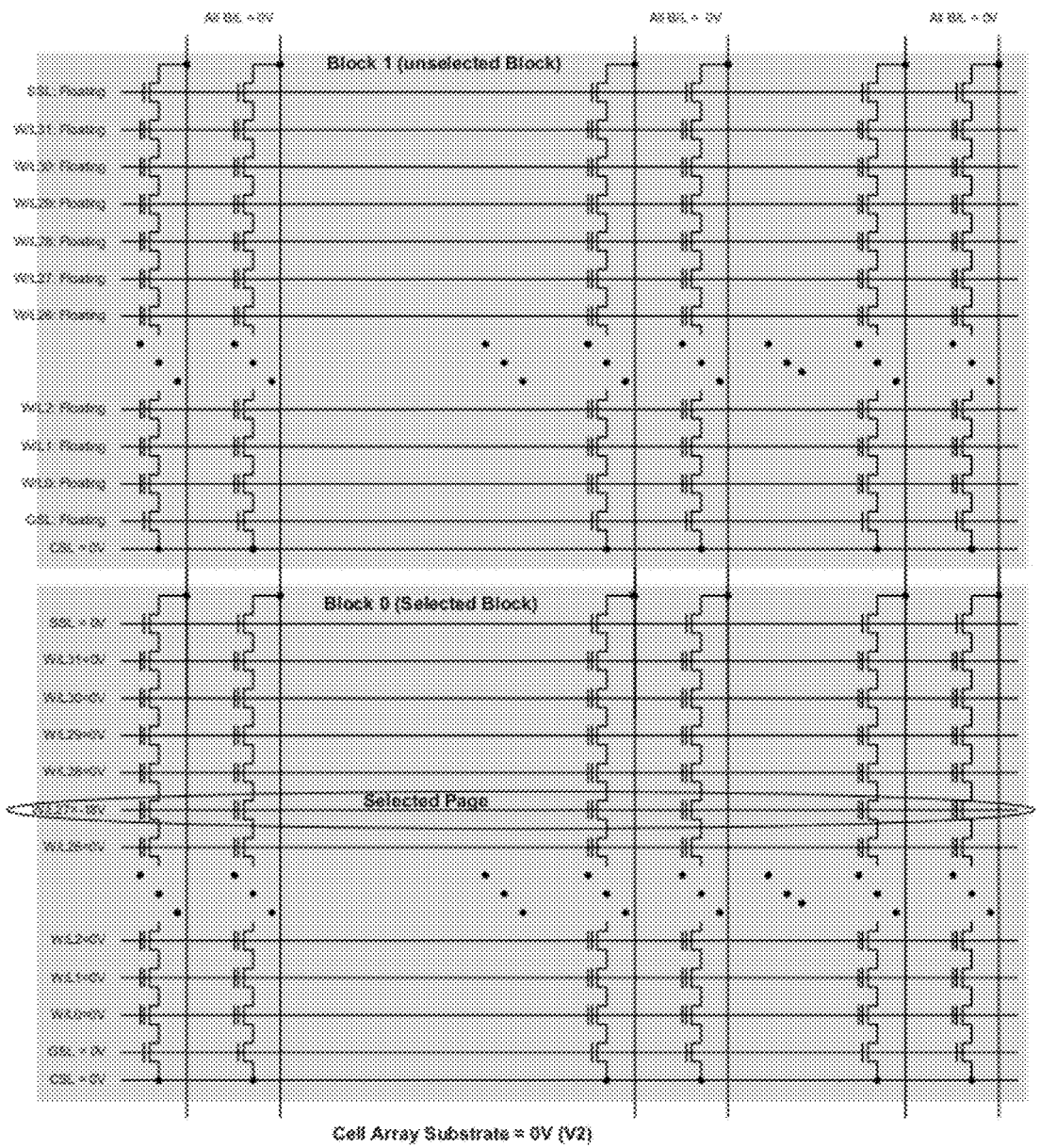
FIG. 20. Page Erase and Erase Inhibit—Page Erase Scheme 2A.

Table 4 and FIG. 20 show bias conditions for the selected block and unselected blocks. All wordlines of unselected blocks are floating during erase; hence the potential of all wordlines remain at 0V because the substrate is biased to 0V and all wordlines of unselected blocks are discharged to 0V before being floated for the erase.

TABLE 4

Bias Condition during Erase - Page Erase Scheme 2A

|  | SELECTED BLOCK | UNSELECTED BLOCK |
|---|---|---|
| BITLINES (B/L) | 0 V | 0 V |
| STRING SELECT LINE (SSL) | 0 V | FLOATING AT 0 V |
| SELECTED WORDLINES | −18 V (−V1) | FLOATING AT 0 V |
| UNSELECTED WORDLINES | 0 V | FLOATING AT 0 V |
| GROUND SELECT LINE (GSL) | 0 V | FLOATING AT 0 V |
| COMMON SOURCE LINE (CSL) | 0 V | 0 V |
| SUBSTRATE (P-WELL OR POCKET P-WELL) | 0 V | 0 V |

Figure 21:
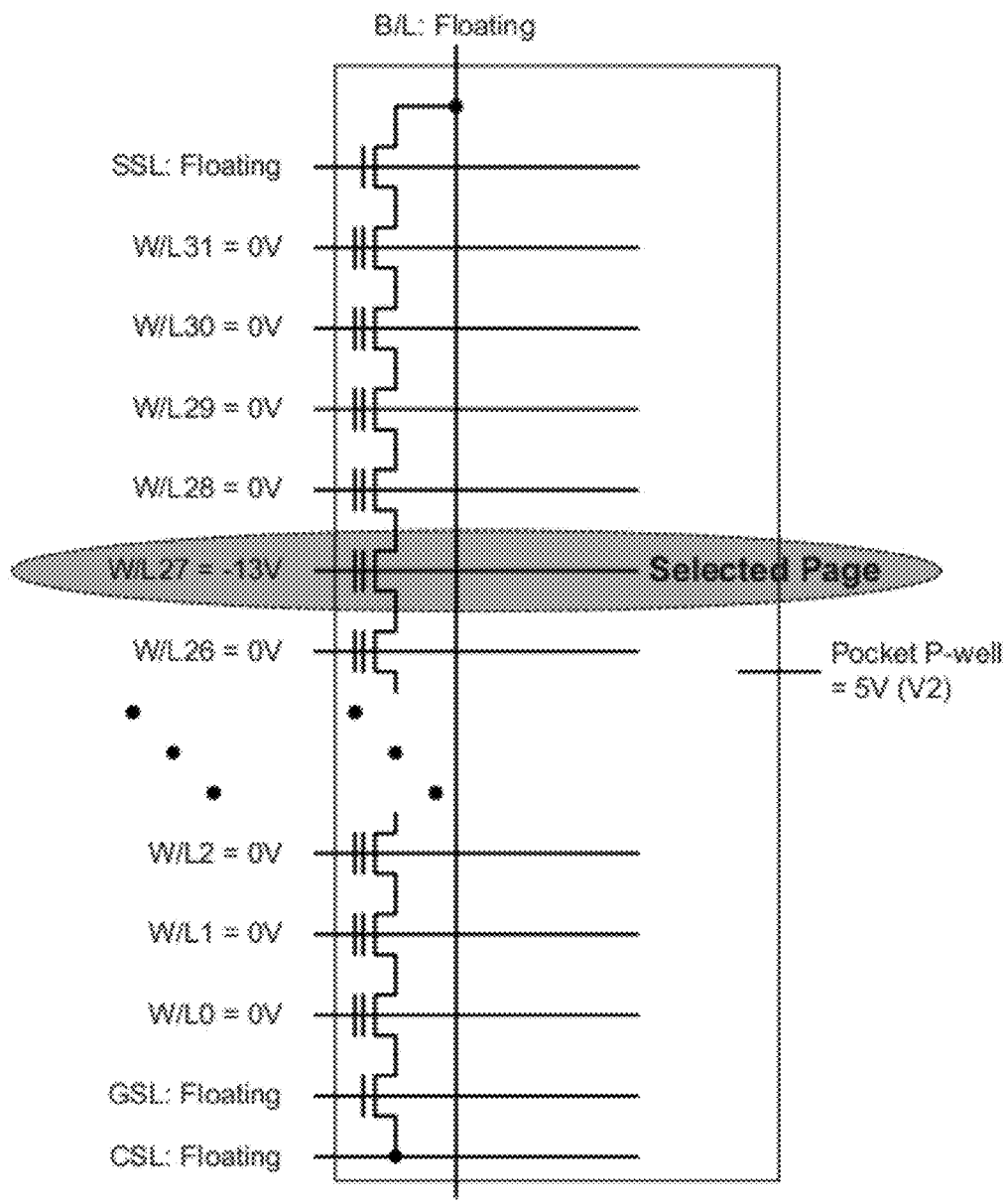
FIG. 21. Page Erase Bias Conditions—Page Erase Scheme 2B.

FIG. 21 shows voltage bias condition with the page erase scheme 2B to a selected page (wordline 27 in this example) in the selected block during erase operation. The selected wordline 27 (page) is biased to negative voltage −13V (−V1) while unselected wordlines are biased to 0V. The substrate of the cell array is biased to 5V. Total electric field between the gate and the substrate of cells is the same as that of the first example. Voltage to the substrate should be determined not to introduce erase disturbance (i.e. soft-erase) to cells on the unselected wordlines (pages) in the same NAND cell string.

Figure 22:
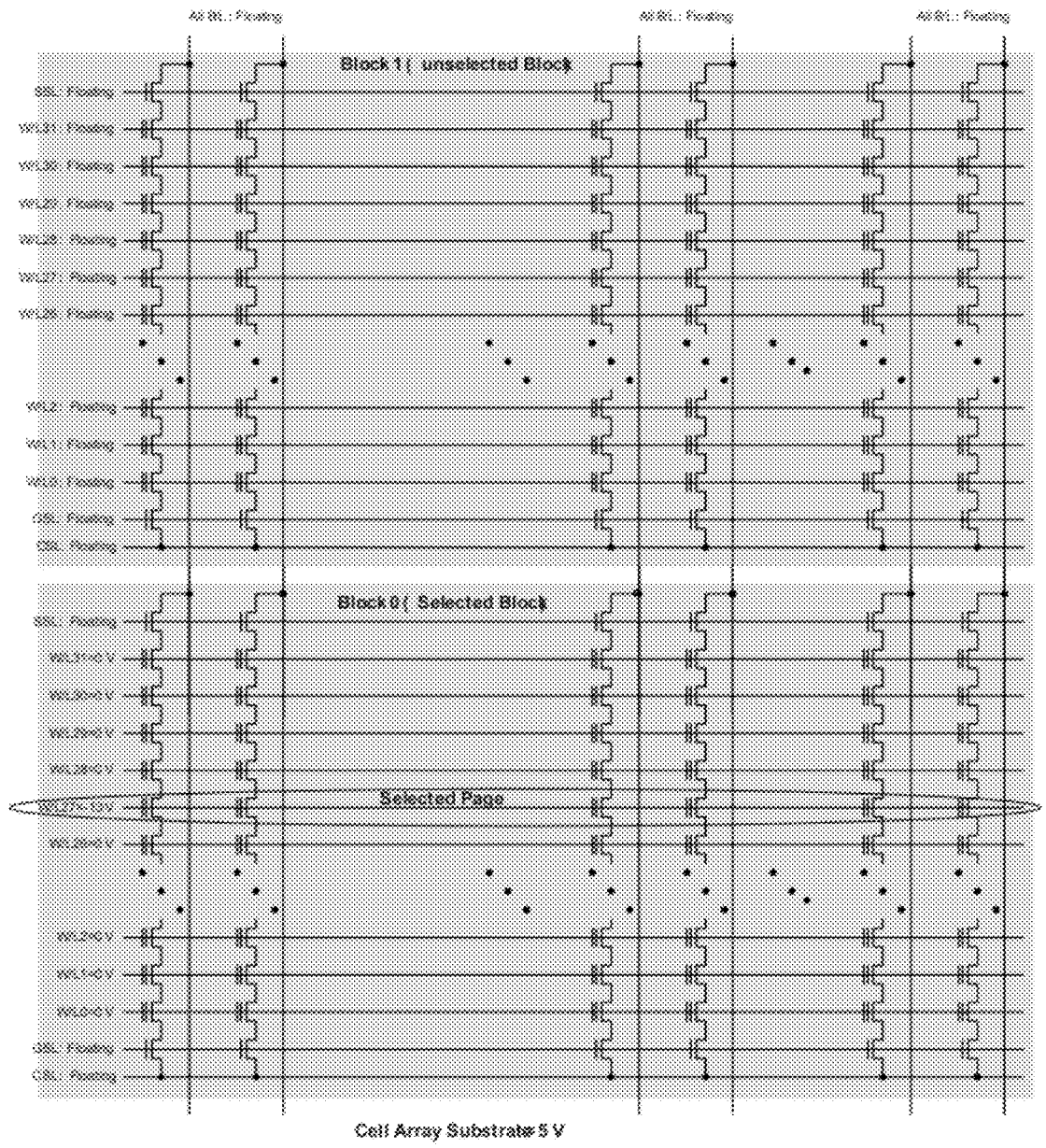
FIG. 22. Page Erase and Erase Inhibit—Page Erase Scheme 2B.

Table 5 and FIG. 22 show bias conditions for the selected block and unselected blocks. All wordlines of unselected blocks are floating during erase operations, all wordlines of unselected blocks are boosted to nearly the substrate voltage by capacitive coupling between the substrate and wordlines in unselected blocks as applying voltage to the substrate. (The boosted voltage is about 90% of substrate voltage; however boosted voltage level on floated wordlines is determined by coupling ratio between the substrate and wordlines) The boosted voltage on wordlines in unselected blocks reduces electric field between the substrate and wordlines; as a result, erasure of memory cells in unselected blocks is prevented.

TABLE 5

Bias Conditions during Erase - Page Erase Scheme 2B

|  | SELECTED BLOCK | UNSELECTED BLOCK |
|---|---|---|
| BITLINES (B/L) | CLAMPED TO SUBSTRATE-0.6 V | CLAMPED TO SUBSTRATE-0.6 V |
| STRING SELECT LINE (SSL) | BOOSTED TO APPROX. 90% OF SUBSTRATE | BOOSTED TO APPROX. 90% OF SUBSTRATE |
| SELECTED WORDLINES | −13 V (−V1) | BOOSTED TO APPROX. 90% OF SUBSTRATE |

TABLE 5-continued

Bias Conditions during Erase - Page Erase Scheme 2B

| | SELECTED BLOCK | UNSELECTED BLOCK |
|---|---|---|
| UNSELECTED WORDLINES | 0 V | BOOSTED TO APPROX. 90% OF SUBSTRATE |
| GROUND SELECT LINE (GSL) | BOOSTED TO APPROX. 90% OF SUBSTRATE | BOOSTED TO APPROX. 90% OF SUBSTRATE |
| COMMON SOURCE LINE (CSL) | CLAMPED TO SUBSTRATE-0.6 V | CLAMPED TO SUBSTRATE-0.6 V |
| SUBSTRATE (POCKET P-WELL) | 5 V SUBSTRATE | 5 V SUBSTRATE |

Multiple Pages Erase and Block Erase

With the new page erase concept, multiple pages (wordlines) in the selected block can be erased. In fact, by selective control of the wordline voltages, any one or more pages of a selected block may be erased. Furthermore, entire pages of the selected block can be also erased, which is basically block erase.

Figure 23:
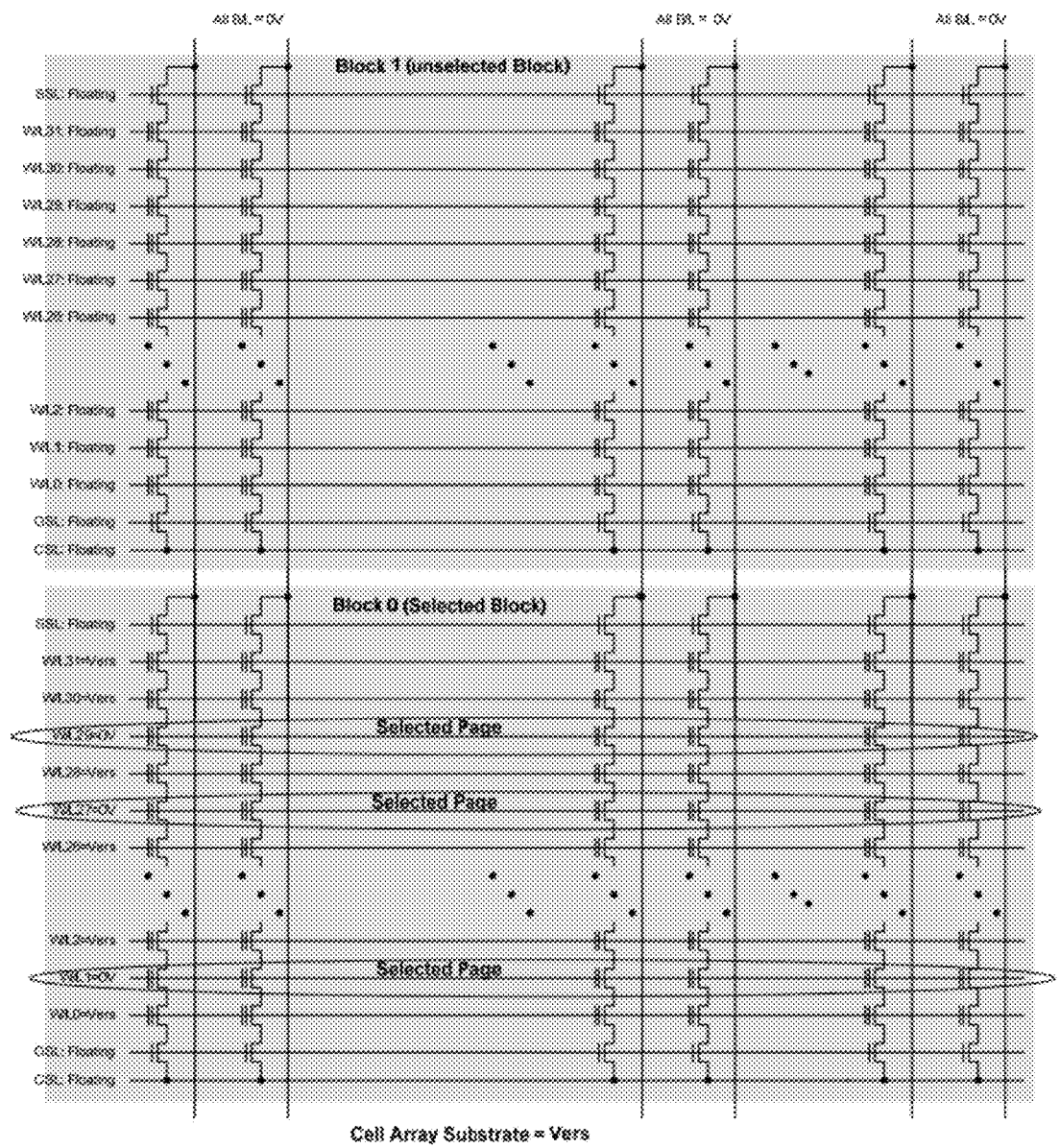
FIG. 23. Multiple Pages Erase—Page Erase Scheme 1.

FIG. 23 shows three pages (wordline 1, 27, 29) in the selected block are erased at the same time using bias conditions of the page erase scheme 1.

Figure 24:
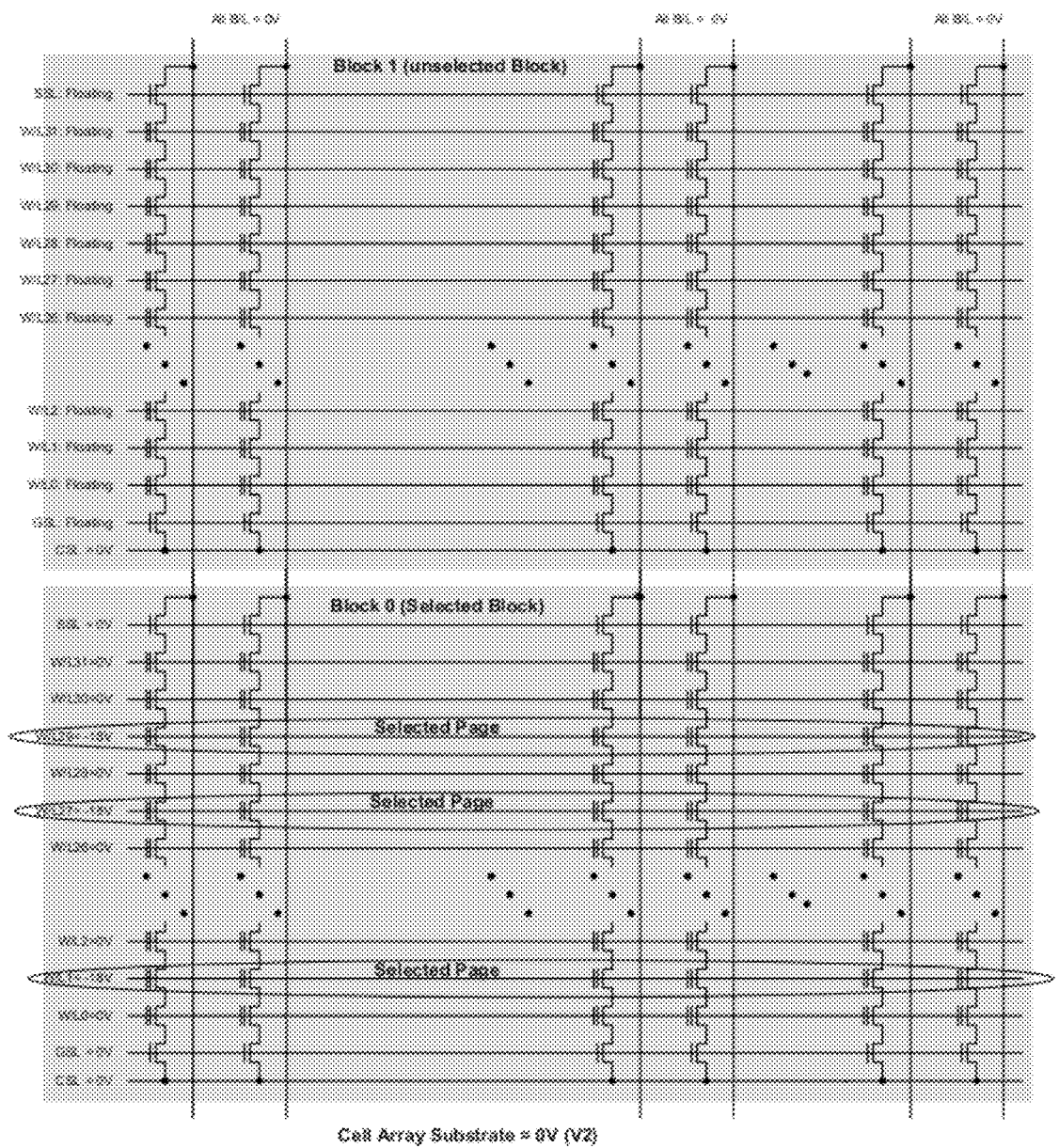
FIG. 24. Multiple Pages Erase—Page Erase Scheme 2A.

FIG. 24 shows three pages (wordline 1, 27, 29) in the selected block are erased at the same time using bias condition of the page erase scheme 2A.

Figure 25:
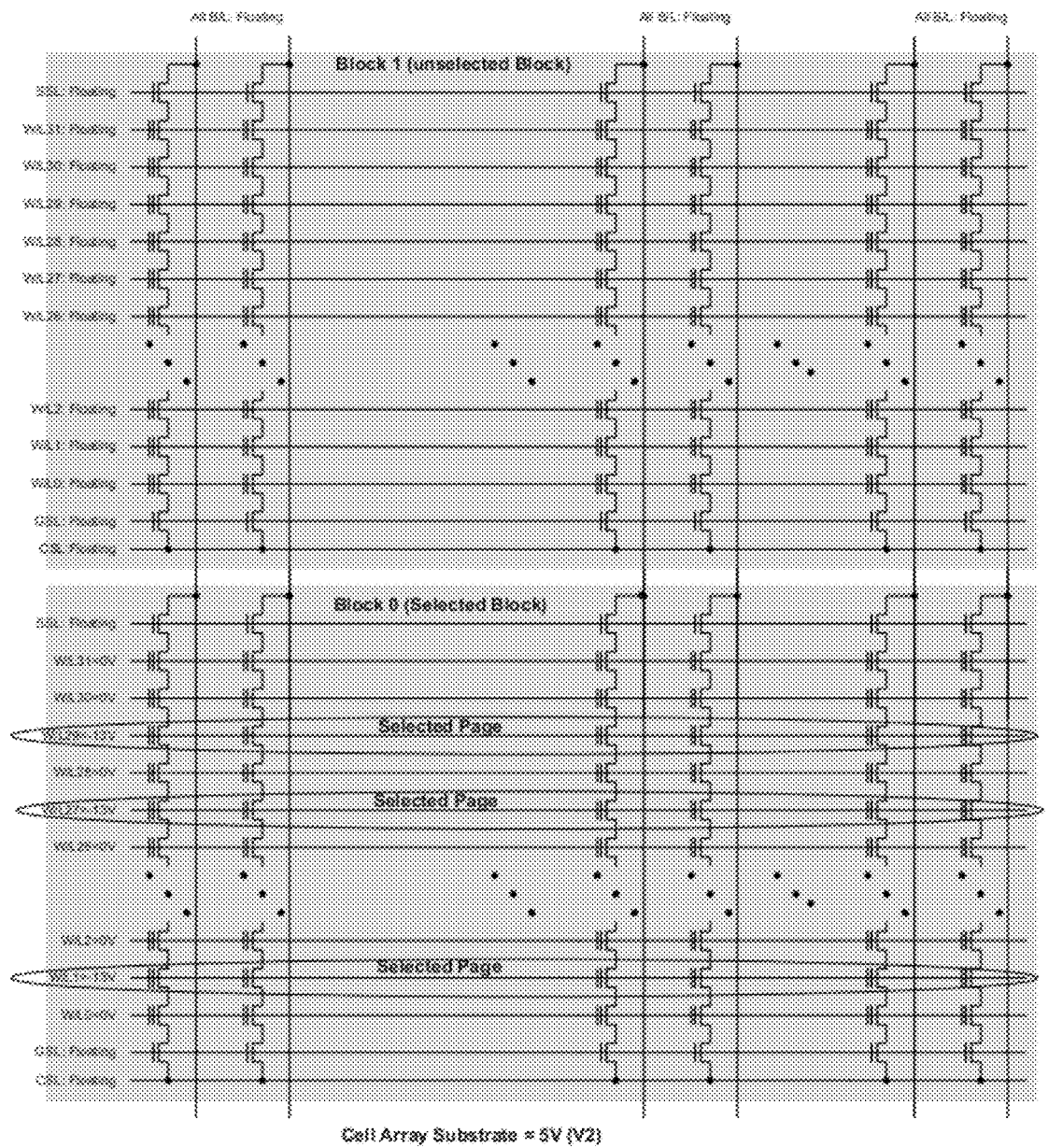
FIG. 25. Multiple Pages Erase—Page Erase Scheme 2B.

FIG. 25 shows three pages (wordline 1, 27, 29) in the selected block are erased at the same time using bias condition of the page erase scheme 2B.

Figure 26:
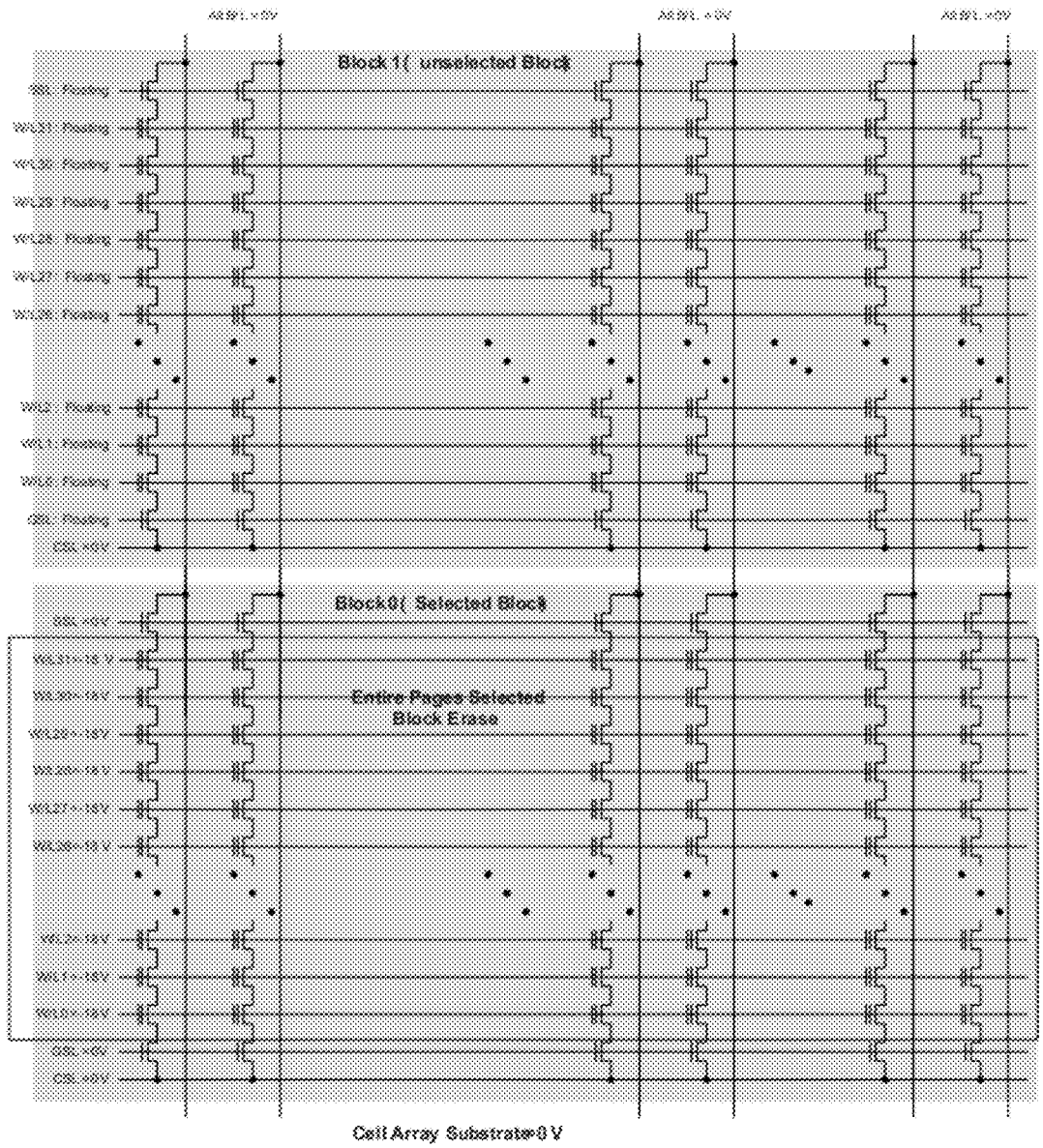
FIG. 26. Block Erase—Page Erase Scheme 2A.

FIG. 26 shows all pages in the selected block are erased at the same time using bias condition of the page erase scheme 2A, which is the block erase.

Figure 27:
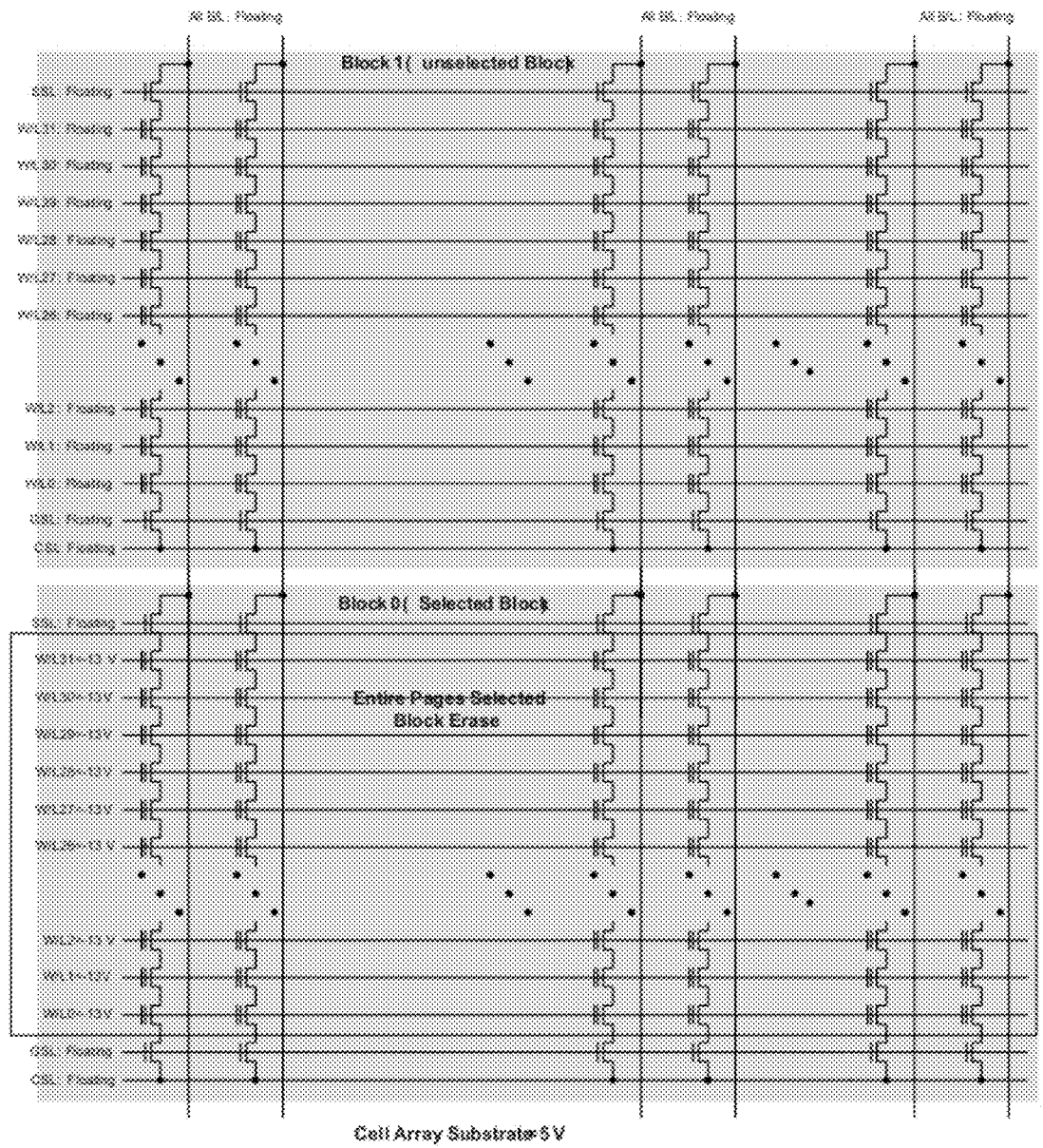
FIG. 27. Block Erase—Page Erase Scheme 2B.

FIG. 27 shows all pages in the selected block are erased at the same time using bias condition of the page erase scheme 2B, which is the block erase.

Erase Verify

Figure 28:
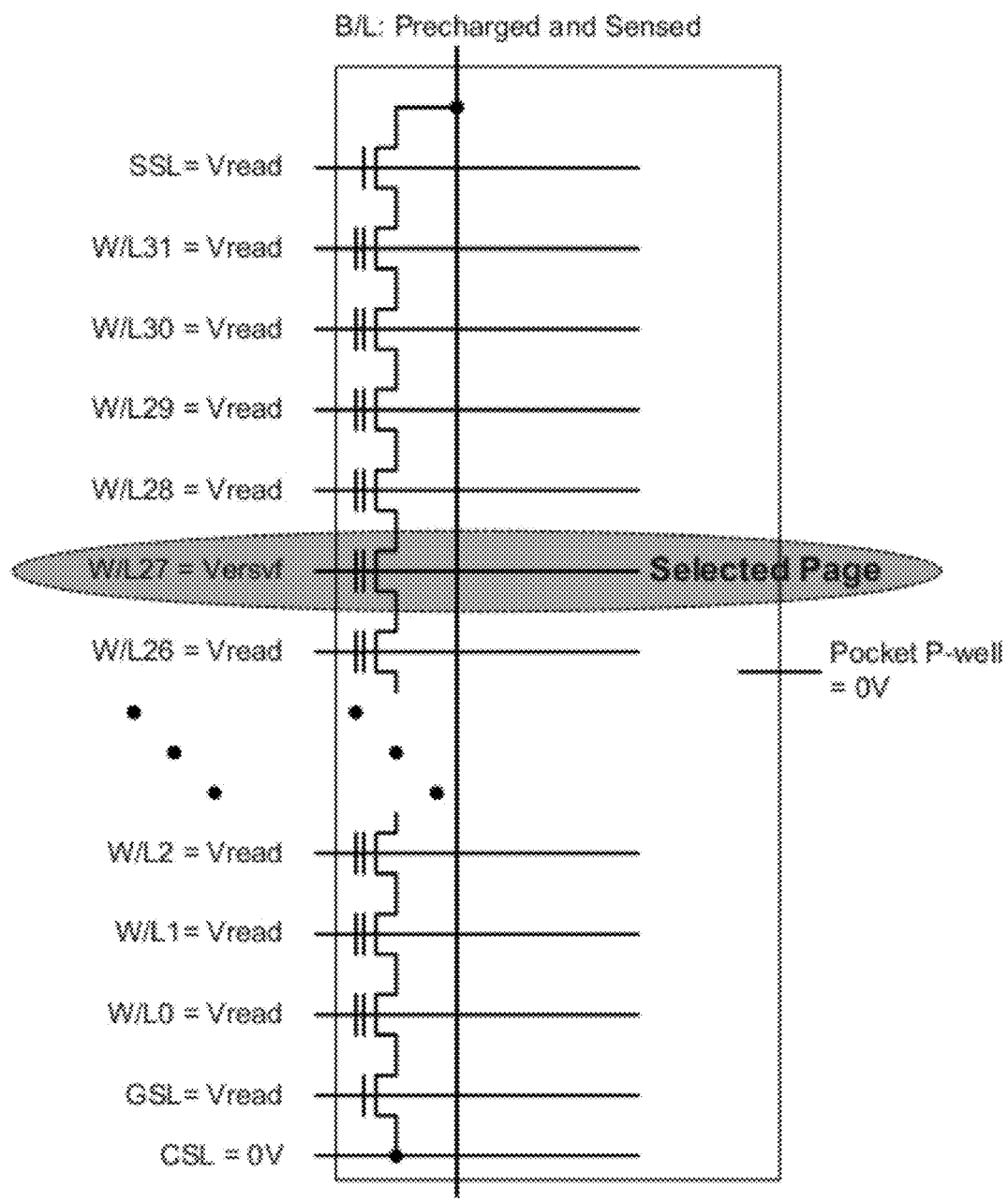
FIG. 28. Page Erase Verify without Source Bias.
Figure 29:
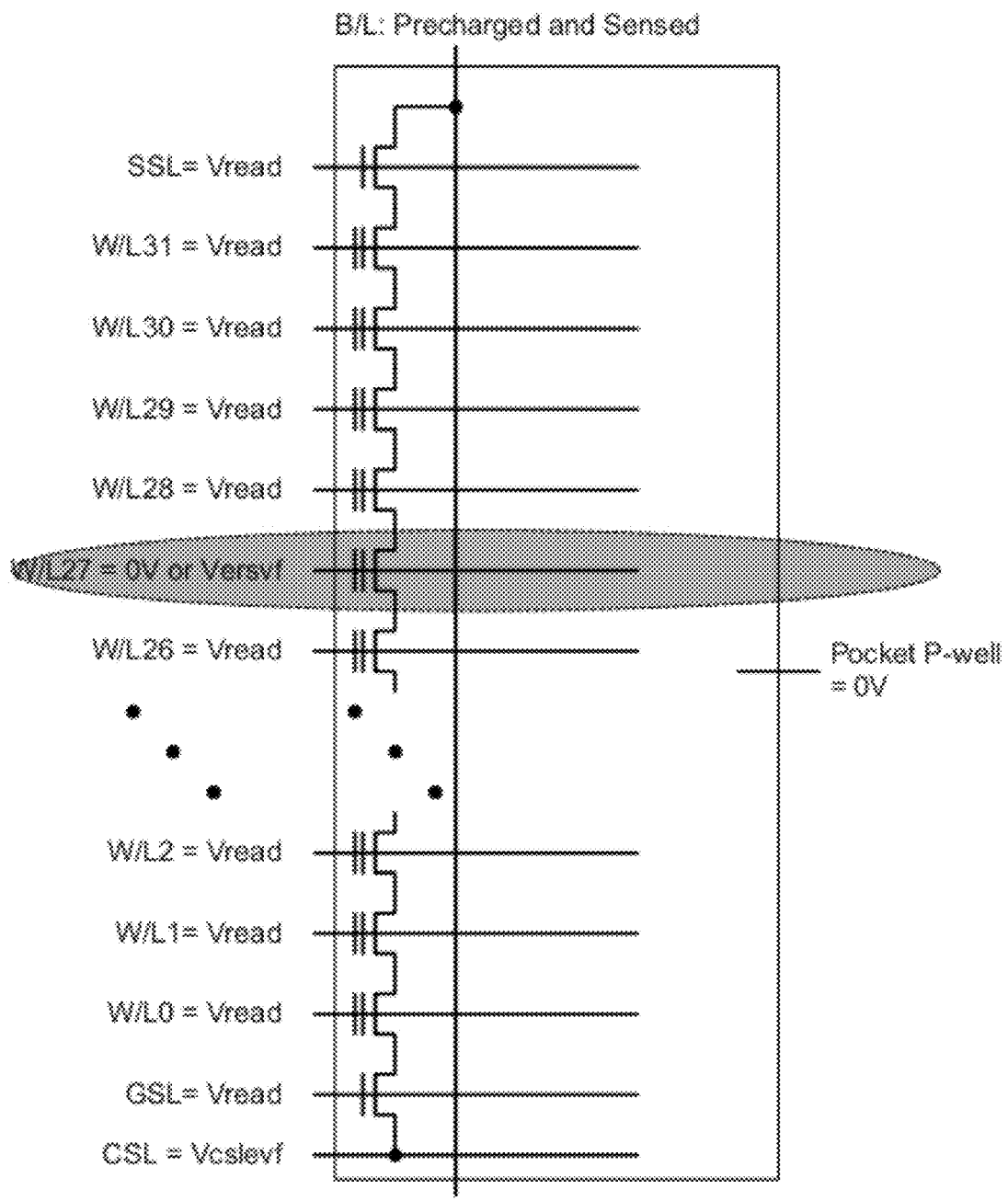
FIG. 29. Page Erase Verify with Source Bias.
Figure 30:
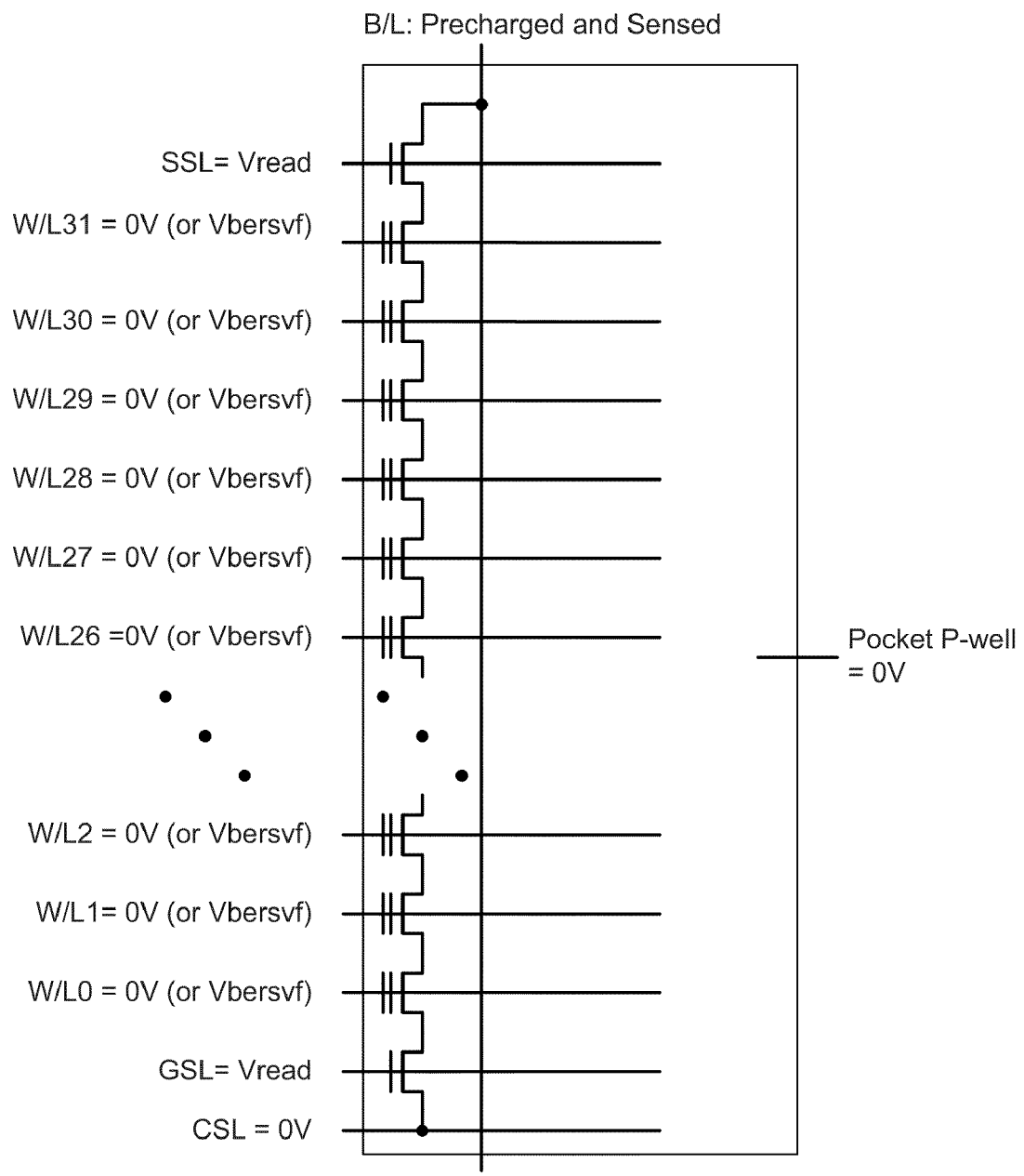
FIG. 30. Block Erase Verify.

After erasing a single page or multiple pages or all pages in the selected block, the erase verify must be performed to guarantee that erased cells have proper threshold voltage margin to be read. This erase verify is performed by page buffers described below. FIG. 28, FIG. 29, FIG. 30, and Table 6 show voltage bias conditions during page erase verify and block erase verify. For multiple page verify, each selected page maybe verified consecutively (sequentially) after erase, but in a preferred approach, all are verified at once. Voltage numbers (i.e. Vread, Versvf, Vcslevf and Vbersvf) in Table 6 can be varied in accordance with process technology and cell characteristic.

FIG. 28 shows single page erase verify without source bias, FIG. 29 shows single page erase verify with source bias from CSL. FIG. 30 shows block erase verify.

TABLE 6

Bias Condition during Erase Verify

| | PAGE ERASE VERIFY WITH SOURCE BIAS | PAGE ERASE VERIFY WITHOUT SOURCE BIAS | BLOCK ERASE VERIFY |
|---|---|---|---|
| BITLINES (B/L) | PRECHARGED AND SENSED | PRECHARGED AND SENSED | PRECHARGED AND SENSED |
| STRING SELECT LINE (SSL) | VREAD (4~5 V) | VREAD (4~5 V) | VREAD (4~5 V) |
| SELECTED WORDLINES | 0 V OR VERS$_{VF}$ | VERSVF (~1.5 V) | 0 V OR VBERSVF |
| UNSELECTED WORDLINES | VREAD (4~5 V) | VREAD (4~5 V) | N/A |
| GROUND SELECT LINE (GSL) | VREAD (4~5 V) | VREAD (4~5 V) | VREAD (4~5 V) |
| COMMON SOURCE LINE (CSL) | VCSLEVF (~0.4 V) | 0 V | 0 V |
| SUBSTRATE (POCKET P-WELL) | 0 V | 0 V | 0 V |

The final column of Table 6 shows the block erase verify where all wordlines are selected. Those conditions can be compared to a conventional block erase verify. 0 volts, or for a less tolerant verification, a minus voltage such as −1.5V, is applied to each wordline. As can be seen by reference to FIG. 10B, a properly erased memory cell will conduct with 0 volts applied to the wordline. If, however, the memory cell has not been fully erased, the memory cell will conduct less or not at all. In the block erase verify, any one of the memory cells failing to fully conduct will result in a higher voltage on the bitline that can be sensed as a failure to fully erase.

In the case of erase verify with a single selected page where only that page has been erased, each of the other memory cells of the string may be in either on state or off state. To account for that, a high voltage of, for example, 4-5V is applied to the wordline of each unselected cell. That voltage is higher than the threshold voltage even when the cell has been programmed to the off state as seen in FIG. 11B. Thus, the cell will conduct even where it is been programmed to the off state, and all unselected memory cells will conduct. Setting the selected wordline to zero volts enables verification of just that selected wordline.

With the high conduction of all unselected cells in the string, a lower voltage on the bit line than is typical during a verify operation would be expected. To offset that increased conduction of the unselected memory cells, either a negative voltage, such as −1.5 volts in the second column of Table 6, can be applied to the selected wordlines, or a voltage higher than zero volts, such as 0.4V shown in column one of Table 6, can be applied to the common source line. As a result, for verification, the selected memory cell must be more conductive for verification to offset the higher conductance of the unselected cells.

It is generally preferable to generate positive bias voltages than negative voltages, so the page erase verify with positive common source bias is generally preferred. Appropriate voltages of the common source line might, for example, fall in the range of 0.3V-0.5V for a single page. For multiple page erase verify of less than a full block, lesser voltages are appropriate. For example, with a 0V common source voltage for a full block erase verify and 0.5V for a 1 page verify, it might be appropriate to decrease the source voltage from 0.5V by increments of 0.5/32 for each additional page being verified at once with the first page. Such fine control of the source voltage should not be required. However, the source voltage of 0.5V might, for example be used for verification of 0 through 8 selected wordlines at once, 0.4V might be used for verification of 9 through 16 select wordlines, 0.3V for 17-24 wordlines and 0V for 25-32 wordlines.

Page Erase Flow

Figures 31, 32:
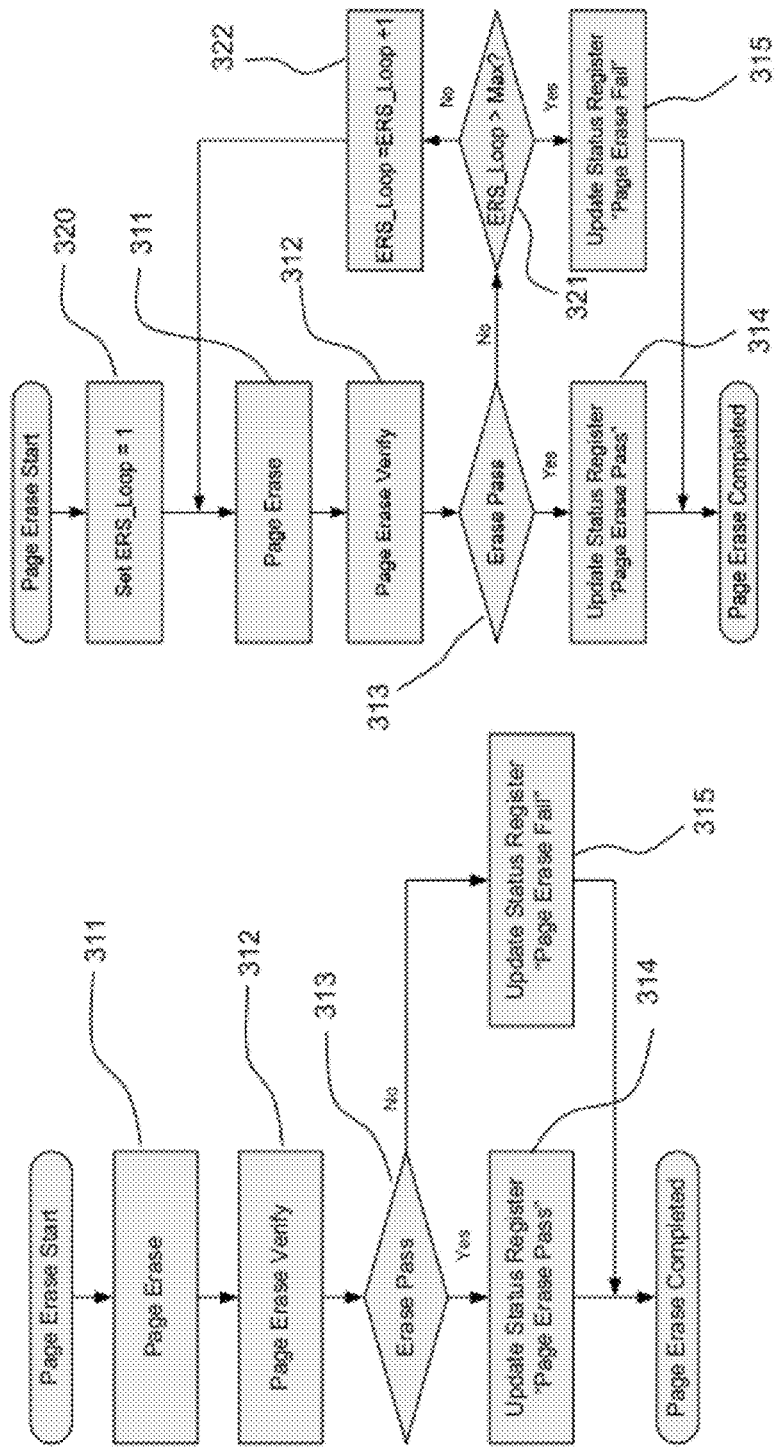
FIG. 31. Page Erase Flow—Single Erase & Erase Verify Cycle.
FIG. 32. Page Erase Flow—Multiple Erase & Erase Verify Cycle.

Unlike program operations, typically, erase operations do not require multiple erase and erase verify cycles since the threshold voltage of cells after a single erase and erase verify cycle is tightly distributed to the target value. However multiple erase and erase verify cycles also can be applied to ensure target threshold voltage of erased cells FIG. 31 shows a page erase flow using a single erase and erase verify cycle while FIG. 32 shows a page erase flow using multiple erase and erase verify cycles. The maximum number of erase and erase verify cycles for the multiple erase and erase verify cycles method is predetermined and will be varied in accordance with process technology and cell characteristic. This page erase algorithm (flow) is automatically performed after issuing a page erase command in flash memory devices In FIG. 31 at 311, one or more selected pages, up to and including a full block, are erased. At 312, that one or more pages are verified to have been erased. From 313, if the memory pass the verification, the status register is updated to pass at 314, and if not, it is updated to fail at 315.

Alternatively, as illustrated in FIG. 32, a value ERS_loop is set to one at 320. In the case of no pass as 313, the ERS_loop value is compared to a maximum at 321. If the maximum has not been reached, the value is incremented at 322 and the erase and verify procedures are repeated. Once the maximum number of loops has been reached, the failure is indicated in the register at 315.

Alternatively, after a multiple page erase, each selected page may be verified individually. With sequential verify of the individual pages, the multiple page erase may be repeated after the failure of any one page, or only failed pages may be again erased.

Example of Circuit Implementation

Figure 33:
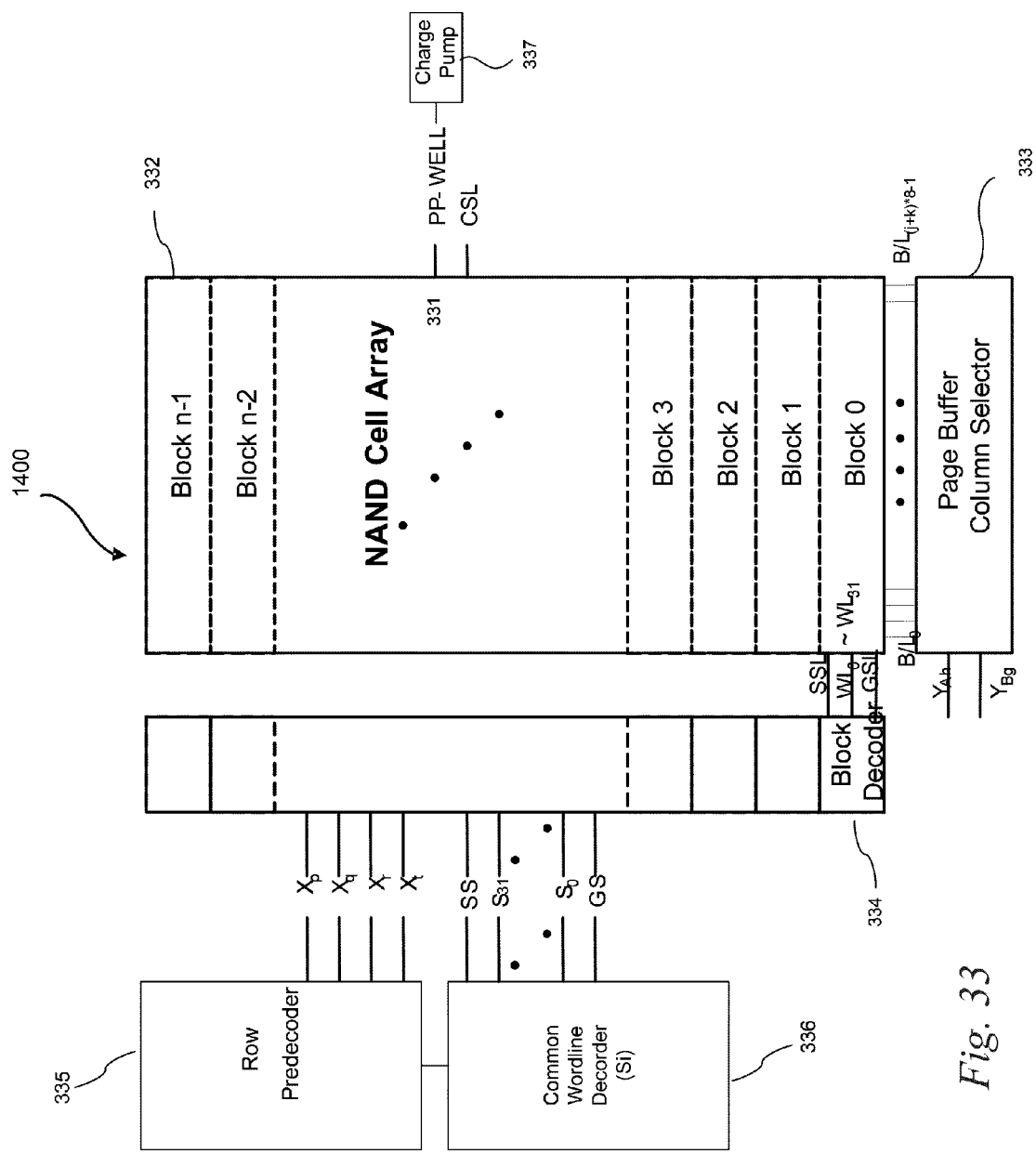
FIG. 33. Simplified Block Diagram of NAND Flash Core.

FIG. 33 depicts a simplified block diagram of NAND flash core. The NAND cell array 331 comprises n blocks 332 like conventional NAND flash. The page buffer circuit 333 senses and latches cell data during read, program verify and erase verify. Also the page buffer circuit temporarily holds input data and determines the voltage of bitlines in accordance with input data during program operations. All (j+k)*8 bitlines from the NAND cell array are connected to the page buffer circuit. The block decoder 334 corresponding to each NAND cell block provides signals as SSL (String Select Line), wordline 0 (WL0) to 31 (WL31) and GSL (ground select line). Block decoders are driven by row predecoded address signals Xp/Xq/Xr/Xt, from row predecoder 335, and string select signal SS, ground select signal GS and common string decode signals S0 to S31 from common wordline decoder 336. A substrate voltage is applied to the PP-well from a charge pump 337.

In this document, input and output circuit, control circuit, row and column pre decoder circuit, internal high voltage generator are not described because they are well described in many published papers and patents. Refer to references Kang-Deog Suh et al., "A 3.3 V 32 Mb NAND Flash Memory with Incremental Step Pulse Programming Scheme," IEEE J Solid-State Circuits, vol. 30, no. 11, pp. 1149-1156, April 1995, Jin-Ki Kim et al., "A 120-mm 64-Mb NAND Flash Memory Achieving 180 ns/Byte Effective Program Speed," IEEE J Solid-State Circuits, vol. 32, no. 5, pp. 670-680, April 1997, Ken Takeuchi, et al., "A 56 nm CMOS 99 mm2 8 Gb Multi-level NAND Flash Memory with 10 MB/s Program Throughput," ISSCC Dig. Tech. Paper, pp. 144-145, February 2006, and June Lee et al., "A 90-nm CMOS 1.8-V 2-Gb NAND Flash Memory for Mass Storage Applications," IEEE J Solid-State Circuits, vol. 38, no. 11, pp. 1934-1942, November 2003 incorporated by reference in their entireties.

Figure 1:
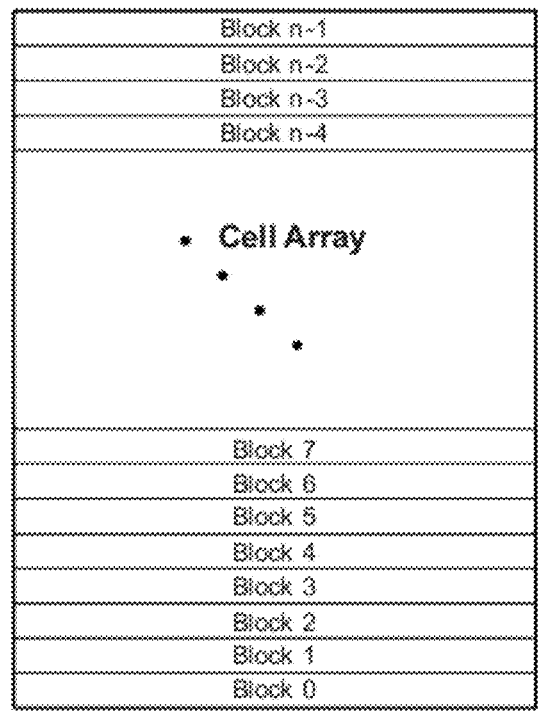
FIG. 1. NAND Flash Cell Array Structure.
Figure 2:
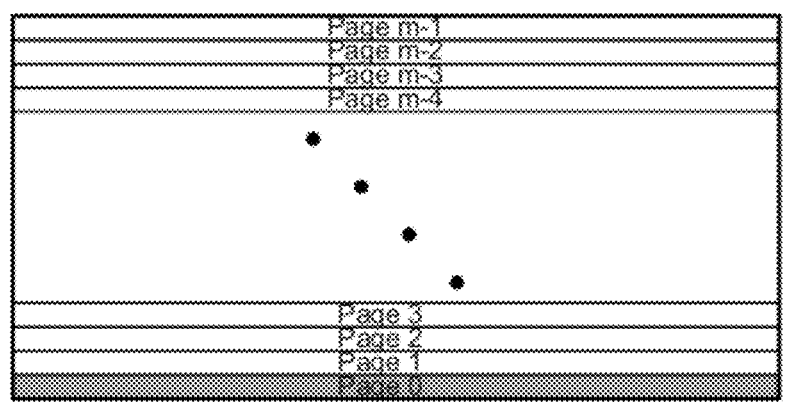
FIG. 2. NAND Flash Block Structure.
Figure 3:
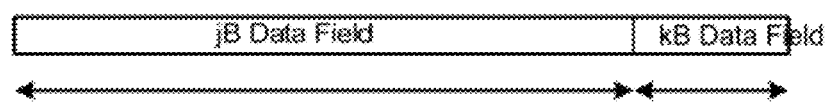
FIG. 3. NAND Flash Page Structure.
Figure 6:
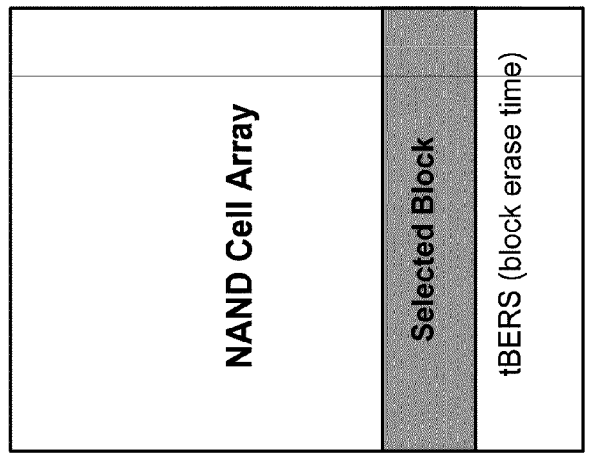
FIG. 6. Block Basis Erase Operation in NAND Flash.
Figure 5:
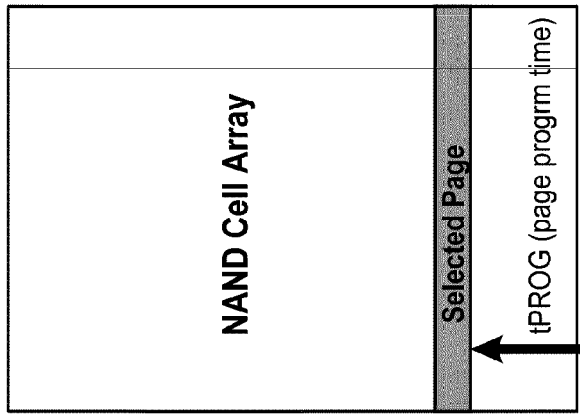
FIG. 5. Page Basis Program Operation in NAND Flash.
Figure 4:
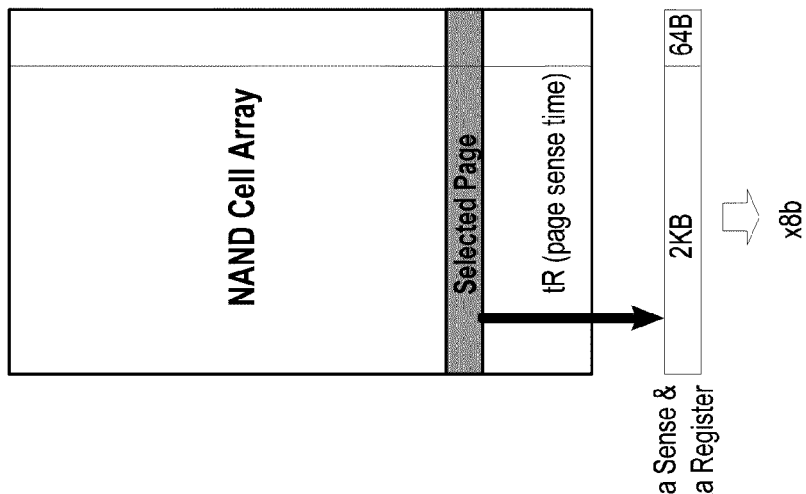
FIG. 4. Page Basis Read Operation in NAND Flash.
Figure 7:
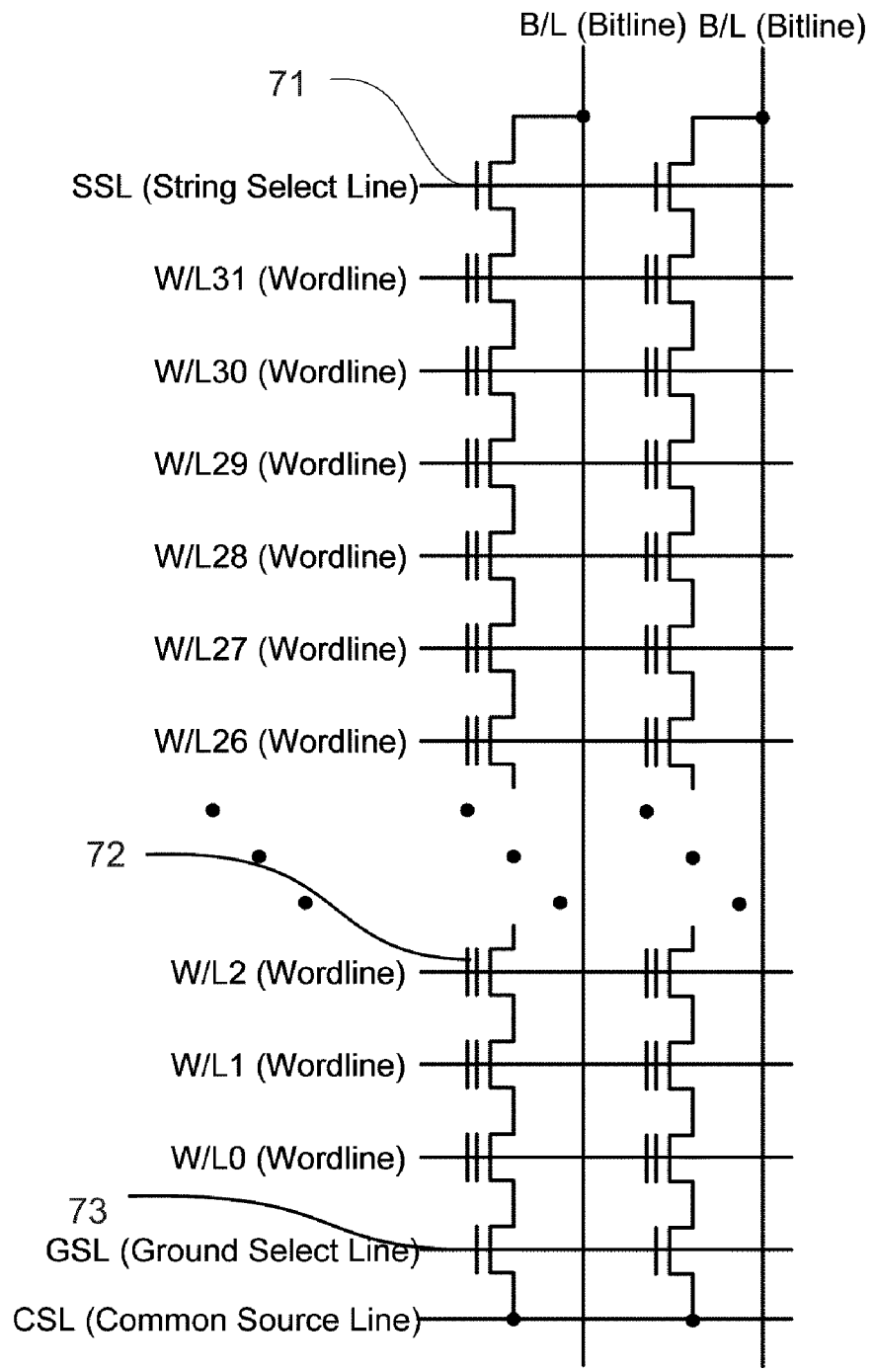
FIG. 7. NAND Cell String with 32 cells.
Figure 8:
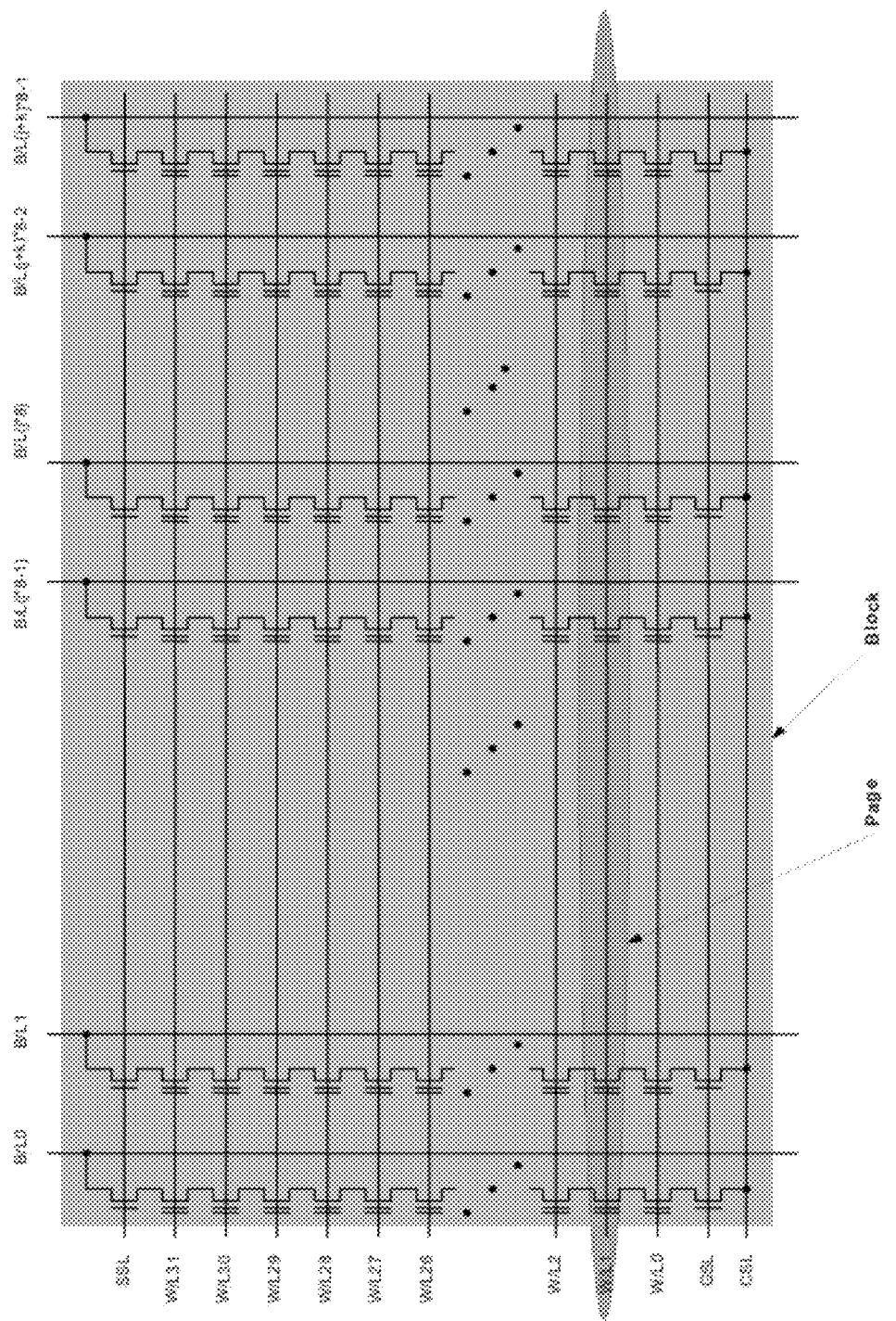
FIG. 8. Block and Page Definition in NAND Flash.
Figure 9:
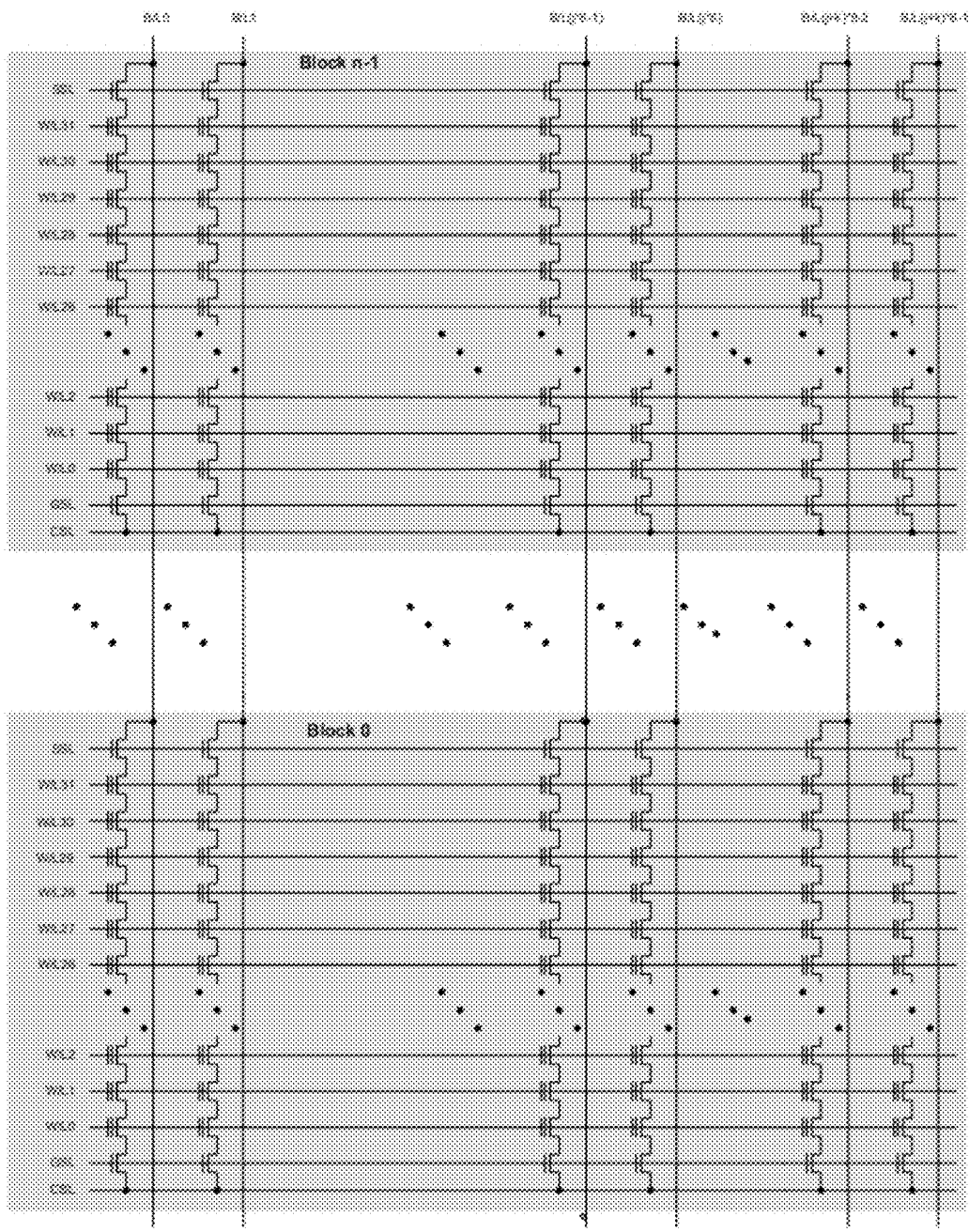
FIG. 9. Multiple Block in NAND Flash.
Figure 12:
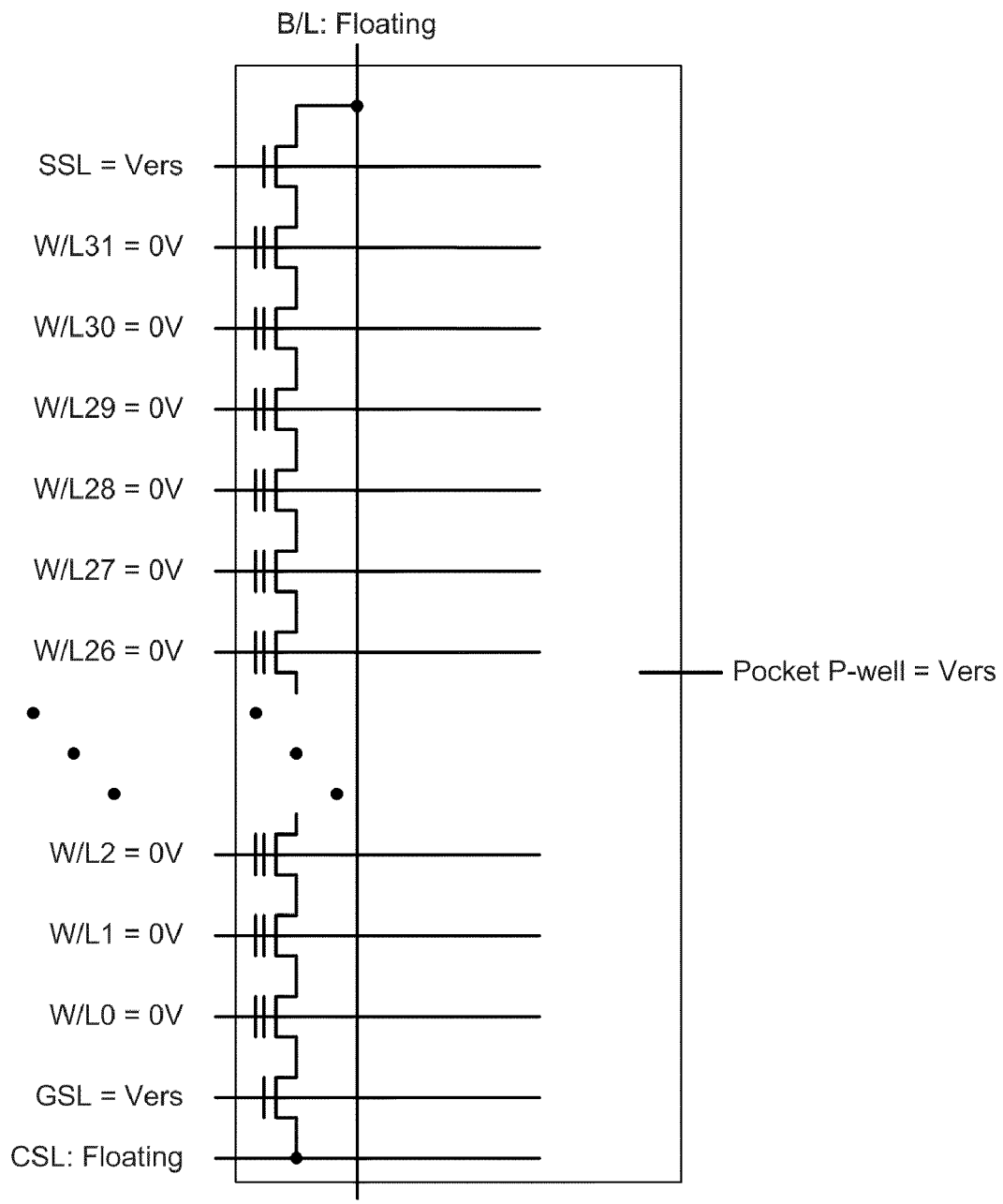
FIG. 12. Bias Conditions to Selected Block during Erase—Prior Art1.
Figure 13:
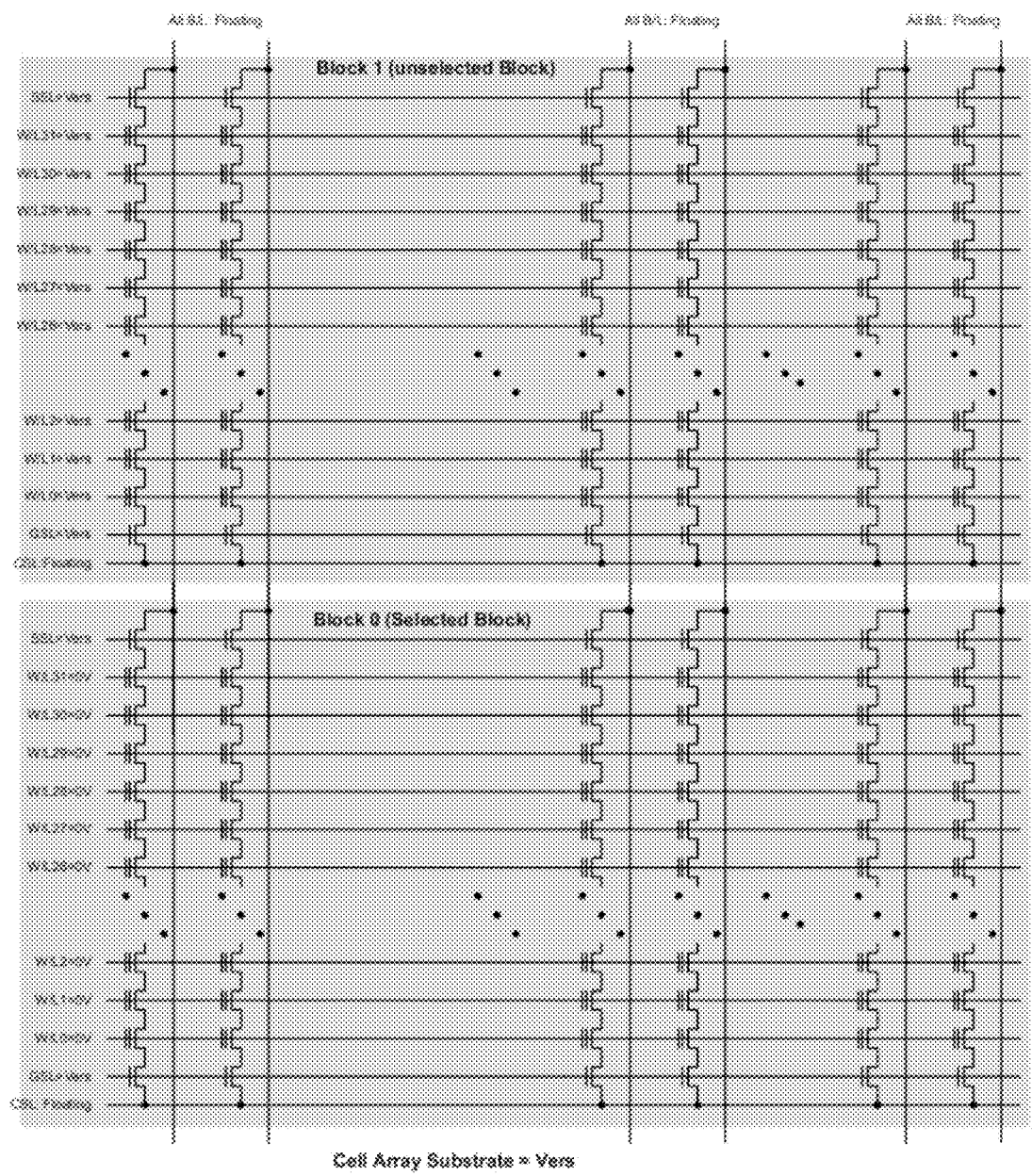
FIG. 13. Block Erase and Static Erase Inhibit Scheme—Prior Art 1.
Figure 14:
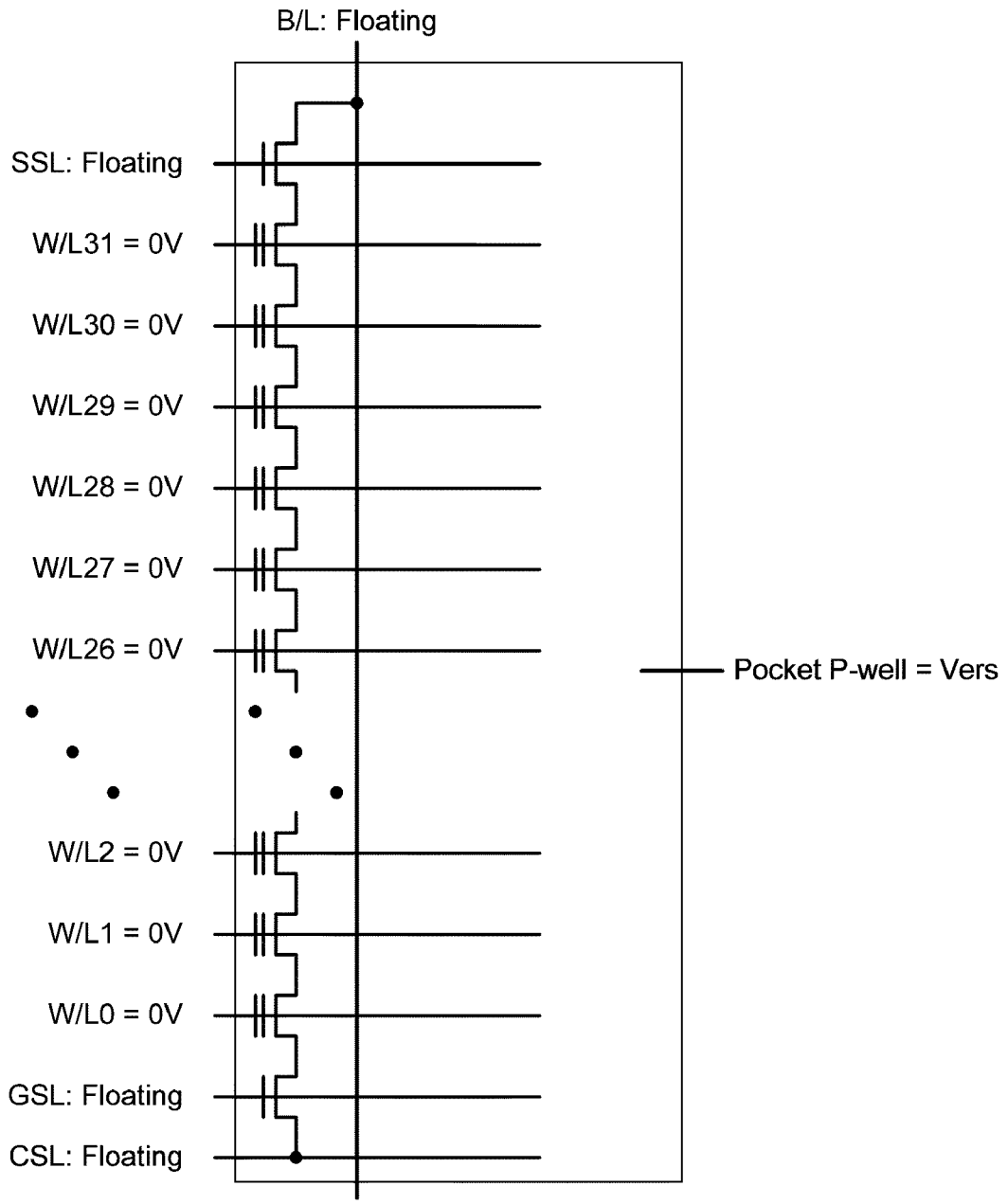
FIG. 14. Bias Conditions to Selected Block during Erase—Prior Art 2.
Figure 15:
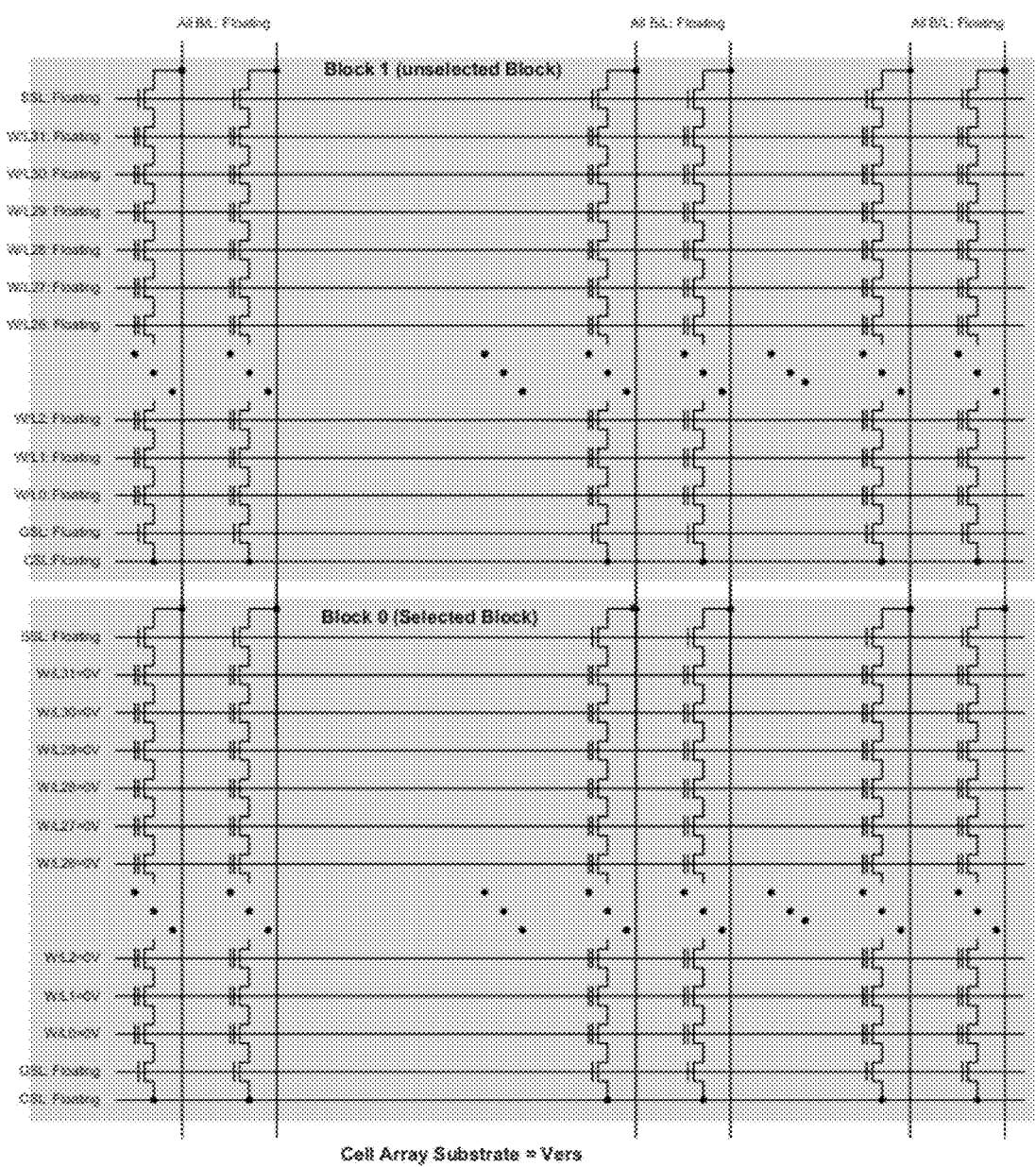
FIG. 15. Block Erase and Self-boosting Erase Inhibit Scheme—Prior Art 2.

As in the conventional Flash device of FIG. 9, the NAND cell array consists of n blocks and each block is subdivided into 32 (m) erasable and programmable pages (i.e. wordlines). There are (j+k)*8 bitline in the NAND cell array. Note that the number of block n, the number of page m and the number of (j+k)*8 can be varied.

Figure 34:
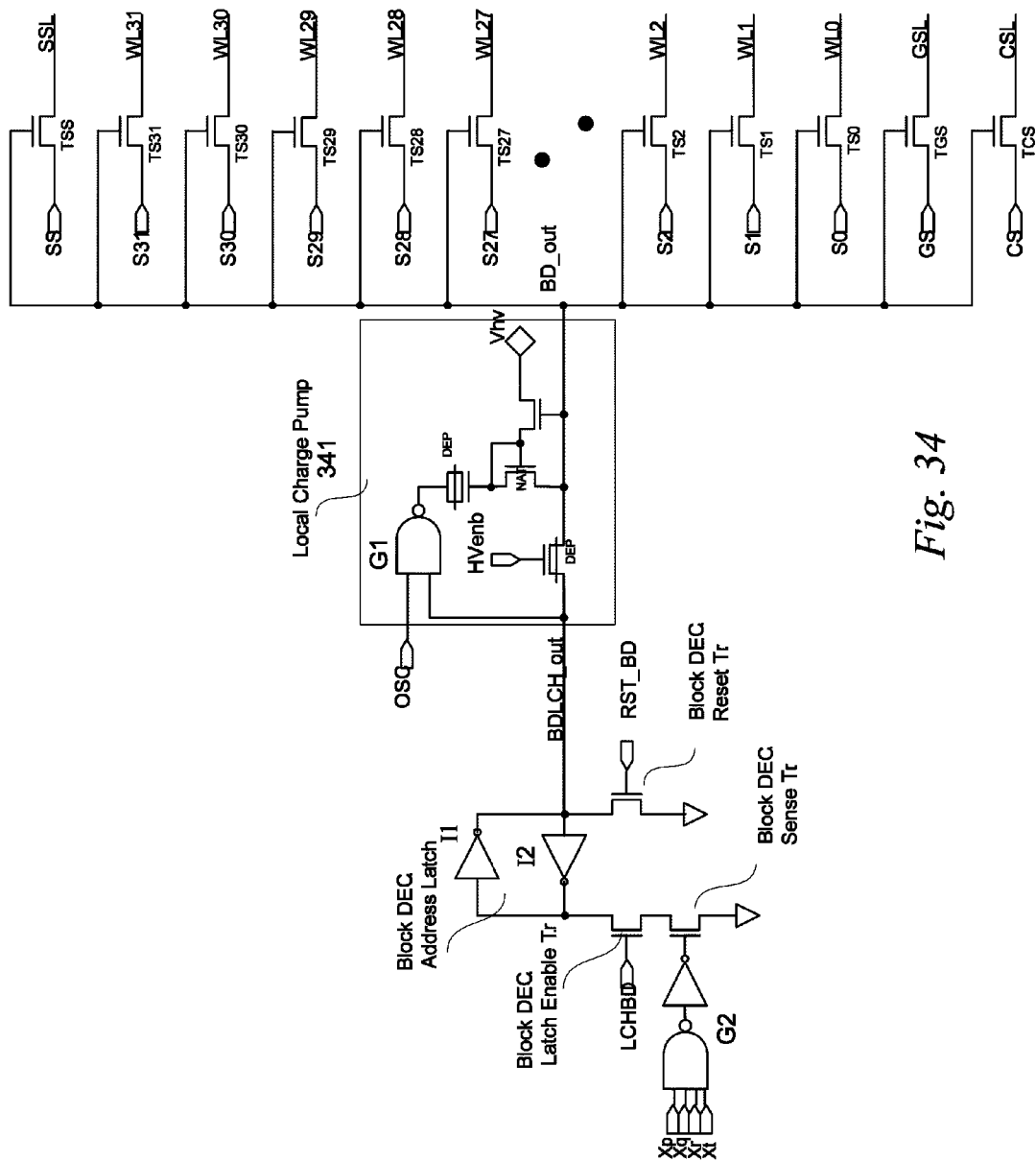
FIG. 34. Block Decoder Schematic for Page Erase Scheme 1.

FIG. 34 illustrates a circuit schematic of block decoder which is one of possible examples for this invention, especially for the page erase scheme 1. Note that there are many variations on circuit implementation for the block decoder. The total number of the block decoder is n.

The string select line SSL, wordlines WL0 to WL31 and the ground select line GSL are driven by common signals of SS, S0 to S31 and GS through pass transistors TSS, TS0 to TS31 and TGS which are commonly controlled by the output signal BD_out of the block decoder.

The local charge pump 341 is a high voltage switching circuit to provide program voltage Vpgm, pass voltage Vpass, read voltage Vread7, and erase voltage Vers. It consists of enhancement NMOS transistor (ENH), depletion NMOS transistor (DEP), native NMOS transistor (NAT) and a 2-input NAND gate G1. The output signal BD_out of the block decoder is raised to Vhv when the block decoder latch output BDLCH_out is Vdd, HVenb is 0V and the OSC is oscillated (note: the local charge pump is a well known circuit technique).

The BDLCH_out is reset to 0V when the RST_BD to the block decode reset transistor is high (actually short pulse) and latched when the LCHBD input to the block decode enable transistor is high (actually short pulse) with valid row predecoded address signals of Xp, Xq, Xr and Xt to NAND gate G2. BDLCH_out is latched by inverters I1 and I2.

Figure 35:
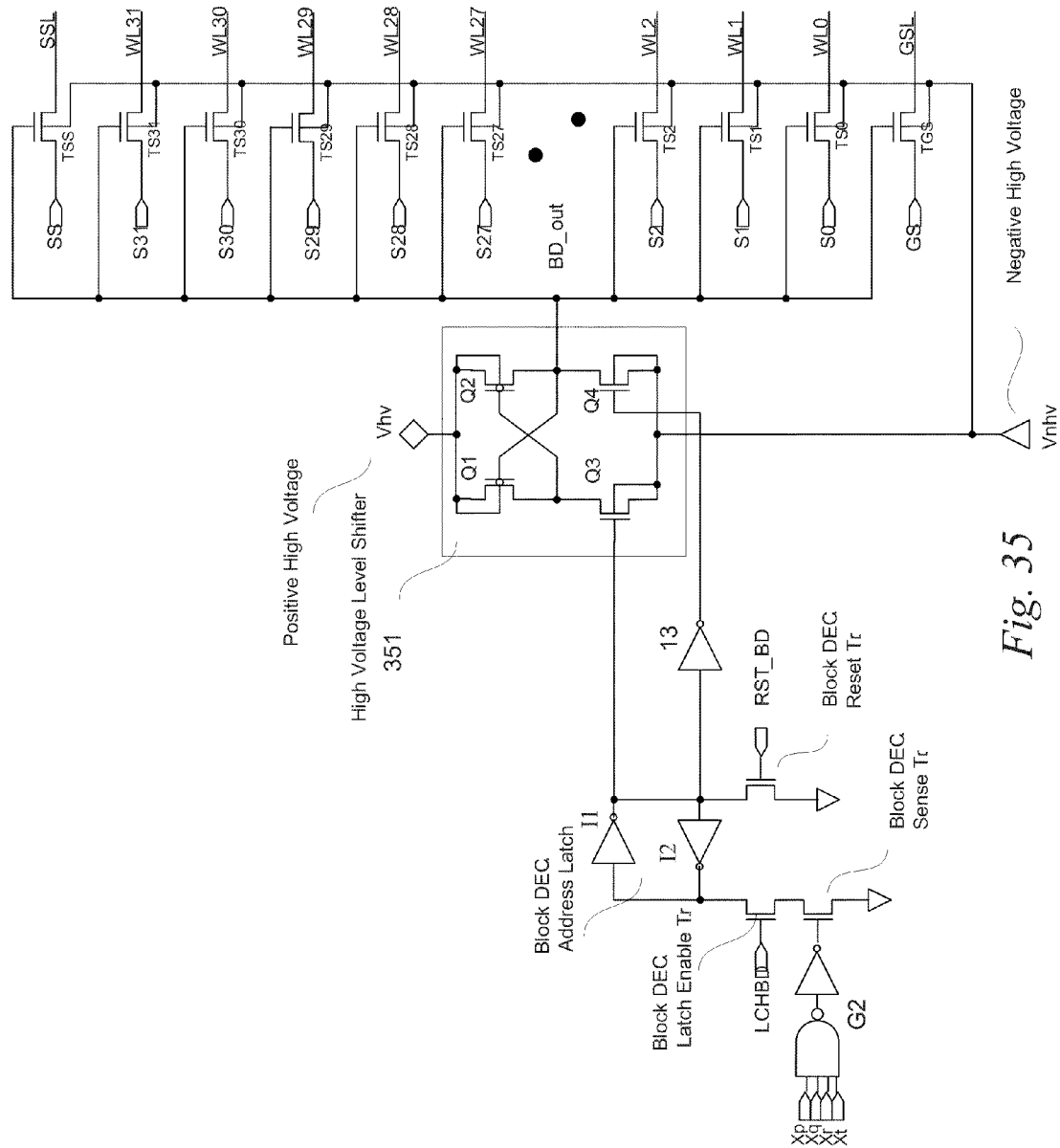
FIG. 35. Block Decoder Schematic for Page Erase Scheme 2A and 2B.

FIG. 35 illustrates a circuit schematic of block decoder for the page erase schemes 2A and 2B. Note that there are many variations on circuit implementation for the block decoder. The total number of the block decoders is n.

The string select line SSL, wordlines WL0 to WL31 and the ground select line GSL are driven by common signals of SS, S0 to S31 and GS through pass transistors TSS, TS0 to TS31 and TGS which are commonly controlled by the output signal BD_out of the block decoder. The substrate of pass transistors TSS, TS0 to TS31 and TGS are controlled by the negative high voltage Vnhv.

The high voltage level shifter 351 is a high voltage switching circuit to provide positive high voltage Vhv and negative high voltage Vnhv. The level shifter circuit includes cross-coupled p-channel transistors Q1 and Q2 and n-channel pull down devices Q3 and Q4. When the input to Q3 and I3 is high, BD_out is pulled high as Vhv is applied through Q1, and when low, Bd out is pulled low to Vnhv through Q4.

The BD_out is reset to 0V when the RST_BD is high (actually short pulse) and latched by inverters I1 and I2 when the LCHBD is high (actually short pulse) with valid row predecoded address signals of Xp, Xq, Xr and Xt to gate G2.

Table 7 shows an example of Vhv and Vnhv condition for various operating modes. All voltage numbers can be changed.

TABLE 7

Vhv and Vnhv Condition - Page Erase Scheme 2A and 2B

|  | VHV | VNHV |
|---|---|---|
| READ | ~7 V (VREAD7) | 0 V |
| PROGRAM | ~18 V | 0 V |
| PROGRAM VERIFY | ~7 V (VREAD7) | 0 V |
| ERASE | VDD | ~−18 V OR −13 V |
| ERASE VERIFY | ~7 V (VREAD7) | ~−1.5 V OR 0 V |

Figure 36:
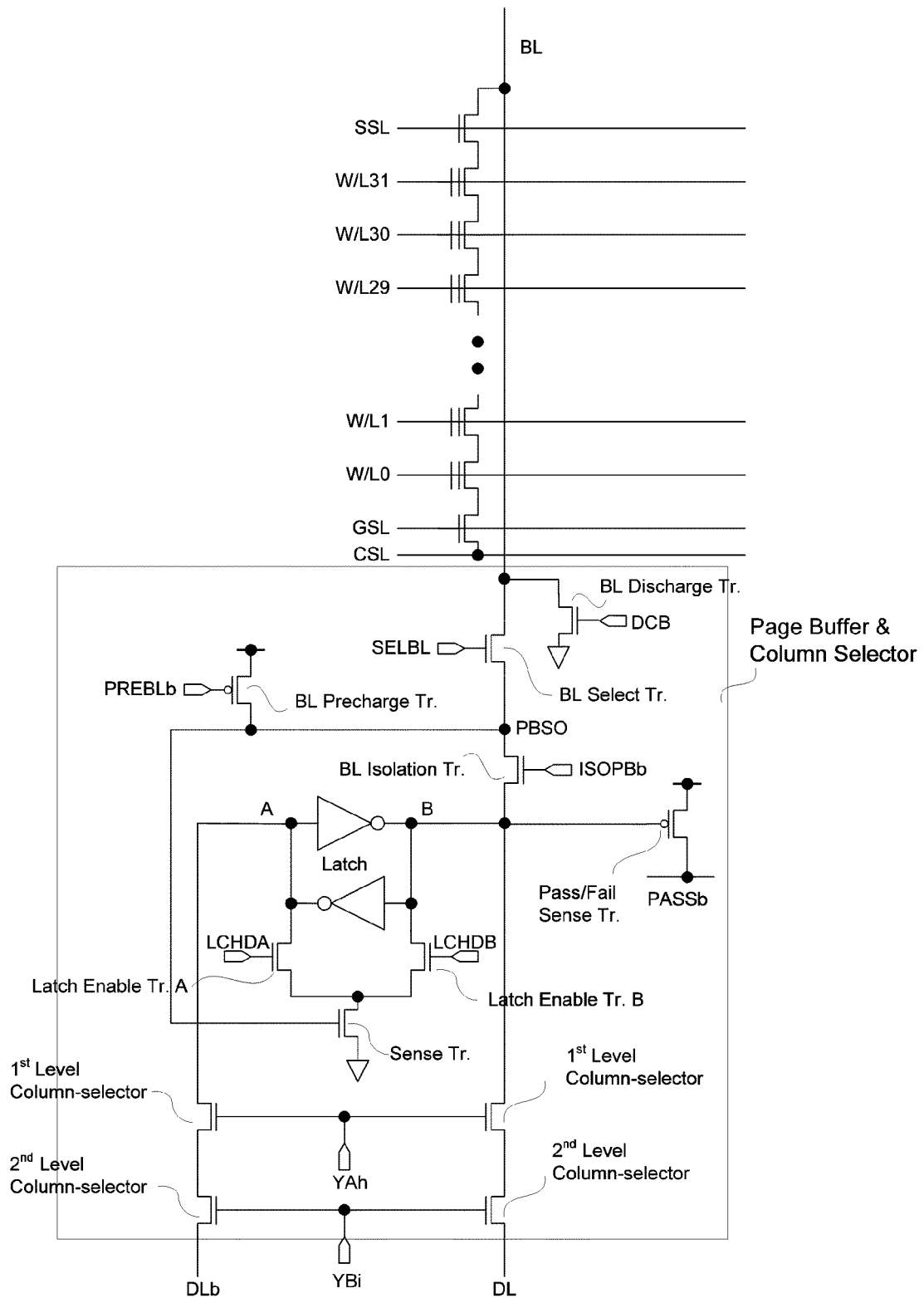
FIG. 36. Page Buffer and Column Selector—Example.

The page buffer and column selector circuit is the same as that in conventional NAND flash as shown in FIG. 36. Again the page buffer and column selector circuit shown in FIG. 36 is one of possible examples for this invention.

One page buffer corresponds to one bitline. However the page buffer can be shared by multiple bitlines as the array density increases (refer to reference June Lee et al., "A 90-nm CMOS 1.8-V 2-Gb NAND Flash Memory for Mass Storage Applications," IEEE J Solid-State Circuits, vol. 38, no. 11, pp. 1934-1942, November 2003, incorporated by reference in its entirety.)

The page buffer and column selector circuit of FIG. 36 is used in read, program verify and erase verify operations. In the erase verify operation, the latch is reset by LCHDA to latch node B high. The bitline BL is precharged to Vcc. If all selected memory cells are properly erased, the string of memory cells will conduct during the erase verify operation, thus pulling the bitline and node PBSO low. The bitline isolation transistor remains off. With PBSO less than about 0.5v, the sense transistor below the latch will not turn on, so node B remains high. The high voltage on the B node keeps the pass/fail p-channel sense transistor off. As a result, that sense transistor will not charge the initially grounded line PASSb. If all strings are properly erased, the line PASSb remains low and a "pass" is sensed from that line.

If, on the other hand, any string has not fully erased, the voltage on node PBSO will remain sufficiently high to turn on the sense transistors as LCHDB is asserted. As a result, node B is pulled low. With node B low on any of the page buffers in the selected block, a pass/fail sense transistor will turn on and raise PASSb to a high level. That high level is sensed to indicate a "fail".

In operation:
W/L0 to W/L31 are 32 wordlines within NAND cell string. SSL is string select line and GSL is ground select line. CSL is common source line and DL/DLb are differential datalines.

CSL is biased to 0V during read operation while CSL is biased to Vdd during program.

YAh and YBi are 1st level of column select signal and 2nd level of column select signal, respectively.

Bitline (BL) is discharged to 0V when the DCB is high.

PBSO is a sense node of the page buffer.

PREBLb is an enable signal for precharging bitline.

LCHDA and LCHDB are data latch control signals when the PBSO node has enough voltage differential after sensing bitline. In addition, the LCHDA and LCHDB control the polarity of sensed data in the page buffer (i.e. node A and node B). The node A and B on the page buffer during read and program verify are opposite to the node A and B during erase verify and read for copy when sensing the PBSO.

Latch in the page buffer is reset by either the LCHDA or LCHDB with the PBSO node of High (Vdd) by the bitline precharge transistor.

ISOPBb is a control signal to BL isolation transistor for isolating the page buffer from the bitline.

PASSb is a common sense node to detect program completion. When input data are successfully written to cells by internal program algorithm using program and program verify, the node B in all page buffers will be Vdd. Thus the PASSb will be 0V and sensed by a sense amplifier. Similarly the node B in all page buffers will be Vdd during erase verify if all strings in the selected block are successfully erased. During a read cycle, the PASSb is not used and the sense amplifier on the PASSb is disabled.

Erase Operation

Figure 37:
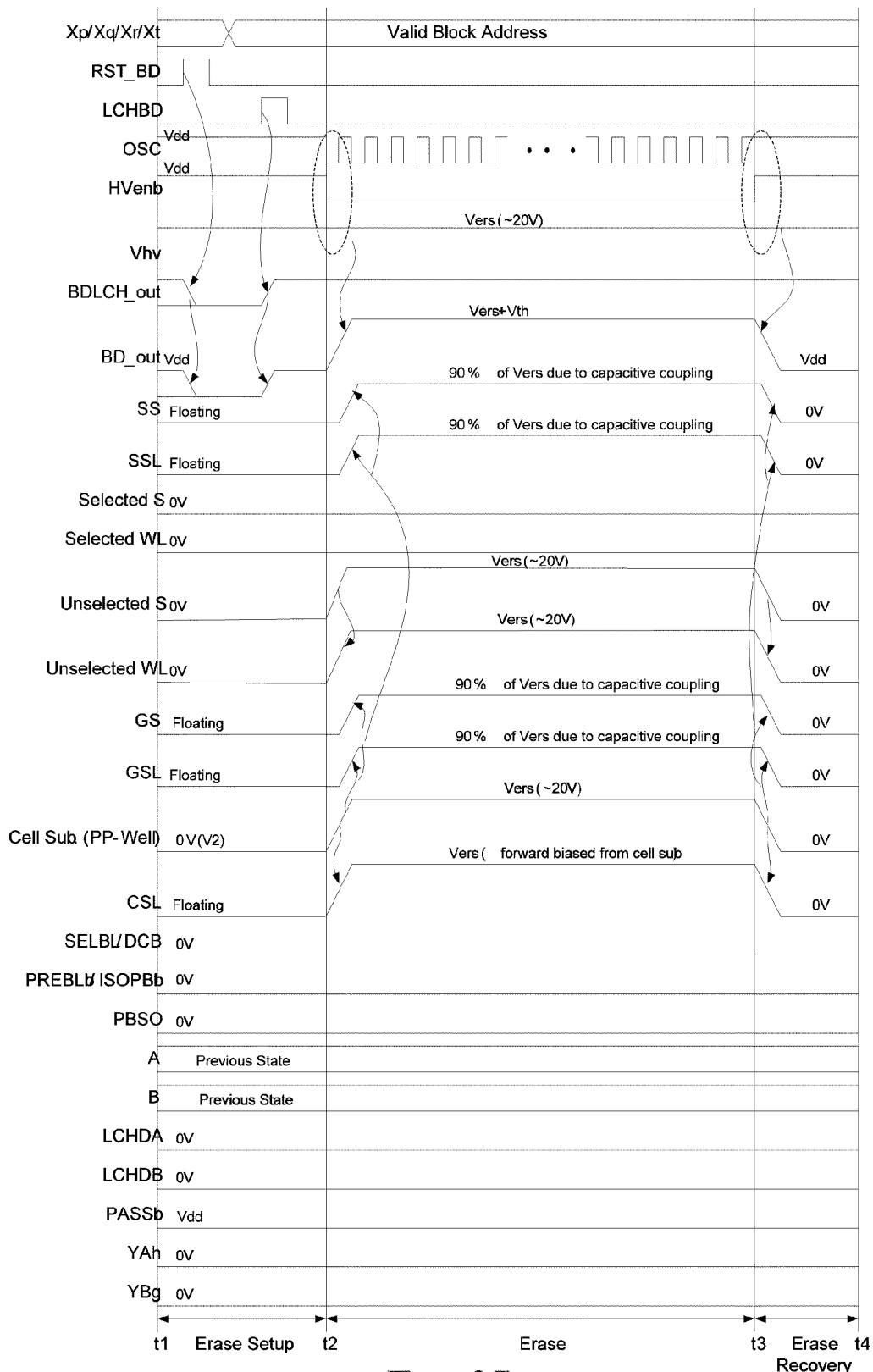
FIG. 37. Page Erase/Multiple Page Erase Timing—Page Erase Scheme 1.

FIG. 37 shows the core timing of page erase or multiple page erase with the page erase scheme 1

Basically the erase operation consists of three sub-periods as Erase Setup (from t1 to t2), Erase (t2 to t3) and Erase Recovery (from t3 to t4) shown in FIG. 37.

Erase Setup (t1 to t2):
The block decoder is reset by the RST_BD pulse and the BDLCH_out of the latch in the block decoder goes to 0V.

The latch enable signal LCHBD of the block decoder is pulsed once row predecoded signals Xp/Xq/Xr/Xt are valid.

The BDLCH_out of the latch is set to Vdd when row predecoded signals Xp/Xq/Xr/Xt are matched (Vhv is set to Vers during erase).

The output signal BD_out of the block decoder is raised to (Vers+Vth) by the local charge pump when HVneb is 0V and the OSC is oscillated.

The BD_out of unselected blocks are set to 0V. As a result, all wordlines, SSL, GSL, CSL in unselected blocks are floated.

Erase (t2 to t3):
During this period, the cell substrate (pocket p-well) is biased to Vers.

The selected wordline for single page erase is or selected wordlines for multiple page erase are biased to 0V while unselected wordlines are driven to Vers by common signals of S0 to S31 through pass transistors TS0 to TS31.

The string select line SSL, ground select line GSL and common source CSL are floated. The SSL and GSL in the selected block are boosted to nearly 90% of Vers by capacitive coupling between the substrate and SSL/GSL when the cell substrate goes to Vers. The CLS goes to Vers due to junction forward bias from the substrate (PP-well) to the source (n+).

During this period, all cells on the selected page(pages) is(are) erased. Erasure of memory cells in unselected wordlines in the selected block is prevented by 0 electric field (i.e. wordlines=Vers & cell substrate=Vers).

All pass transistors TS0 to TS31 in unselected blocks are turned off by the output BD_out of unselected block decoders. Hence all wordlines in unselected blocks are floated and boosted to nearly 90% by capacitive decoupling between the cell substrate and wordlines.

Erase Recovery (t3 to t4):
During this period, all high voltages on the cell substrate, unselected selected wordline, SSL, GSL, and CSL are discharged to the initial state (0V).

Figure 38:
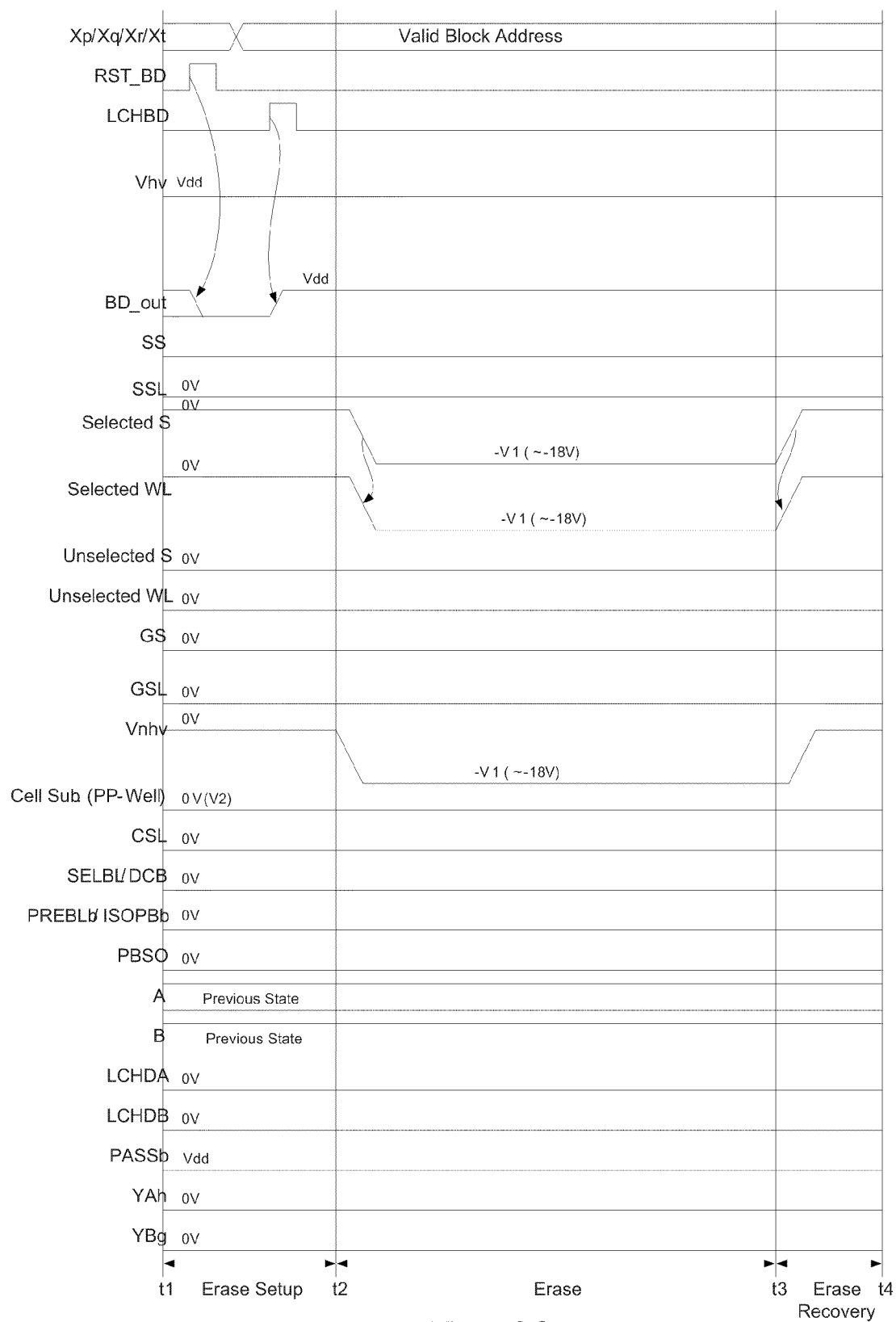
FIG. 38. Page Erase/Multiple Page Erase Timing—Page Erase Scheme 2A.

FIG. 38 shows the core timing of page erase or multiple page erase with the page erase scheme 2A.

Erase Setup (t1 to t2):
The block decoder is reset by the RST_BD pulse and the BD_out of the block decoder goes to 0V.

The latch enable signal LCHBD of the block decoder is pulsed once row predecoded signals Xp/Xq/Xr/Xt are valid.

The BD_out of the block decoder is set to Vdd when row predecoded signals Xp/Xq/Xr/Xt are matched (Vhv is set to Vdd during erase).

The BD_out of unselected blocks are set to Vnhv.

Erase (t2 to t3):

The substrate of pass transistors TS, TS0 to TS31 and TG are biased to −V1 (−18V) by Vnhv to pass the negative voltage −V1 (−18V).

During this period, selected wordline for single page erase or selected wordlines for multiple page erase are driven to −V1 (−18V) while unselected wordlines are biased to 0V by common signals of S0 to S31 through pass transistors TS0 to TS31.

The string select line SSL and ground select line GSL are biased to 0V.

The gate of pass transistors TS0 to TS31 in unselected blocks are biased to Vnhv during the erase setup period and the Vnhv goes to −V1 (−18) during this period. Therefore pass transistors TS0 to TS31 are turned off and all wordlines of unselected blocks are floated.

During this period, all cells on the selected page (or pages) are erased.

Erase Recovery (t3 to t4):

During this period, the negative voltage on the selected wordline and the substrate of pass transistors returns to the initial state (0V).

Figure 39:
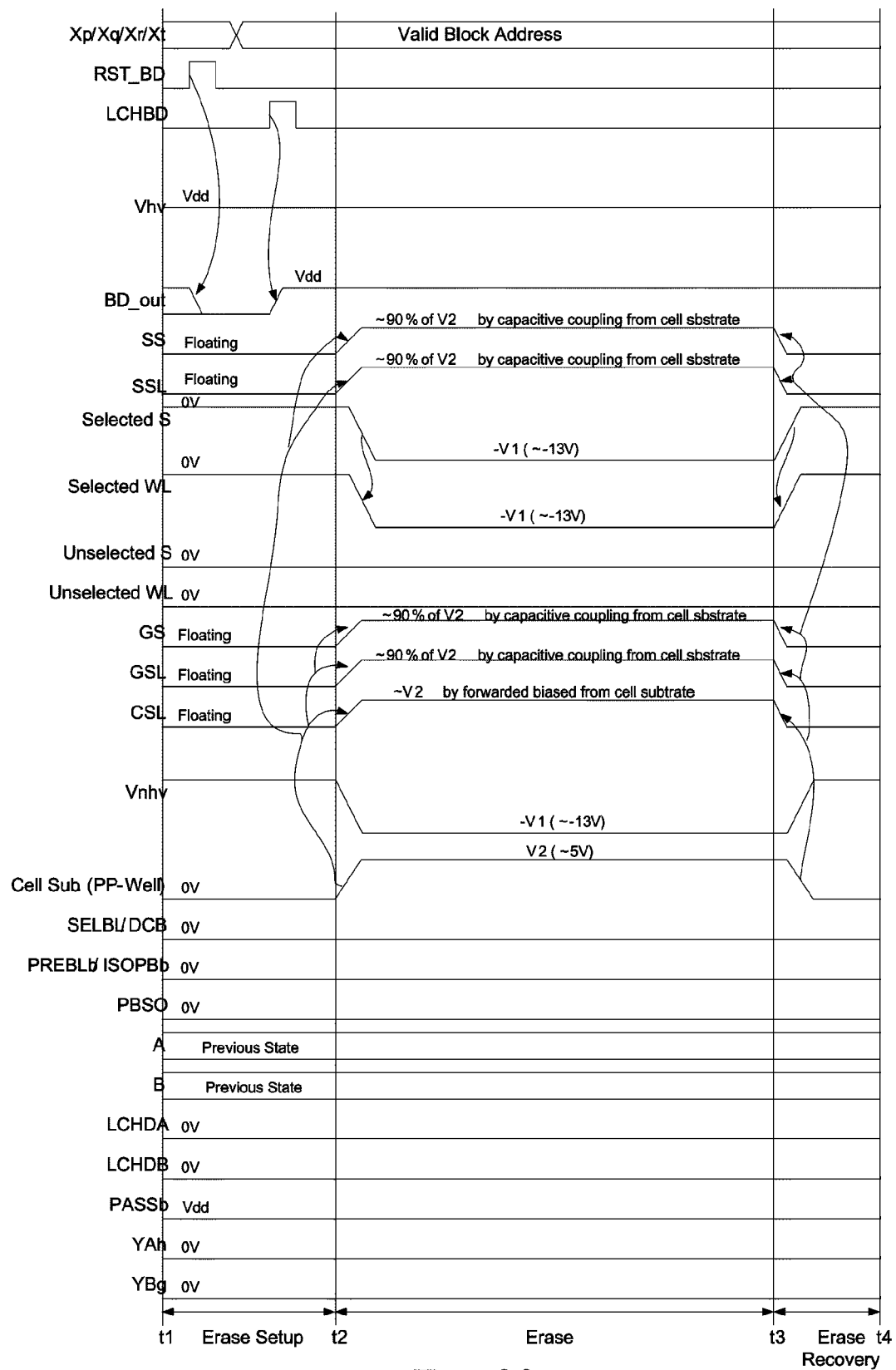
FIG. 39. Page Erase/Multiple Page Erase Timing—Page Erase Scheme 2B.

FIG. 39 shows the core timing of page erase or multiple page erase using the page erase scheme 2B with −V1 of −13V and V2 of 5V.

Erase Setup (t1 to t2):

The block decoder is reset by the RST_BD pulse and the BD_out of the block decoder goes to 0V.

The latch enable signal LCHBD of the block decoder is pulsed once row predecoded signals Xp/Xq/Xr/Xt are valid.

The BD_out of the block decoder is set to Vdd when row predecoded signals Xp/Xq/Xr/Xt are matched (Vhv is set to Vdd during erase).

The BD_out of unselected blocks are set to Vnhv.

Erase (t2 to t3):

The substrate of pass transistors TS, TS0 to TS31 and TG are biased to −V1 (−13V) by Vnhv to pass the negative voltage −V1 (−13V).

The substrate of the cell array is biased to V2 (5V).

During this period, selected wordline for single page erase or selected wordlines for multiple page erase are driven to −V1 (−13V) while unselected wordlines are biased to 0V by common signals of S0 to S31 through pass transistors TS0 to TS31.

The string select line SSL and ground select line GSL are floated and boosted to 90% of V2 (5V) due to capacitive coupling from the substrate of the cell array.

Common source line CSL and bitlines are V2 (5V) due to forwarded junction bias from the substrate of the cell array.

The gate of pass transistors TS0 to TS31 in unselected blocks are biased during the erase setup period and the Vnhv goes to −V1 (−13) during this period. Therefore pass transistors TS0 to TS31 are turned off and all wordlines of unselected blocks are floated.

During this period, all cells on the selected page (or pages) are erased.

Erase Recovery (t3 to t4):

During this period, the negative voltage on the selected wordline and the substrate of pass transistors returns to initial state (0V).

The voltage on the substrate of the cell array, SSL, GSL, CSL returns to the initial state (0V).

The core timing of block erase using the page erase scheme 1 is the same as that of the prior art U.S. Pat. No. 5,472,563, incorporated herein by reference in its entirety.

Figure 40:
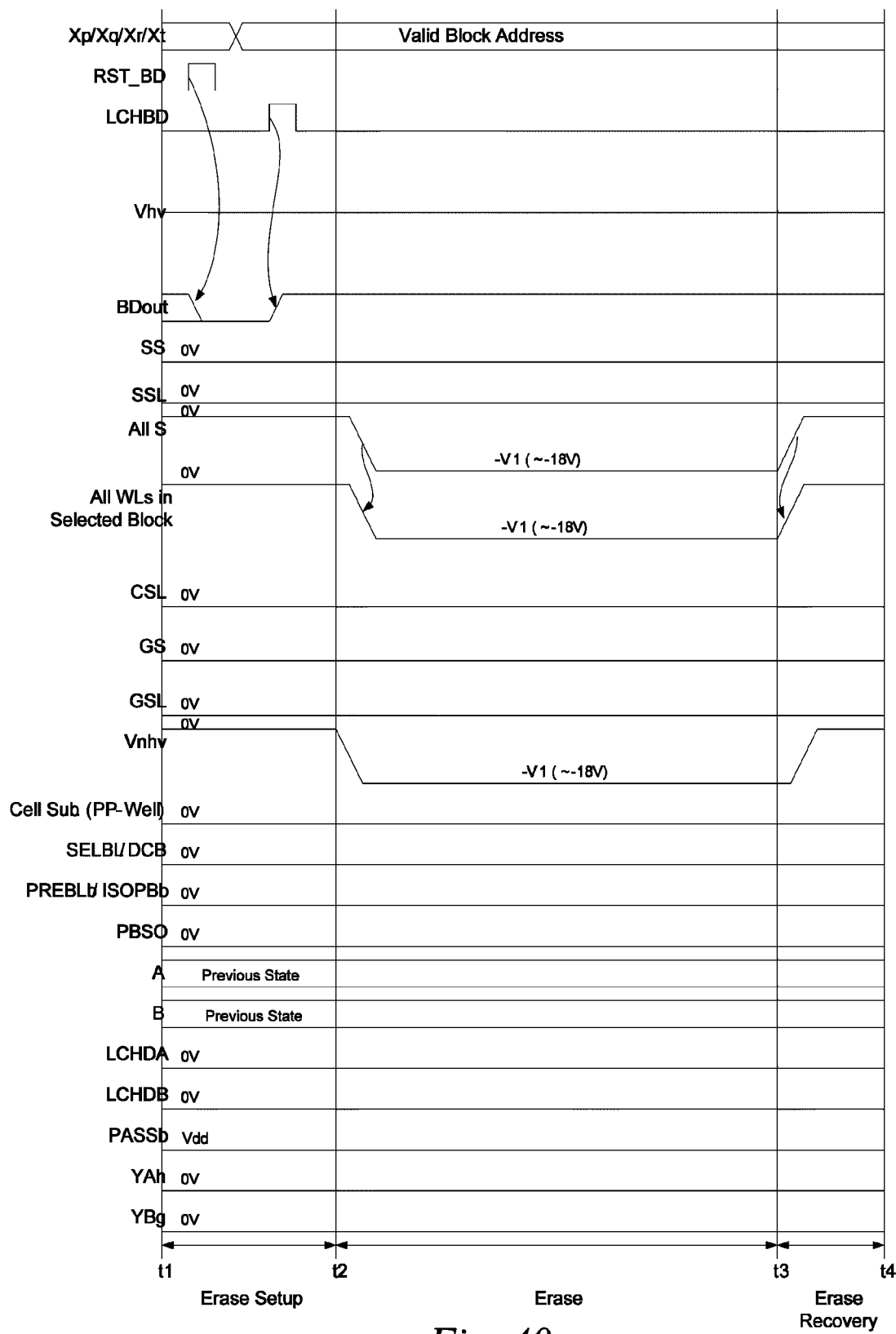
FIG. 40. Block Erase Timing—Page Erase Scheme 2A.

FIG. 40 shows the core timing of block erase using the page erase scheme 2A with −V1 of −18V and V2 of 0V.

Erase Setup (t1 to t2):

The block decoder is reset by the RST_BD pulse and the BD_out of the block decoder goes to 0V.

The latch enable signal LCHBD of the block decoder is pulsed once row predecoded signals Xp/Xq/Xr/Xt are valid.

The BD_out of the block decoder is set to Vdd when row predecoded signals Xp/Xq/Xr/Xt are matched (Vhv is set to Vdd during erase).

The BD_out of unselected blocks are set to Vnhv.

Erase (t2 to t3):

The substrate of pass transistors TS, TS0 to TS31 and TG are biased to −V1 (−18V) by Vnhv to pass the negative voltage −V1 (−18V).

During this period, all wordline in the selected block are driven to −V1 (−18V) by common signals of S0 to S31 through pass transistors TS0 to TS13.

The string select line SSL and ground select line GSL are biased to 0V.

The gate of pass transistors TS0 to TS31 in unselected blocks are biased during the erase setup period and the Vnhv goes to −V1 (−18) during this period. Therefore pass transistors TS0 to TS31 are turned off and all wordlines of unselected blocks are floated.

During this period, all cells in the selected block are erased.

Erase Recovery (t3 to t4):

During this period, the negative voltage on all wordlines of the selected block and the substrate of pass transistors returns to the initial state (0V).

Figure 41:
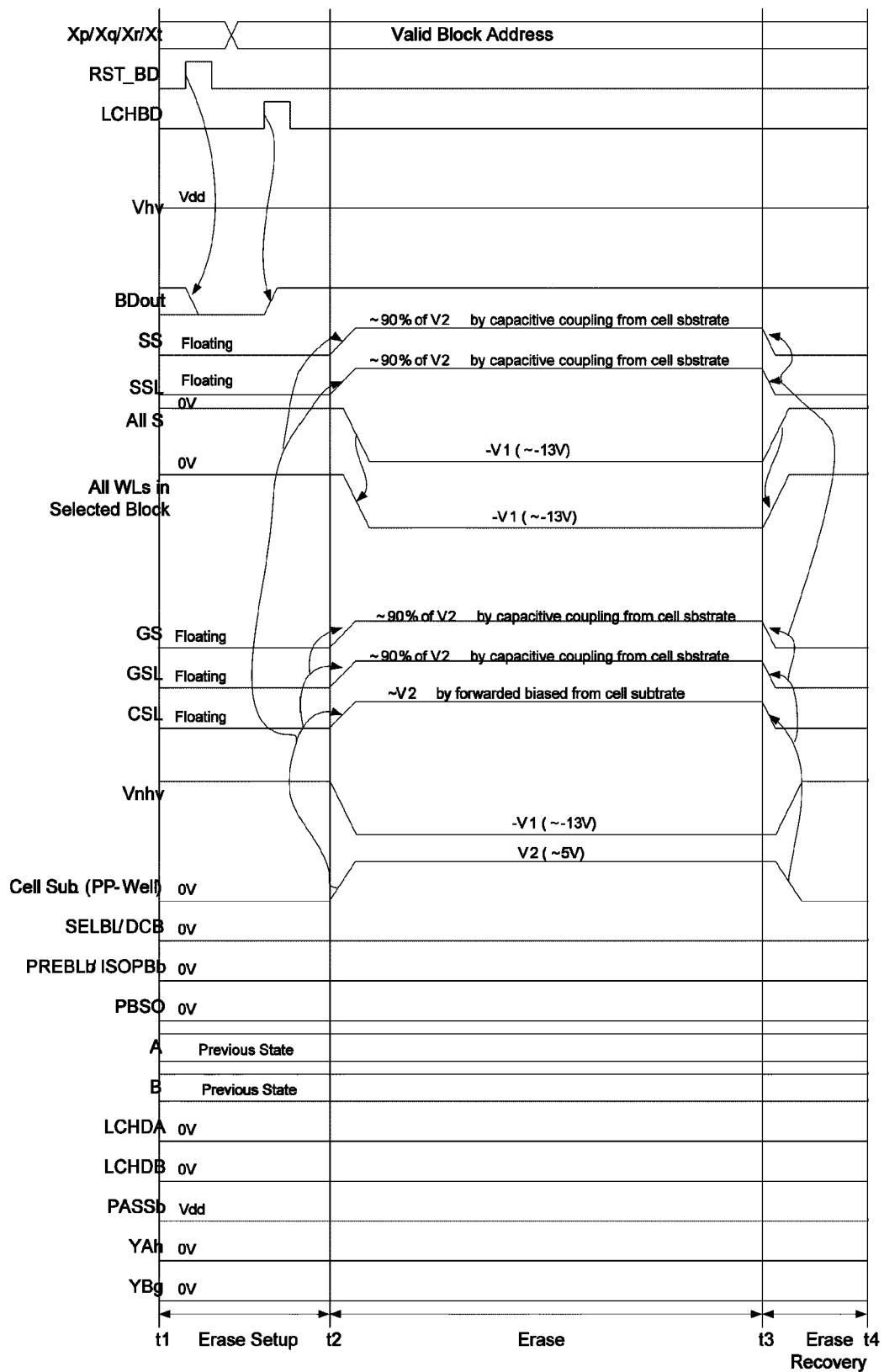
FIG. 41. Block Erase Timing—Page Erase Scheme 2B.

FIG. 41 shows the core timing of block erase using the page erase scheme 2B with −V1 of −13V and V2 of 5V.

Erase Setup (t1 to t2):

The block decoder is reset by the RST_BD pulse and the BD_out of the block decoder is goes to 0V.

The latch enable signal LCHBD of the block decoder is pulsed once row predecoded signals Xp/Xq/Xr/Xt are valid.

The BD_out of the block decoder is set to Vdd when row predecoded signals Xp/Xq/Xr/Xt are matched (Vhv is set to Vdd during erase).

The BD_out of unselected blocks are set to Vnhv.

Erase (t2 to t3):

The substrate of pass transistors TS, TS0 to TS31 and TG are biased to −V1 (−13V) by Vwpt to pass the negative voltage −V1 (−13V).

The substrate of the cell array is biased to V2 (5V).

During this period, all wordlines in the selected block are driven to −V1 (−13V) by common signals of S0 to S31 through pass transistors TS0 to TS13.

The string select line SSL and ground select line GSL are floated and boosted to 90% of V2 (5V) due to capacitive coupling from the substrate of the cell array.

Common source line CSL is V2 (5V) due to junction forwarded bias from the substrate of the cell array.

The gate of pass transistors TS0 to TS31 in unselected blocks are biased during the erase setup period and the Vnhv goes to −V1 (−13) during this period. Therefore pass transistors TS0 to TS31 are turned off and all wordlines of unselected blocks are floated.

During this period, all cells in the selected block are erased.

Erase Recovery (t3 to t4):

During this period, the negative voltage on all wordlines of the selected block and the substrate of pass transistors returns to the initial state (0V).

The voltage on the substrate of the cell array, SSL, GSL, CSL returns to the initial state (0V).

Erase Verify Operation

Erase verify operation consists of five sub-periods as Erase Verify Setup (from t1 to t2), BL Precharge (t2 to t3), BL Sense (from t3 to t4), Data Latch (from t4 to t5) and Erase Verify Recovery (from t5 to t6) shown in FIG. 42, FIG. 43, FIG. 44 and FIG. 45.

Figure 42:
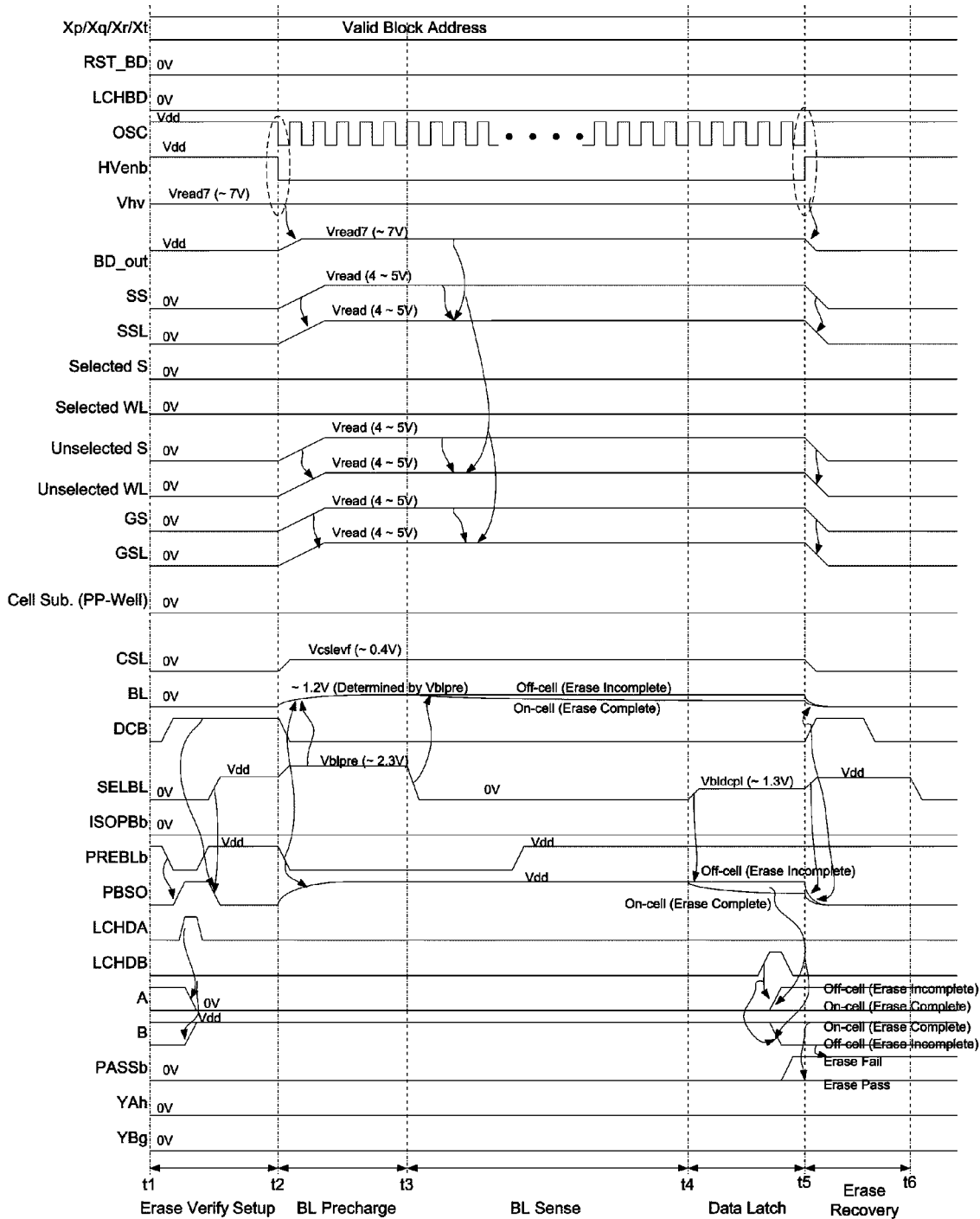
FIG. 42. Page Erase Verify Timing for Page Erase Scheme 1 with Source Bias.

FIG. 42 shows the core timing of page erase verify for the page erase scheme 1. The voltage level of voltage sources described in here is possible example and can be varied.

Page Erase Verify Setup (t1 to t2):

The BD_out of the block decoder is set to Vdd in previous erase operation (Vhv is set to Vdd during erase verify).

The BD_out of unselected blocks are set to 0V in previous erase operation.

Discharge bitlines to ground by DCB pulse.

Latch in the page buffer is reset by LCHDA pulse with PREBLb pulse. During this short pulse period, the PBSO node is Vdd by BL precharge transistor. The node A and B are reset to 0V and Vdd, respectively.

The PBSO node is discharged to 0V by SELBL after resetting the latch.

BL Precharge (t2 to t3):

The BD_out of the block decoder goes to Vread7 (~7V) by the local charge pump when HVneb is 0V and the OSC is oscillated. Thus the gate of pass transistors TSS, TS0 to TS31 and TGS in the selected block is raised to Vread7 (~7V).

SSL, unselected wordline and GSL are charged to Vread (4~5V) by SS, unselected S and GS.

The selected wordline is biased to 0V by the selected S while the CSL of the selected block is biased to Vcslevf (~0.4V) to verify erased cell having negative cell Vth of the selected page (i.e. source bias sensing scheme for cells having negative cell Vth).

Bitlines are precharged to a predetermined precharge level (~1.3V) when PREBLb goes to 'Low'. The SELBL goes to Vblpre (~2.3V) which determines the bitline precharge level using the BL select transistor.

BL Sense (t3 to t4):

Bitlines are disconnected from the page buffer by disabling BL select transistor (SELBL=0V) and the BL precharge transistor is turned off.

The level of precharged bitlines is developed based on cell state. Each bitline maintains the precharged voltage level if the cell is incompletely erased because the cell is still off-cell and can not discharge the precharged bitline voltage. If the cell is completely erased, on the contrary, the cell is on-cell and discharges the precharged bitline during this period.

Data Latch (t4 to t5):

During this period, the SELBL is biased to Vbldcpl (~1.3V), which allows a capacitive decoupling between the bitline and the PBSO.

With capacitive decoupling sensing scheme, the voltage on the PBSO node corresponding to the bitline of the erased cell (on-cell) is dropped rapidly by charge sharing between the bitline and the sense node PBSO having relatively very small parasitic capacitance compared to the selected bitline.

Once the bitline develops enough voltage level by capacitive decoupling operation between the bitline and the PBSO node, the data latching operation performs by enabling the LCHDB signal.

The voltage of Vdd at the PBSO node due to incompletely erased cells on the NAND string turns on the sense transistor in the page buffer. As a result, the node A is flipped to 0V from Vdd (node B is flipped to Vdd from 0V) as soon as LCHDB is applied.

The low voltage (0.3~0.4V) at the PBSO node due to erased cells (on-cell) on the NAND string does not affect the page buffer data. Thus the page buffer holds initial state (i.e. node A is Vdd & node B is 0V).

If the selected cell on the NAND string is successfully erased, the node A and the node B are 0V and Vdd, respectively after BL sense and latch operation during erase verify.

If the selected cell on the NAND string is incompletely erased, the node A and the node B are Vdd and 0V, respectively after BL sense and latch operation during erase verify.

Page Erase Verify Recovery (t5 to t6):

During this period, all bitlines are discharged by the DCB while all latches in page buffers hold the sensed data.

SSL, unselected wordlines, GSL and CSL are discharged to 0V during this period. The selected wordline and the substrate of pass transistors TSS, TS0 to TS31 and TGS also return to 0V from erase verify voltage Versvf.

If all cells on the selected wordline (page) are successfully erased, the node A and the node B of the latch in all page buffers are set to 0V and Vdd, respectively. Thus all pull-up PMOS transistors (Pass/Fail Sense transistors) on PASSb are disabled since the gate of each PMOS transistor is connected to the node B of the latch. Finally the PASSb can be sensed by a sense amp in a detection circuitry for generating erase pass/fail flag. The sense amplifier for sensing the PASSb is not described; however, it can be implemented by well known, simple sense amplifier.

For the multiple page erase verify, selected pages are verified sequentially (i.e. erase verify in a page basis).

Figure 43:
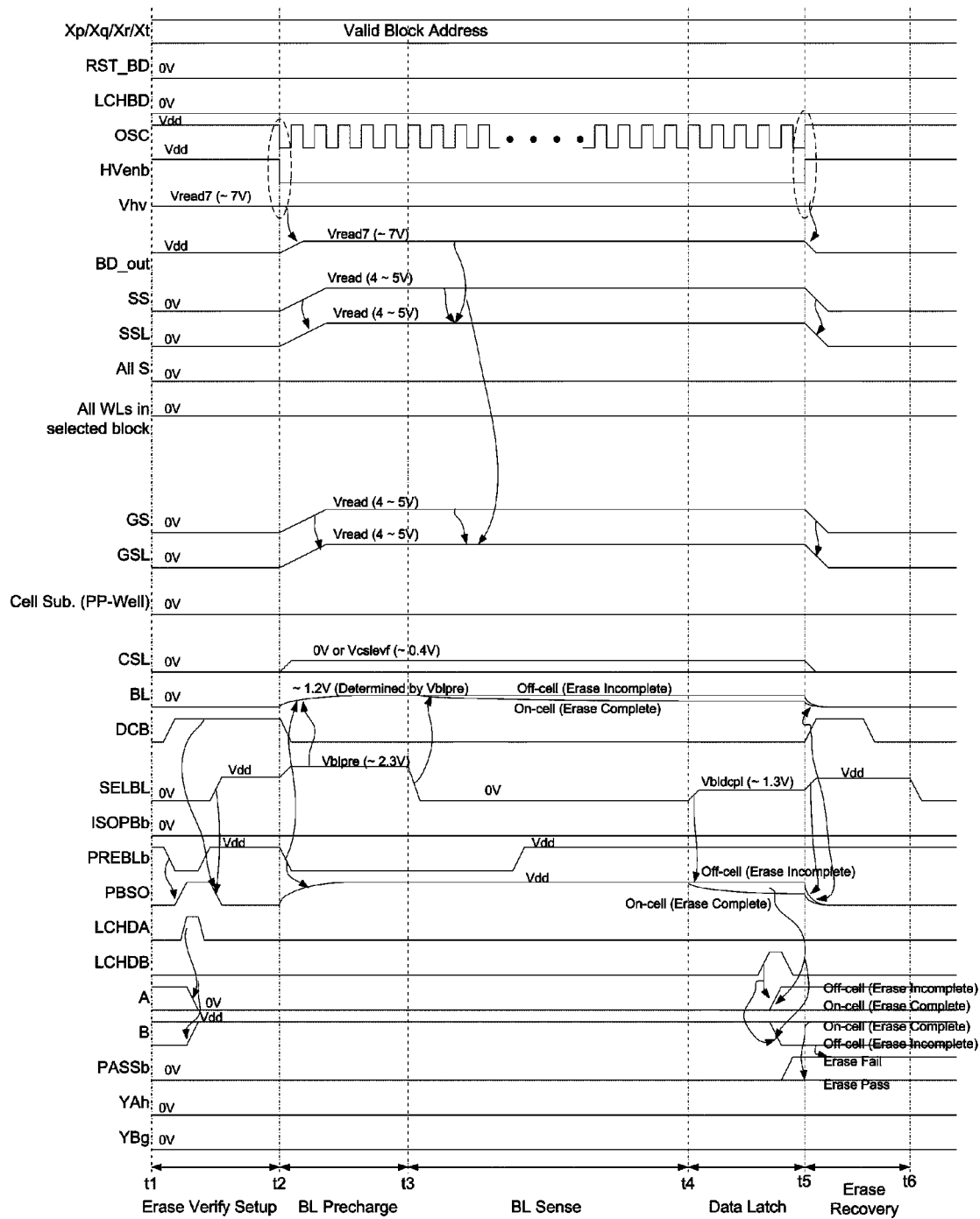
FIG. 43. Block Erase Verify Timing for Page Erase Scheme 1.

FIG. 43 shows the core timing of block erase verify with the page erase scheme 1. The core signal timing the block erase verify is basically the same as that of the page erase verify. However differences are:

All cells of the selected block (i.e. NAND cell string) are verified simultaneously as shown in FIG. 43.

All wordlines of the selected block are biased to 0V without source bias (i.e. CSL=0V) or with source bias (i.e. CSL=Vcslevf).

Figure 44:
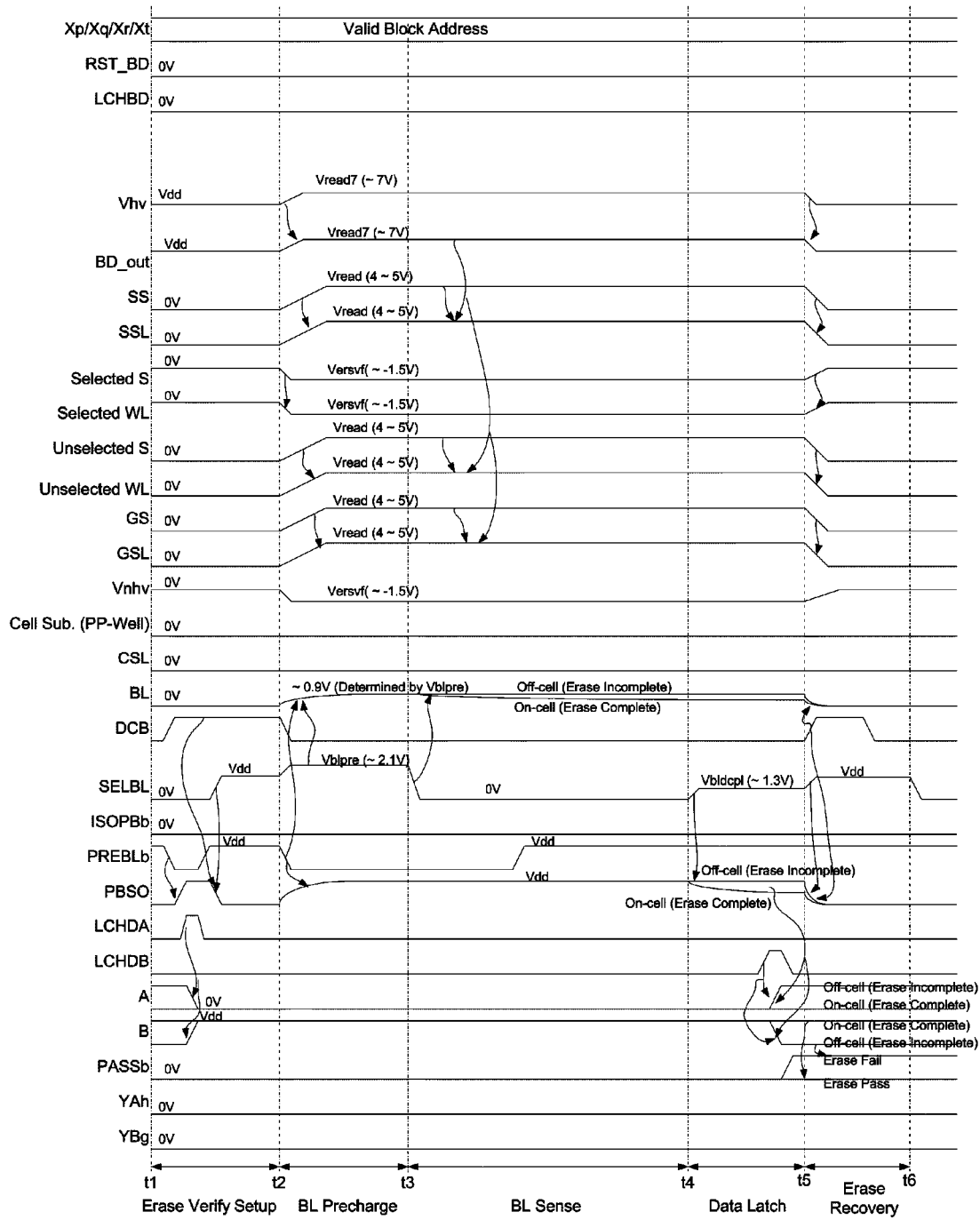
FIG. 44. Page Erase Verify Timing for Page Erase Scheme 2A and 2B.

FIG. 44 shows the core timing of page erase verify for the page erase scheme 2A and 2B. The voltage level of voltage sources described in here is possible example and can be varied.

Page Erase Verify Setup (t1 to t2):

The BD_out of the block decoder is set to Vdd in previous erase operation (Vhv is set to Vdd during erase verify).

The BD_out of unselected blocks are set to Vnhv in previous erase operation.

Discharge bitlines to ground by DCB pulse.

Latch in the page buffer is reset by LCHDA pulse with PREBLb pulse. During this short pulse period, the PBSO node is Vdd by BL precharge transistor. The node A and B are reset to 0V and Vdd, respectively.

The PBSO node is discharged to 0V by SELBL after resetting the latch.

BL Precharge (t2 to t3):

During this period, Vhv goes to Vread7 (~7V) while Vnhv goes to Versvf (~−1.5V). Thus the gate of pass transistors TSS, TS0 to TS31 and TGS in the selected block is raised to Vread7 (~7V). Also the substrate of pass transistors is biased to Versvf (~−1.5V) by Vnhv.

SSL, unselected wordline and GSL are charged to Vread (4~5V) by SS, unselected S and GS.

The selected wordline is biased to erase verify voltage Versvf (~−1.5V) by the selected S.

Bitlines are precharged to a predetermined precharge level when PREBLb goes to 'Low'. The SELBL goes to Vblpre (~2.1V) which determines the bitline precharge level using the BL select transistor.

BL Sense (t3 to t4):

Bitlines are disconnected from the page buffer by disabling BL select transistor (SELBL=0V) and the BL precharge transistor is turned off.

The level of precharged bitlines is developed based on cell state. Each bitline maintains the precharged voltage level if the cell is incompletely erased because the cell is still off-cell and can not discharge the precharged bitline voltage. If the cell is completely erased, on the contrary, the cell is on-cell and discharges the precharged bitline during this period.

Data Latch (t4 to t5):

During this period, the SELBL is biased to Vbldcpl (~1.3V), which allows a capacitive decoupling between the bitline and the PBSO.

With capacitive decoupling sensing scheme, the voltage on the PBSO node corresponding to the bitline of the erased cell (on-cell) is dropped rapidly by charge sharing between the bitline and the sense node PBSO having relatively very small parasitic capacitance compared to the selected bitline.

Once the bitline develops enough voltage level by capacitive decoupling operation between the bitline and the PBSO node, the data latching operation performs by enabling the LCHDB signal.

The voltage of Vdd at the PBSO node due to incompletely erased cells on the NAND string turns on the sense transistor in the page buffer. As a result, the node A is flipped to 0V from Vdd (node B is flipped to Vdd from 0V) as soon as LCHDB is applied.

The low voltage (0.3~0.4V) at the PBSO node due to erased cells (on-cell) on the NAND string does not affect the page buffer data. Thus the page buffer holds initial state (i.e. node A is Vdd & node B is 0V).

If the selected cell on the NAND string is successfully erased, the node A and the node B are 0V and Vdd, respectively after BL sense and latch operation during erase verify.

If the selected cell on the NAND string is incompletely erased, the node A and the node B are Vdd and 0V, respectively after BL sense and latch operation during erase verify.

Page Erase Verify Recovery (t5 to t6):

During this period, all bitlines are discharged by the DCB while all latches in page buffers hold the sensed data.

SSL, unselected wordlines and GSL are discharged to 0V during this period.

The selected wordline and the substrate of pass transistors TSS, TS0 to TS31 and TGS also return to 0V from erase verify voltage Versvf.

If all cells on the selected wordline (page) are successfully erased, the node A and the node B of the latch in all page buffers are set to 0V and Vdd, respectively. Thus all pull-up PMOS transistors (Pass/Fail Sense transistors) on PASSb are disabled since the gate of each PMOS transistor is connected to the node B of the latch. Finally the PASSb can be sensed by a sense amp in a detection circuitry for generating erase pass/fail flag. The sense amplifier for sensing the PASSb is not described, however it can be implemented by well known, simple sense amplifier.

For the multiple page erase verify, selected pages are verified sequentially (i.e. erase verify in a page basis).

Figure 45:
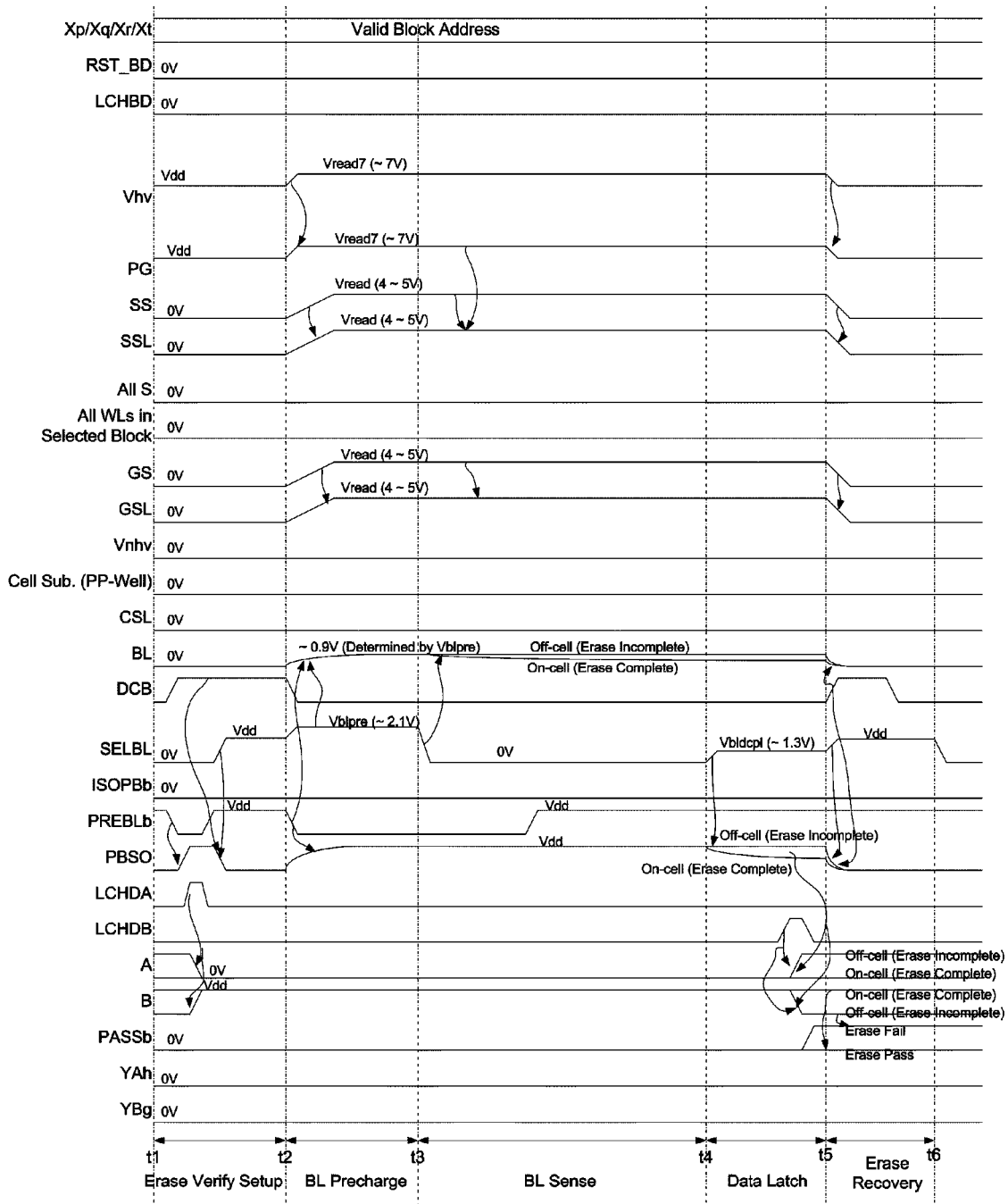
FIG. 45. Block Erase Verify Timing for Page Erase Scheme 2A and 2B.

FIG. 45 shows the core timing of block erase verify. The core signal timing the block erase verify is basically the same as that of the page erase verify. However differences are:

Entire cells of the selected block (i.e. NAND cell string) are verified simultaneously as shown in FIG. 45.

Erase verify voltage Vbersvf can be 0V or negative voltage to ensure a proper margin of the threshold voltage on erased cells.

If Erase verify voltage Vbersvf is negative voltage, the substrate of pass transistors TSS, TS0 to TS31 and TGS will be biased to Vbersvf by Vnhv, which is similar to the condition of the page erase verify.

Page Erase Scheme 3

Table 8 and FIGS. 46 and 47 show bias conditions during page erase according to a page erase scheme 3. With the page erase scheme 3, unselected wordlines are boosted to nearly erase voltage Vers ($\alpha$ % of Vers when the substrate of the cell array goes to Vers, $\alpha$=coupling ratio between the substrate and wordlines) for preventing the unselected page(s) from being erased while the selected wordline(s) is(are) biased to another voltage for erasing the selected page(s), for example, 0V.

As shown in FIGS. 46 and 47, within the selected block

Selected wordline(s) in the selected block is(are) biased to 0V for erase.

Unselected wordline(s) in the selected block is(are) precharged and boosted to $\alpha$ % of Vers for erase inhibit (boosted voltage level on floated wordlines is determined by coupling ratio $\alpha$ between the substrate and wordlines, $\alpha$~90%).

To prevent erasure of memory cells in unselected blocks, all wordlines in unselected blocks are floated during erase operations which is the same as the prior art of U.S. Pat. No. 5,473,563. Therefore floated wordlines in unselected blocks are boosted to nearly erase voltage Vers by capacitive coupling between the substrate and wordlines in unselected blocks as erase voltage Vers is applied to the substrate. (The wordlines are boosted to $\alpha$ % of Vers when the substrate of the cell array goes to Vers; however, boosted voltage level on floated wordlines is determined by coupling ratio between the substrate and wordlines.) The boosted voltage on wordlines in unselected blocks reduces electric field between the substrate and wordlines; as a result, erasure of memory cells in unselected blocks is prevented.

All wordlines in unselected blocks are floating.

TABLE 8

Bias Conditions during Page/Multipage Erase - Page Erase Scheme 3

|  | SELECTED BLOCK | UNSELECTED BLOCK |
|---|---|---|
| BITLINES (B/L) | CLAMPED TO VERS-0.6 V | CLAMPED TO VERS-0.6 V |

TABLE 8-continued

Bias Conditions during Page/Multipage Erase - Page Erase Scheme 3

|  | SELECTED BLOCK | UNSELECTED BLOCK |
| --- | --- | --- |
| STRING SELECT LINE (SSL) | BOOSTED TO APPROX. 90% VERS | BOOSTED TO APPROX. 90% VERS |
| SELECTED WORDLINE(S) | 0 V | BOOSTED TO APPROX. 90% VERS |
| UNSELECTED WORDLINE | BOOSTED TO APPROX. 90% VERS | BOOSTED TO APPROX. 90% VERS |
| GROUND SELECT LINE (GSL) | BOOSTED TO APPROX. 90% VERS | BOOSTED TO APPROX. 90% VERS |
| COMMON SOURCE LINE (CSL) | CLAMPED TO VERS-0.6 V | CLAMPED TO VERS-0.6 V |
| SUBSTRATE (POCKET P-WELL) | VERS | VERS |

Figure 48:
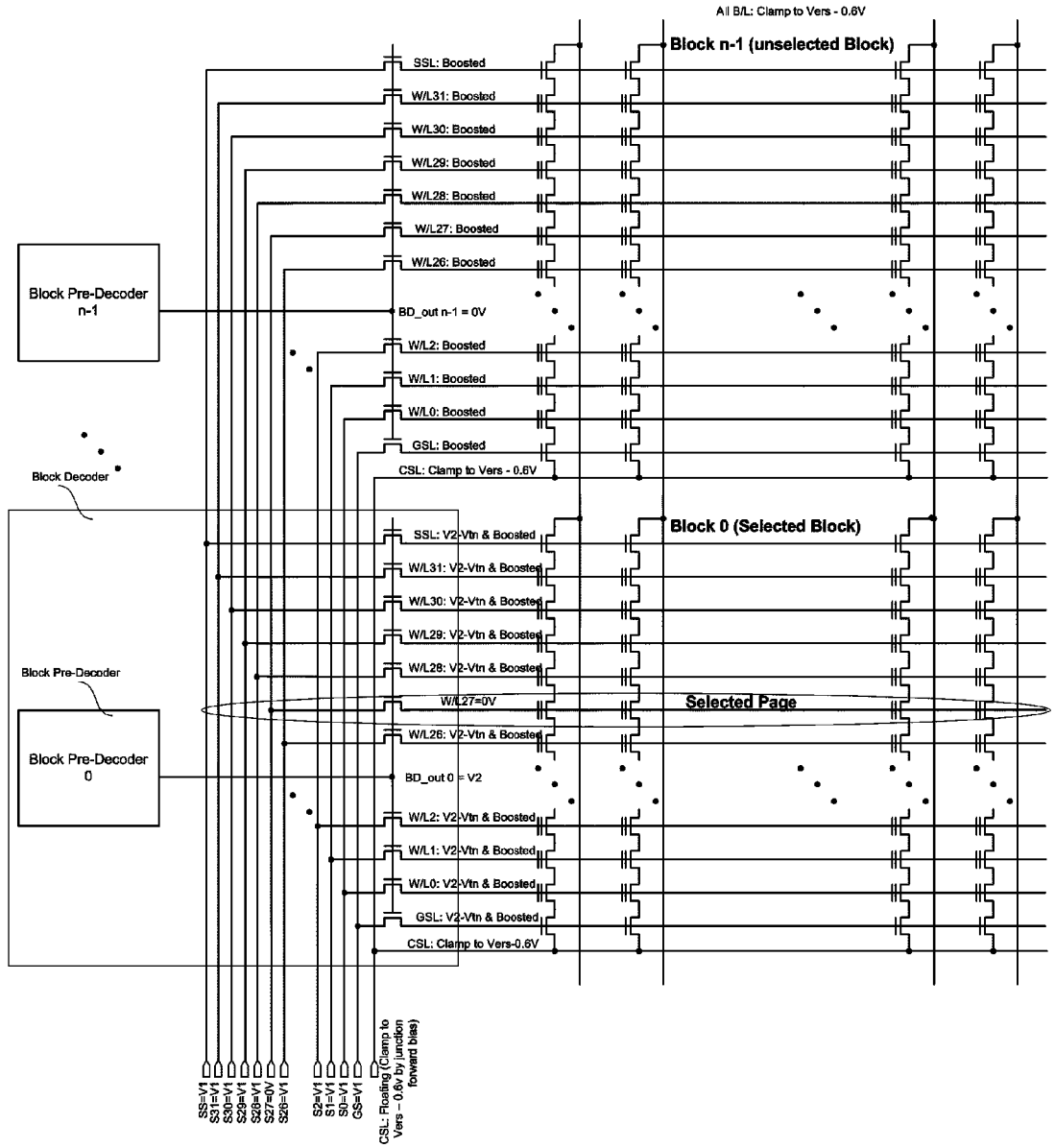
FIG. 48. Page Erase and Erase Inhibit—Page Erase Scheme 3.
Figure 49:
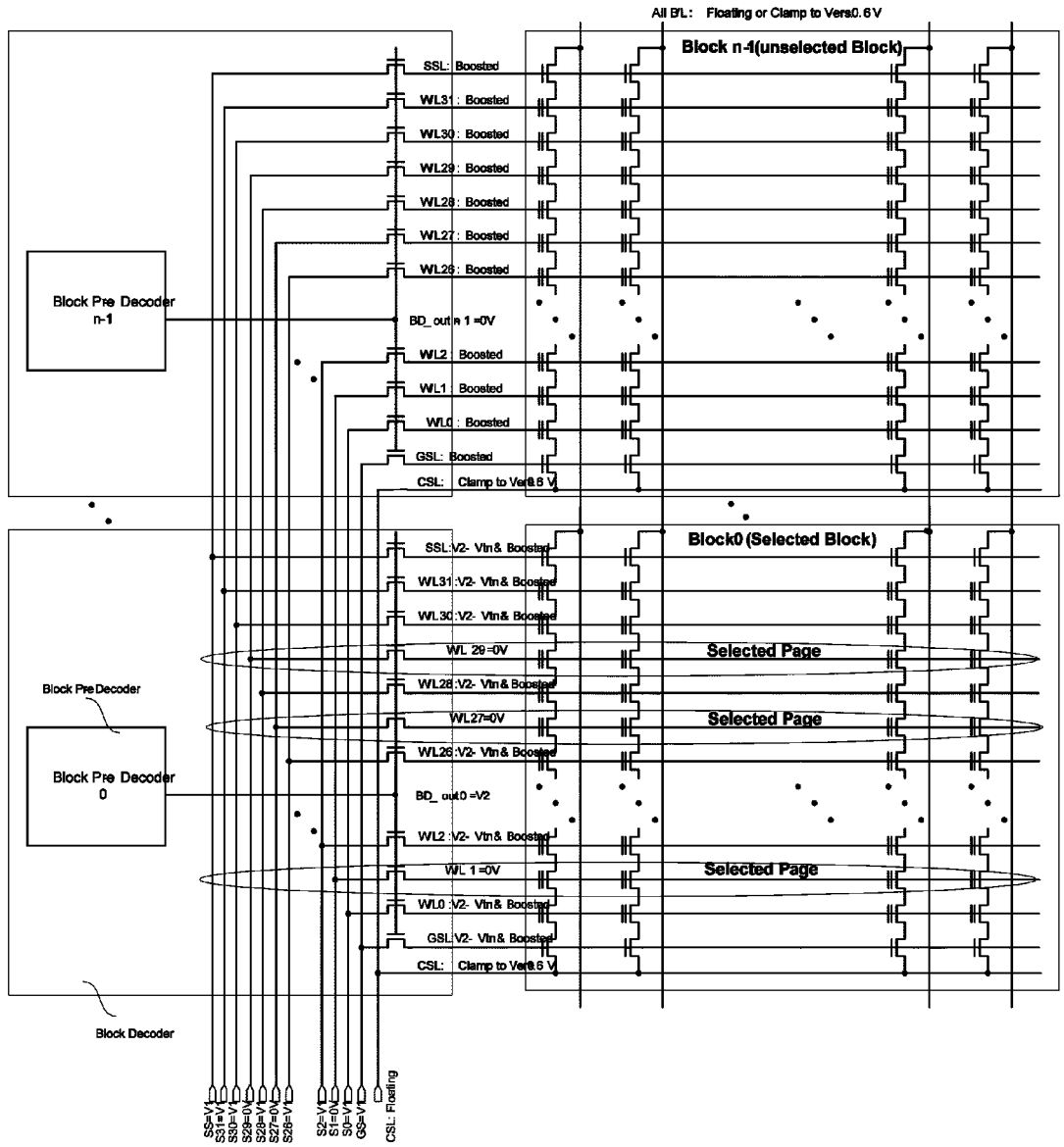
FIG. 49. Multiple Page Erase and Erase Inhibit—Page Erase Scheme 3.

FIGS. 48 and 49 depict page erase conditions for unselected blocks, and selected page and unselected pages in the selected block.

The string select line SSL, wordlines WL0 to WL31 and the ground select line GSL are driven by common signals of SS, S0 to S31 and GS through pass transistors TSS, TS0 to TS31 and TGS which are commonly controlled by the output signal BD_out of the block pre-decoder.

Common signals of SS, S0 to S31 and GS are connected to the drain of pass transistors TSS, TS0 to TS31 and TGS of entire blocks.

The common source line CSL is connected across entire blocks.

The selected common signal S (S27 in this example) corresponding to the selected page is biased to 0V while unselected common signals S (S0~S26 & S28~S31), SS and GS are biased to V1. The common source line CSL is floated.

The unselected output signal BD_out n−1 of unselected block pre-decoders connected to the gate of all pass transistors TSS, TS0 to TS31 and TGS are 0V. Therefore the string select line SSL, wordlines WL0 to WL31 and the ground select line GSL in unselected blocks are initially floated and boosted to nearly 90% (α) of the erase voltage Vers to nearly 90% (α) by capacitive coupling between the cell substrate and wordlines when the cell substrate (pocket p-well) rises to Vers. This boosted voltage on all wordlines in unselected blocks prevent cell erase.

The output signal BD_out of the selected block pre-decoder connected to the gate of all pass transistors TSS, TS0 to TS31 and TGS is V2. Therefore the selected wordline (W/L27 in this example) is biased to 0V, driven by common signal S27 through the pass transistor TS27, which erases cells on the selected page.

Unselected wordlines (W/L0~W/L26 & W/L28~W/L31) in the selected block are initially biased to V2−Vtn (Vtn: threshold voltage of pass transistors TS0 to TS31) by common signals S0~S26 & S28~S31 through pass transistors TS0~TS26 & TS28~TS31 (i.e. pass transistors drain=V1, gate=V2, source=V2−Vtn, and V1≧V2). After that, unselected wordlines are boosted by capacitive coupling between the cell substrate and wordlines when the cell substrate (pocket p-well) rises to Vers. When unselected wordlines (i.e. source of pass transistors) are boosted, pass transistors (TS0~TS26 & TS28~TS31) are completely shut off due to bias condition on pass transistors: drain=V1, gate=V2, and source=(α) of Vers (boosted voltage). Therefore the boosted high voltage on unselected wordlines in unselected block is maintained during erase and prevents cell erasure.

V1 must be equal to or greater than V2 to prevent leakage of the boosted voltage through the pass transistor, and allow the wordline to float.

Figure 50:
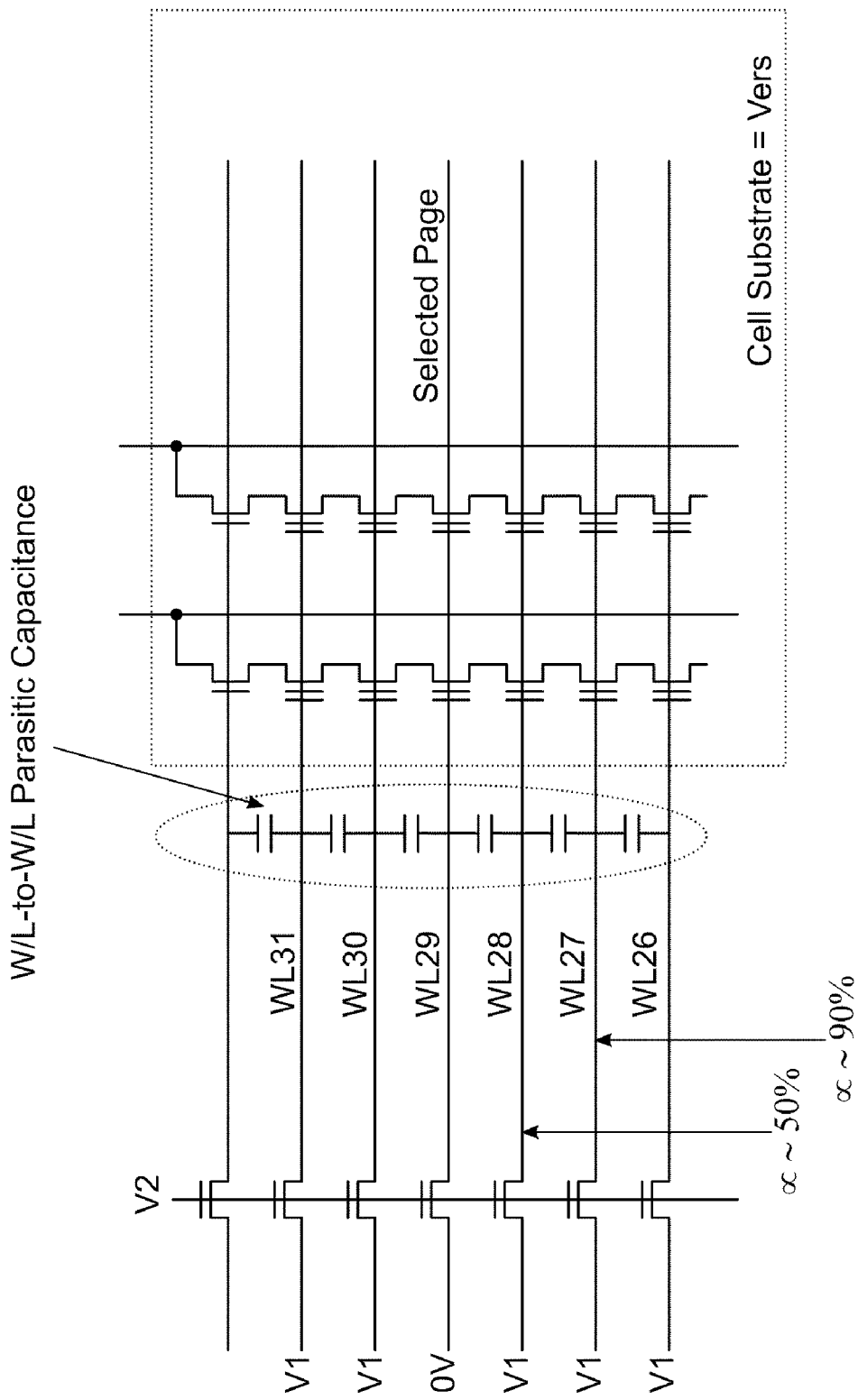
FIG. 50. Parasitic capacitance during Page Erase Scheme 3.

In selecting V1 and V2, it should be realized that the capacitive coupling factor α is dependent on individual wordline selection. Whereas, in an unselected block, α is approximately 90% at each wordline, α can be reduced adjacent to a selected wordline. The coupling is dependent on circuit characteristics but may reduce α to 50% as illustrated in FIG. 50. Given the reduced coupling, the initial voltage of the wordline should be higher in order to assure that the wordline floats to a level that prevents erase.

To allow for floating, V1 applied to the drain in the pass transistor must be greater than V2 applied to the gate. Thus:

$$V1 \geq V2,$$

$$Vers \geq V2 > Vcc$$

$$Vboosted = (V2-Vtn) + \alpha^*(Vers-(V2-Vtn)).$$

If V2 were to only equal Vcc, the following boosted voltages of wordline WL28 (adjacent to a selected page) and wordline WL27 (removed from the selected page) might result:
If Vtn=0.8V, Vcc=2.5V, Vers=20V and V2=Vcc=2.5V $$WL28(\text{boosted voltage}) = (V2-Vtn) + \alpha(Vers(V2-Vtn)) = (2.5V-0.8V) + 0.5^*(20V1.7V) = 10.85V$$

$$WL27(\text{boosted voltage}) = (V2-Vtn) + \alpha(Vers(V2-Vtn)) = (2.5V-0.8V) + 0.9^*(20V-1.7V) = 18.17V$$

It can be seen that WL27 is boosted to close to Vers and will thus avoid accidental erasure. However, wordline WL28 is only raised to <11 volts, resulting in >9 volts difference between the wordline and the substrate voltage Vers. As a result, unintended erasure of WL28 is likely. To safely avoid erase, the wordline should be at least about 70% Vers, or 14 volts in this example.

By raising the gate voltage V2, and thus the drain voltage V1, the initial voltage on the wordline is higher and thus the boosted voltage is higher, despite the reduction in α. With a higher voltage V2 of 10 volts, the following results in this example:
If Vtn=0.8V, Vcc=2.5V, Vers=20V and V2=10V $$WL28(\text{boosted voltage}) = (V2-Vtn) + \alpha(Vers(V2-Vtn)) = (10V-0.8V) + 0.5^*(20V-9.2V) = 14.6V$$

$$WL27(\text{boosted voltage}) = (V2-Vtn) + \alpha(Vers(V2-Vtn)) = (10V-0.8V) + 0.9^*(20V-9.2V) = 18.92V$$

In this case, the boosted voltage on the adjacent wordline WL28 is sufficiently high at 14.6 v. The reduced value of α and the acceptable voltage difference between the wordline and substrate will vary, thus varying the acceptable level of V2. However, in general, V2 should be at least about 50% Vers. More generally, V2 and thus V1 should be closer to the substrate voltage than to the select voltage applied to pass transistors of selected wordlines.

FIG. 49 shows multiple pages (wordline 1, 27, 29) in the selected block are erased at the same time using bias conditions of the page erase scheme 3.

Previously described FIG. 34 illustrates a circuit schematic of block decoder which is one of possible examples for the page erase scheme 3 with V1>V2.

The BDLCH_out is reset to 0V when the RST_BD is high (actually short pulse) and latched when the LCHBD is high (actually short pulse) with valid row predecoded address signals of Xp, Xq, Xr and Xt.

The final output signal BD_out of the block pre-decoder is commonly connected to the gate of all pass transistors TSS, TS0 to TS31 and TGS. The string select line SSL, wordlines WL0 to WL31 and the ground select line GSL are driven by common signals of SS, S0 to S31 and GS through pass transistors which are commonly controlled by the output signal BD_out of the block pre-decoder.

The local charge pump is a high voltage switching mean to provide V2 to the output signal BD_out of the block decoder. It consists of enhancement NMOS transistor, depletion NMOS transistor (DEP), native NMOS transistor (NAT) and a 2-input NAND gate. The output signal BD_out of the block decoder is raised to Vhv (=V2) when the block decoder latch output BDLCH_out is Vdd, HVenb is 0V and the OSC is oscillated FIG. 51 shows the core timing of page erase or multiple page erase with the page erase scheme 3.

Figure 51:
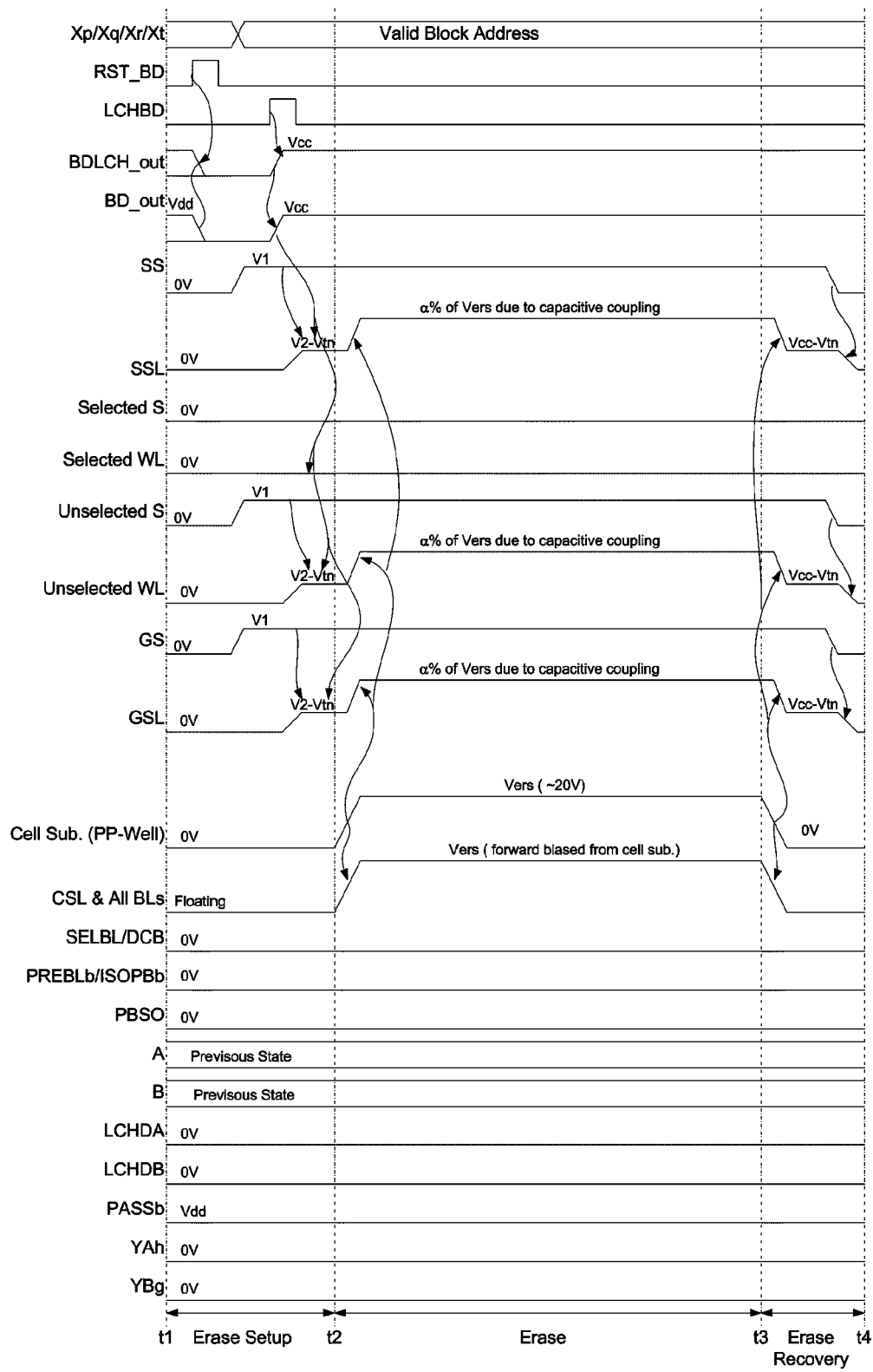
FIG. 51. Page Erase/Multiple Page Erase Timing—Page Erase Scheme 3.

Basically the erase operation consists of three sub-periods as Erase Setup (from t1 to t2), Erase (t2 to t3) and Erase Recovery (from t3 to t4) shown in FIG. 51.

Erase Setup (t1 to t2):
The block decoder latch is reset by the RST_BD pulse and the BDLCH_out of the latch in the block decoder goes to 0V.
The latch enable signal LCHBD of the block decoder is pulsed once row predecoded signals Xp/Xq/Xr/Xt are valid.
The BDLCH_out of the latch is set to Vdd when row predecoded signals Xp/Xq/Xr/Xt are matched (i.e. selected).
The output signal BD_out of the block pre-decoder is V2.
The selected common signal S corresponding to the selected page is set to 0V while unselected common signals S, SS and GS are set to V1. The common source line CSL is floated.
The BD_out of unselected blocks are set to 0V. As a result, all wordlines, SSL, GSL, CSL in unselected blocks are floated.
The BD_out of the selected block is set to V2 and all pass transistors SST, TS0 to TS31, GST are turned on. Therefore the selected wordline(s) is(are) biased to 0V while unselected wordlines, SSL, GSL are precharged to V2−Vtn (Vtn: threshold voltage of pass transistors).

Erase (t2 to t3):
During this period, the cell substrate (pocket p-well) rises to erase voltage Vers.
The selected wordline for single page erase is or selected wordlines for multiple page erase in the selected block are biased to 0V.
The string select line SSL, ground select line GSL and unselected wordlines in the selected block are initially precharged to V2−Vtn, and then boosted to α % of Vers by capacitive coupling between the substrate and wordlines & SSL/GSL when the cell substrate goes to Vers (the boosted voltage level on floated wordlines is determined by coupling ratio (α) between the substrate and wordlines).
The CLS and all bitlines (BLs) go to Vers due to junction forward bias from the substrate (PP-well) to the source (n+).

During this period, all cells on the selected page (pages) is(are) erased. Erasure of memory cells in unselected wordlines in the selected block is prevented by the boosted wordline voltage.
All wordlines, SSL, GSL, CSL in unselected blocks are boosted to α % of Vers by capacitive coupling between the substrate and wordlines & SSL/GSL when the cell substrate goes to Vers.
When unselected wordlines (i.e. drain of pass transistors) are boosted (i.e. source of pass transistor>V2−Vtn), pass transistors (TS0~TS26 & TS28~TS31) are completely shut off due to bias condition on pass transistors: drain=V1≧V2, gate=V2, and source=α Vers (boosted voltage). Therefore the boosted high voltage on unselected wordlines in unselected block is maintained during erase and prevents cell erasure.

Erase Recovery (t3 to t4):
During this period, all high voltages on the cell substrate, unselected selected wordline, SSL, GSL, and CSL are discharged to the initial state (0V).

While this invention has been particularly shown and described with references to example embodiments thereof, it will be understood by those skilled in the art that various changes in form and details may be made therein without departing from the scope of the invention encompassed by the appended claims.

What is claimed is:
1. A method for performing a page erase operation in a nonvolatile memory array having
plural strings of memory cells on a substrate, and
plural wordlines across the strings to pages of memory cells; and
associated with plural pass transistors, each of which is configured to apply a voltage to a respective one of the wordlines,
the memory array being divided into plural blocks, the method comprising:
selecting at least one of the blocks;
selecting any one or ones of the wordlines of the selected block;
enabling each of the pass transistors associated with the selected block;
applying a select voltage to the selected one or ones of the wordlines of the selected block;
applying an unselect voltage to unselected one or ones of the wordlines that are other than the selected one or ones of the wordlines of the selected block; and
applying a substrate voltage to the substrate of the selected block,
the voltage difference between the substrate voltage and the select voltage causing the page or pages of memory cells coupled to the selected one or ones of the wordlines to be erased, and
the voltage difference between the substrate voltage and the unselect voltage not causing the page or pages of memory cells coupled to the unselected one or ones of the wordlines of the selected block to be erased.

2. The method of claim 1 wherein:
the applying a select voltage comprises applying the select voltage to one or ones of the pass transistors coupled to the selected one or ones of the wordlines of the selected block; and
the applying an unselect voltage comprises applying the unselect voltage to one or ones of the pass transistors coupled to the unselected one or ones of the wordlines of the selected block.

3. The method of claim 1 wherein the selected wordlines are separated by at least one of the unselected wordlines.

4. The method of claim 1 wherein the unselected wordlines are separated by at least one of the selected wordlines.

5. The method of claim 1 wherein a resulting voltage of the selected wordlines is substantially the same as the select voltage and a resulting voltage of the unselected wordlines is substantially the same as the unselect voltage.

6. The method of claim 1 wherein the select voltage is about zero volts and the unselect voltage is about equal to the applied substrate voltage.

7. The method of claim 1 wherein a resulting voltage of the selected wordlines is substantially the same as the select voltage and a resulting voltage of the unselected wordlines is a floating voltage coupled from the unselect voltage toward the substrate voltage.

8. The method of claim 1 wherein the applying an unselect voltage comprises applying a boosted voltage.

9. A nonvolatile memory comprising:
- a memory array comprising plural strings of memory cells on a substrate and plural wordlines across the strings to pages of memory cells, the memory array being divided into plural blocks;
- plural pass transistors, each of which is configured to apply a voltage to a respective one of the wordlines;
- a block selector for selecting at least one of the blocks to enable each of the pass transistors in the selected block during an erase operation;
- a substrate voltage source for applying a substrate voltage to the substrate during the erase operation; and
- a wordline decoder for selecting any one or ones of the wordlines of the selected block to apply
  - a select voltage to the selected one or ones of the wordlines to erase one or ones of the pages of memory cells coupled to the selected one or ones of the wordlines of the selected block and
  - an unselect voltage to unselected one or ones of the wordlines that are other than the selected one or ones of the wordlines of the selected block, the wordline decoder being configured to respond to address instructions to apply the select voltage to the selected one or ones of the wordlines of the selected block and to apply the unselect voltage to the unselected one or ones of the wordlines of the selected block.

10. The memory of claim 9 wherein the wordline decoder is adapted to apply the select voltage to any of the wordlines and the unselect voltage to any of the wordlines.

11. The memory of claim 9 wherein a resulting voltage of the selected wordlines is substantially the same as the select voltage and a resulting voltage of the unselected wordlines is substantially the same as the unselect voltage.

12. The memory of claim 9 wherein the select voltage is about zero volts and the unselect voltage is about equal to the applied substrate voltage.

13. The memory of claim 9 wherein a resulting voltage of the selected wordlines is substantially the same as the select voltage and a resulting voltage of the unselected wordlines is a floating voltage coupled from the unselect voltage toward the erase voltage.

14. The memory of claim 9 wherein a gate signal to each of the pass transistors has a value $V_2$, the unselect voltage is greater than $V_2$ and the unselected one or ones of the wordlines precharge to $V_2-V_{tn}$, and wherein $V_2$ is substantially less than the applied substrate voltage.

15. The memory of claim 14 wherein $V_2$ is at least 50% of the erase voltage.

16. The memory of claim 9 wherein the pass transistors coupled to the wordlines of unselected one or ones of the blocks that are other than the selected at least one of the blocks are gated off after a voltage less than the unselect voltage is applied to each of the pass transistors and the wordlines float to prevent erasure.

17. The memory of claim 9 wherein the unselect voltage is closer to the erase voltage applied to the substrate than to the select voltage.

18. The memory of claim 9 wherein the wordline decoder is configured to apply a boosted voltage as the unselect voltage.

* * * * *